(12) United States Patent
Iwamatsu et al.

(10) Patent No.: US 8,754,471 B2
(45) Date of Patent: Jun. 17, 2014

(54) SEMICONDUCTOR DEVICE HAVING GATE IN RECESS

(75) Inventors: Toshiaki Iwamatsu, Kanagawa (JP); Kozo Ishikawa, Itami (JP); Masashi Kitazawa, Kanagawa (JP); Kiyoshi Hayashi, Kanagawa (JP); Takahiro Maruyama, Kanagawa (JP); Masaaki Shinohara, Kanagawa (JP); Kenji Kawai, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 220 days.

(21) Appl. No.: 13/040,610

(22) Filed: Mar. 4, 2011

(65) Prior Publication Data
US 2011/0215423 A1 Sep. 8, 2011

(30) Foreign Application Priority Data

Mar. 5, 2010 (JP) ................................ 2010-048755

(51) Int. Cl.
| | |
|---|---|
| *H01L 29/76* | (2006.01) |
| *H01L 29/94* | (2006.01) |
| *H01L 31/062* | (2012.01) |
| *H01L 29/66* | (2006.01) |
| *H01L 29/78* | (2006.01) |

(52) U.S. Cl.
CPC .... *H01L 29/66621* (2013.01); *H01L 29/66795* (2013.01); *H01L 29/7834* (2013.01)
USPC ..... 257/330; 257/401; 257/343; 257/E29.112

(58) Field of Classification Search
CPC .................. H01L 29/66621; H01L 29/66795; H01L 29/7834; H01L 29/4236
USPC .......... 257/330, 410, 408, 288, 343, E29.112, 257/E29.242
See application file for complete search history.

(56) References Cited

U.S. PATENT DOCUMENTS

| | | | | |
|---|---|---|---|---|
| 4,835,584 A | * | 5/1989 | Lancaster | ...................... 257/330 |
| 5,717,239 A | * | 2/1998 | Nagai | ........................... 257/365 |

(Continued)

FOREIGN PATENT DOCUMENTS

| | | |
|---|---|---|
| JP | 7-131009 | 5/1995 |
| JP | H0923011 A | 1/1997 |
| JP | 2003-37115 | 2/2003 |

OTHER PUBLICATIONS

Notification of Reasons for Refusal with Full English Translation issued in Japanese Patent Application No. 2010-048755 mailed Sep. 17, 2013.

*Primary Examiner* — Shouxiang Hu
(74) *Attorney, Agent, or Firm* — McDermott Will & Emery LLP

(57) ABSTRACT

There are provided a semiconductor device which can be miniaturized without being deteriorated in characteristics, and a manufacturing method thereof. The semiconductor device includes a semiconductor substrate having a main surface, a source region and a drain region formed apart from each other in the main surface, a gate electrode layer formed over the main surface sandwiched between the source region and the drain region, a first conductive layer formed so as to be in contact with the surface of the source region, and a second conductive layer formed so as to be in contact with the surface of the drain region. A recess is formed in the main surface so as to extend from the contact region between the first conductive layer and the source region through a part underlying the gate electrode layer to the contact region between the second conductive layer and the drain region.

6 Claims, 76 Drawing Sheets

(56) References Cited

U.S. PATENT DOCUMENTS

| | | | |
|---|---|---|---|
| 7,247,887 B2 * | 7/2007 | King et al. | 257/139 |
| 7,786,529 B2 * | 8/2010 | Kim | 257/330 |
| 2003/0022426 A1 | 1/2003 | Kumamoto | |
| 2006/0001110 A1 * | 1/2006 | Igarashi | 257/401 |
| 2009/0057731 A1 * | 3/2009 | Kitajima | 257/288 |

* cited by examiner

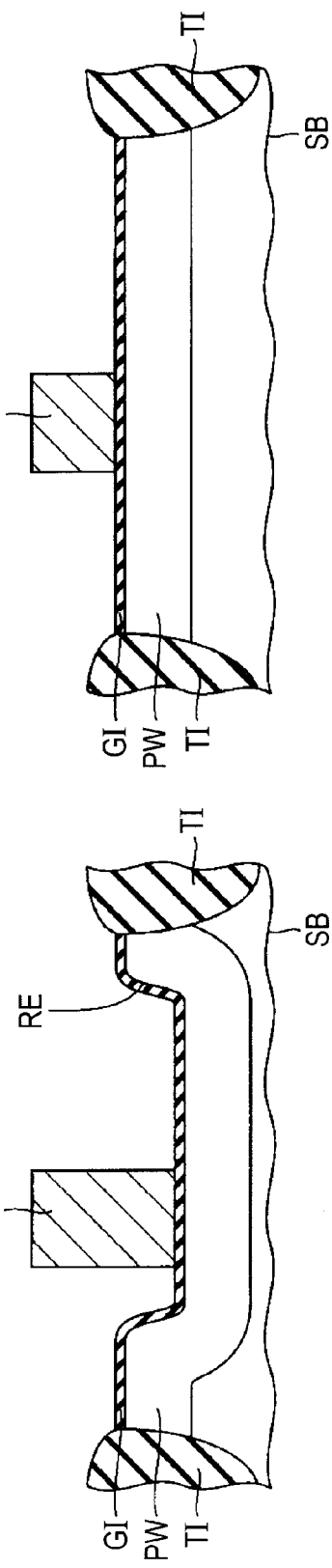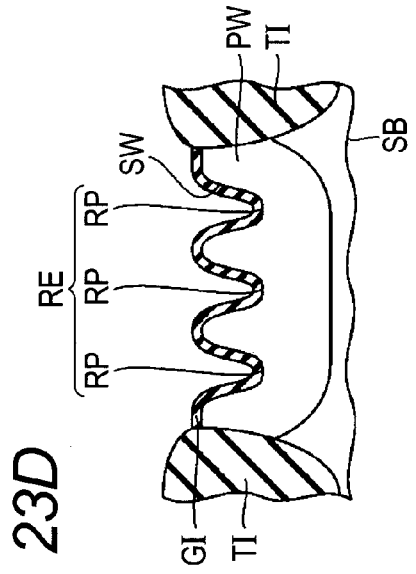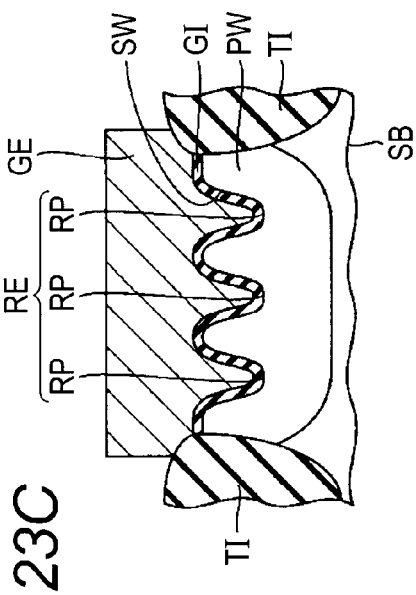

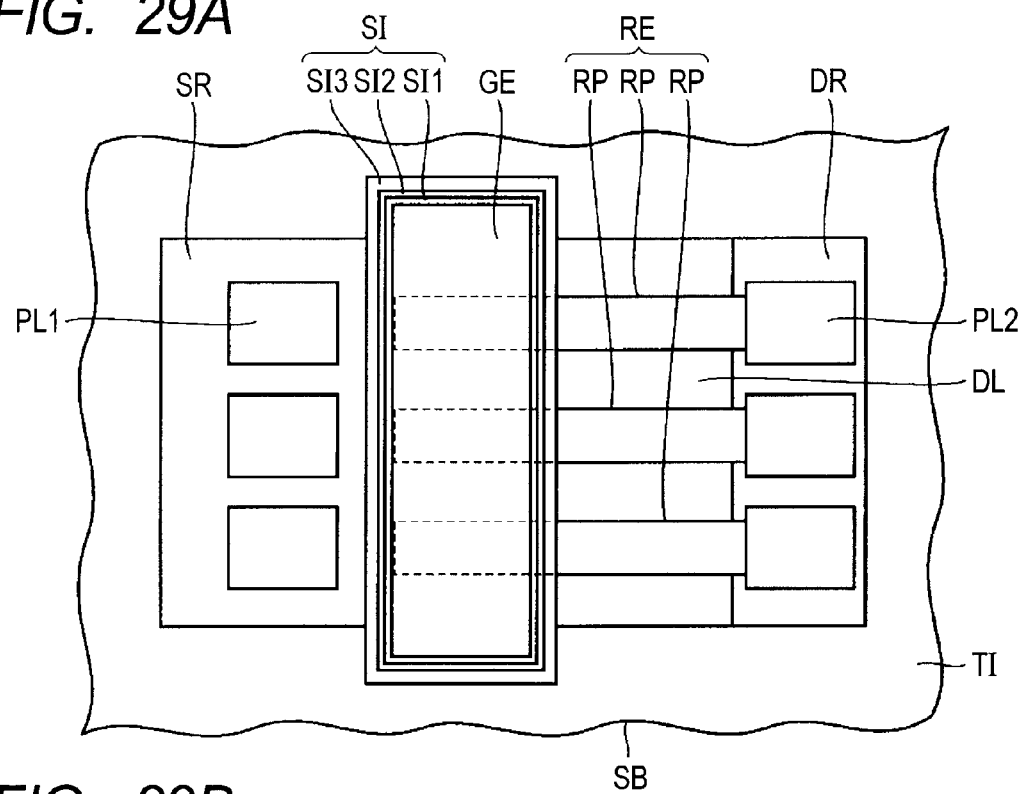
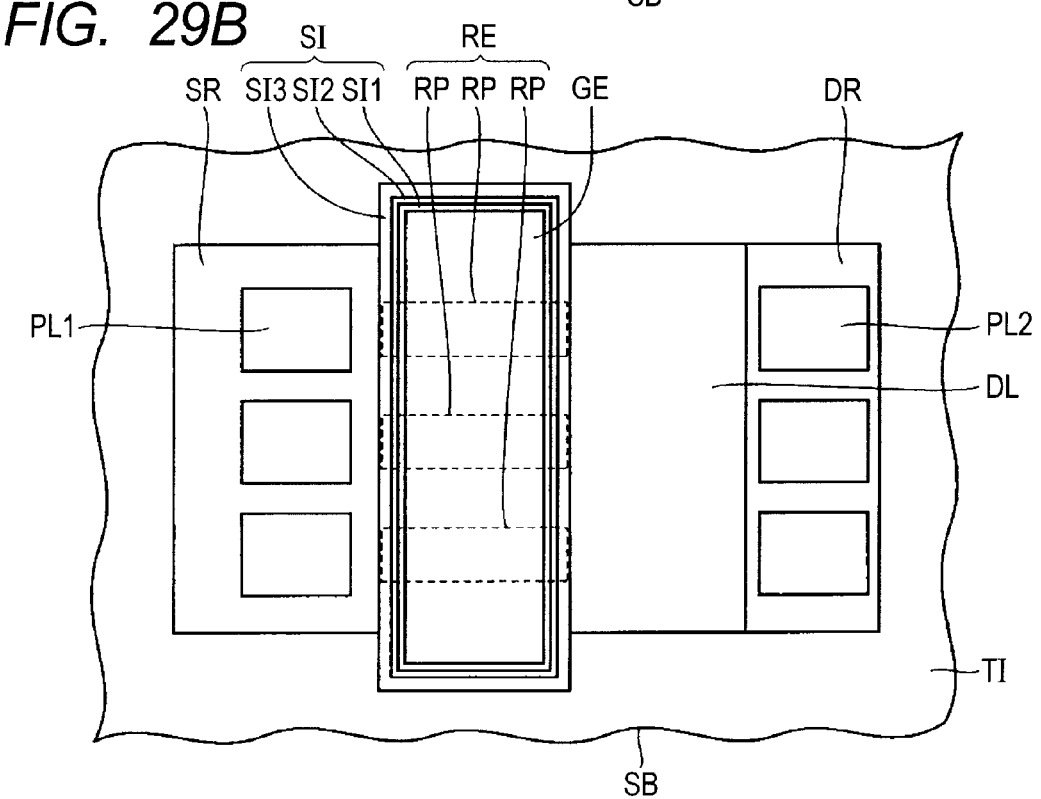

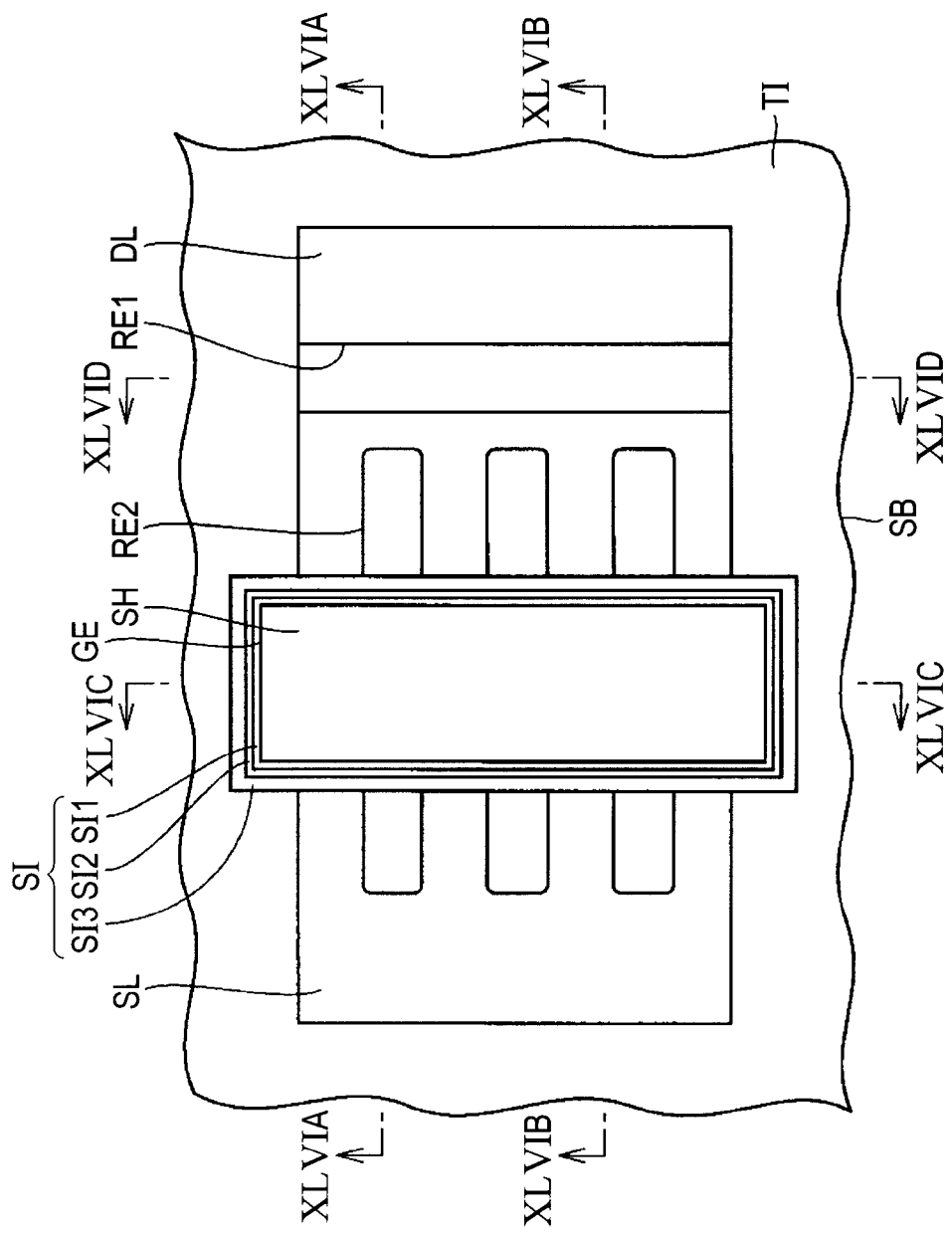

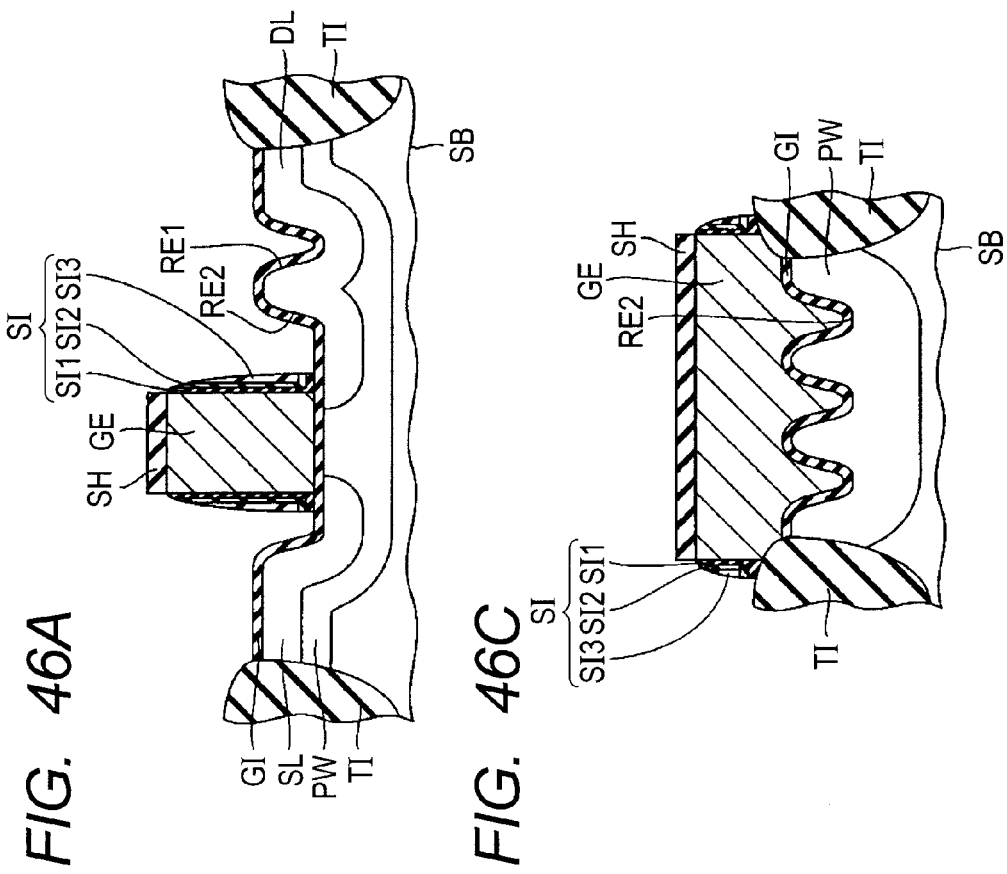
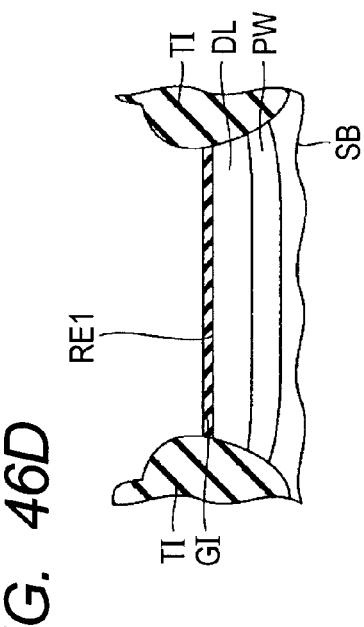

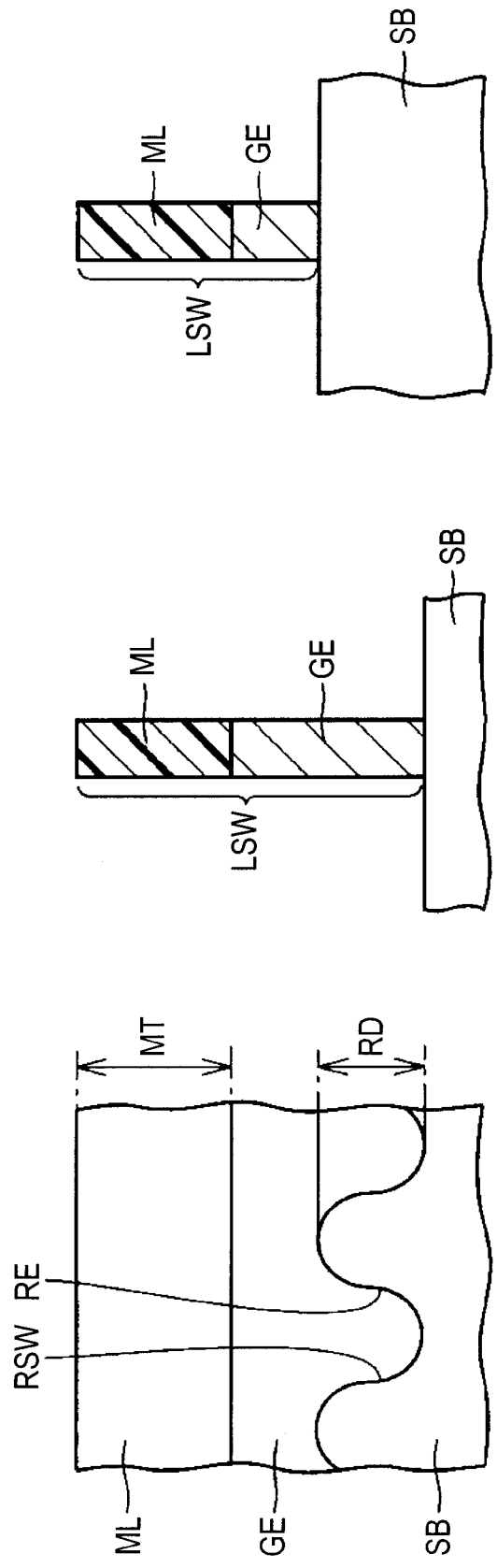

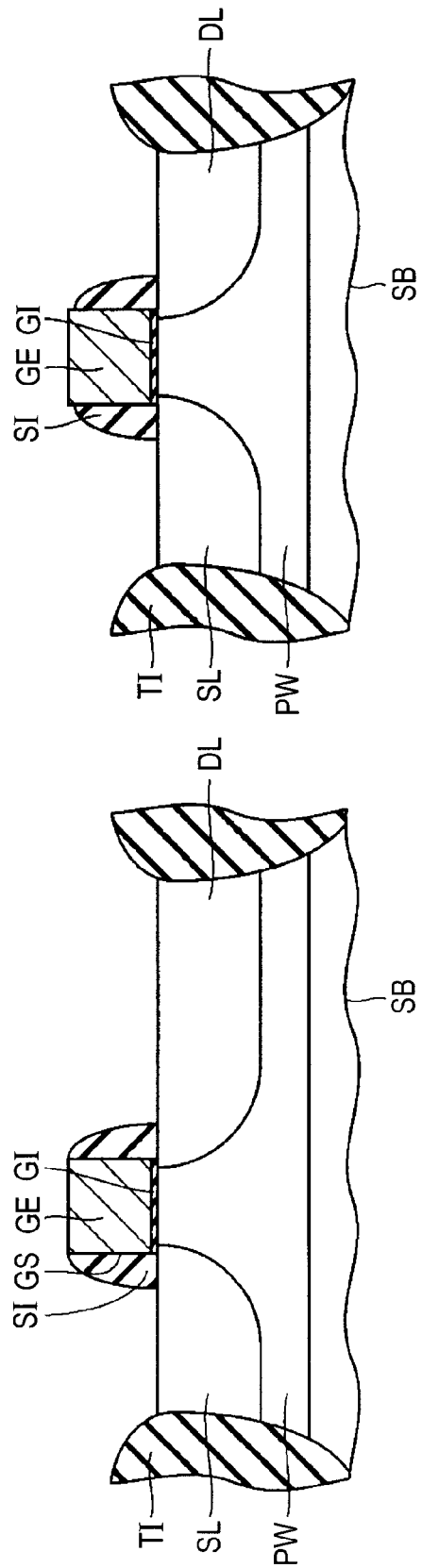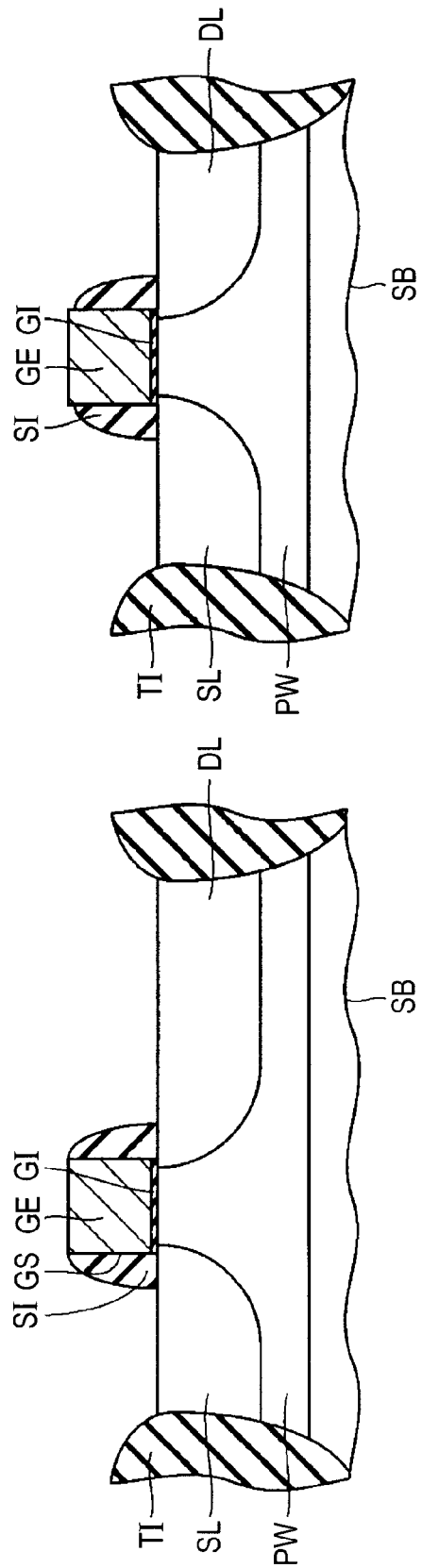

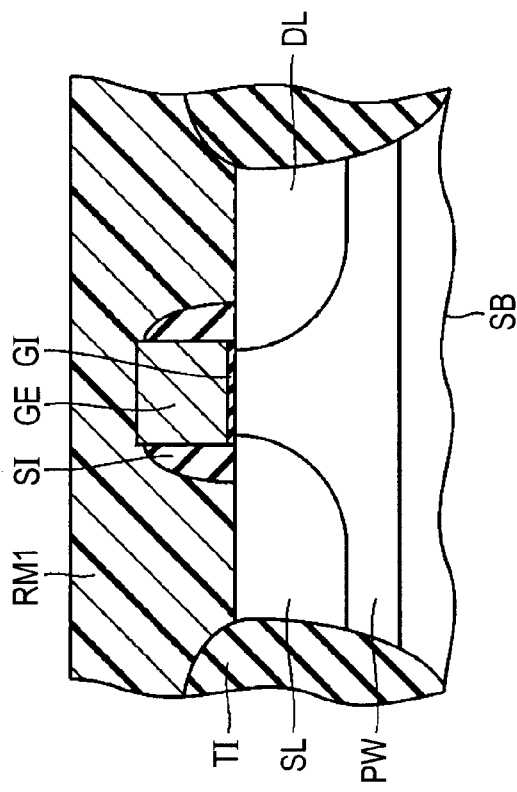
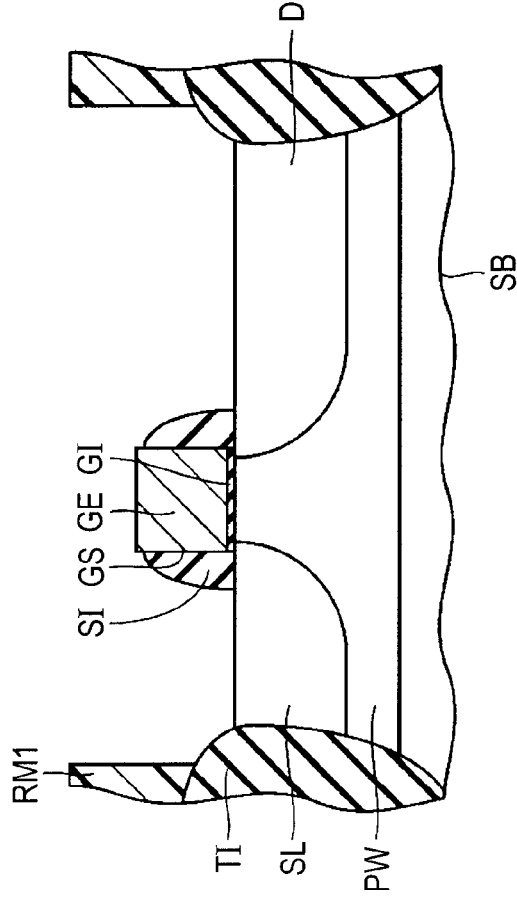

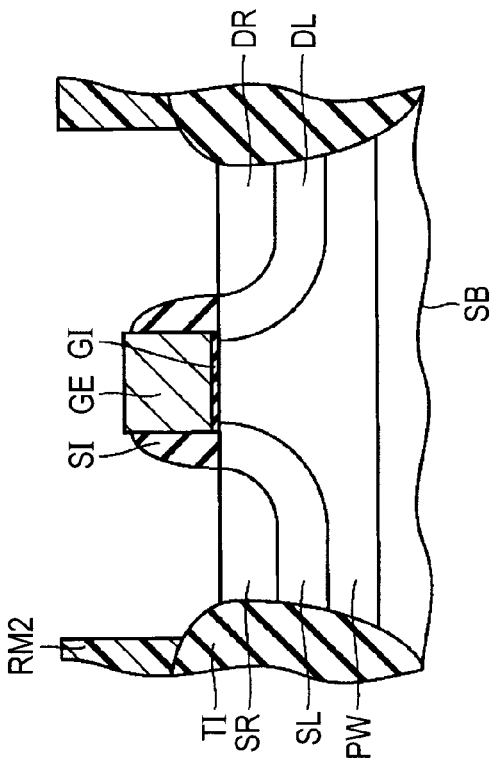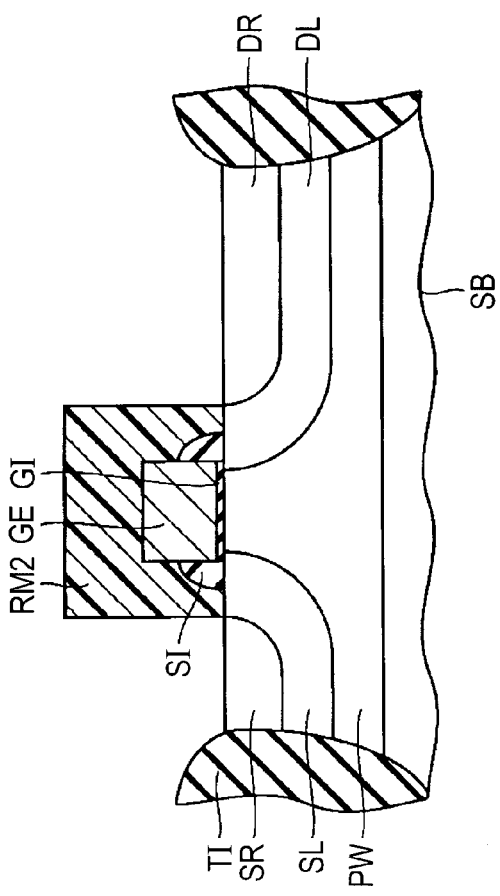

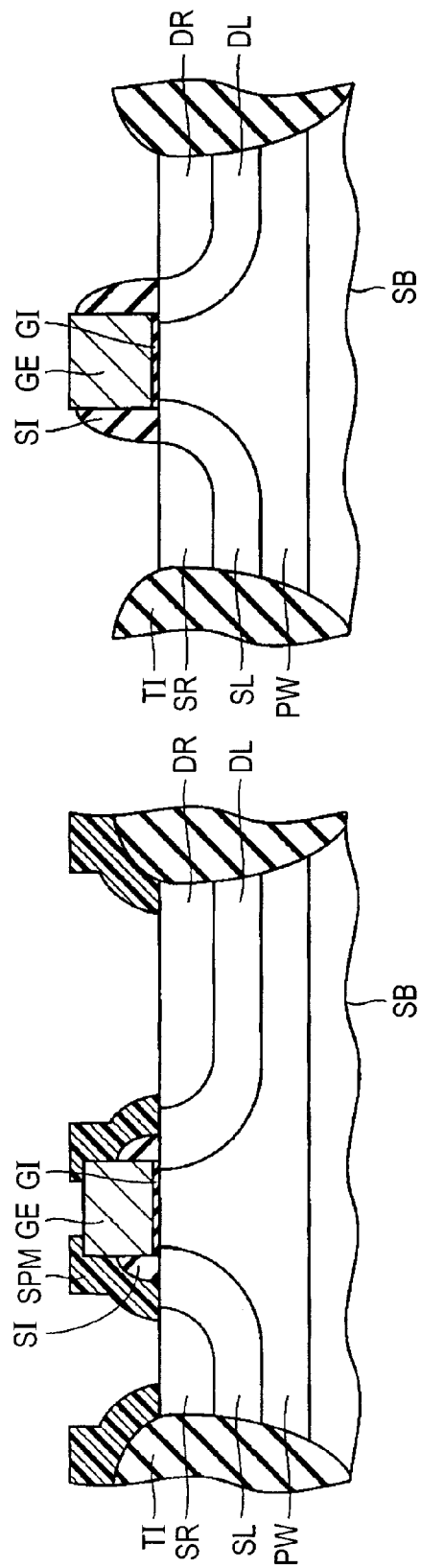

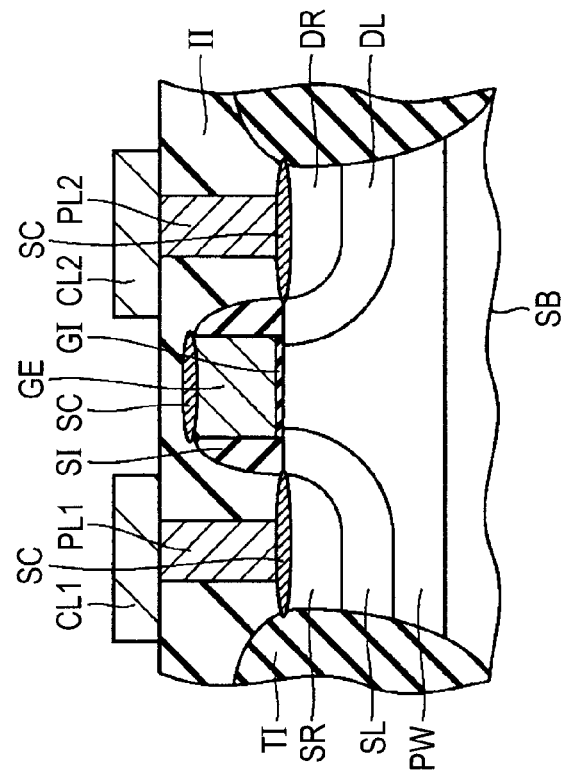
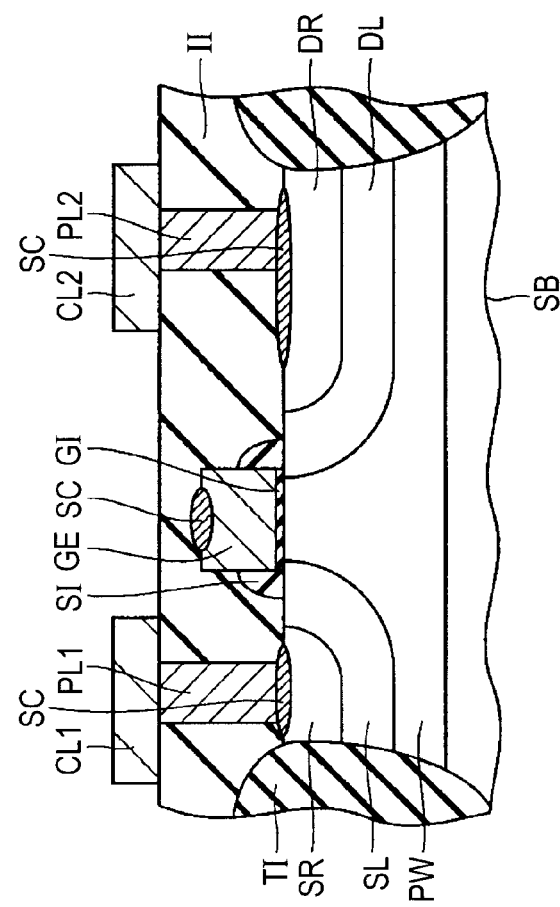

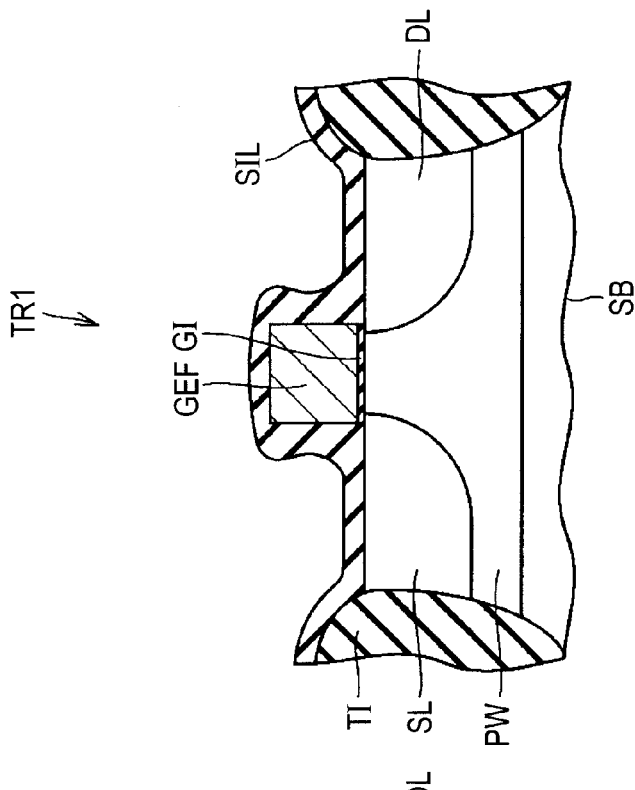
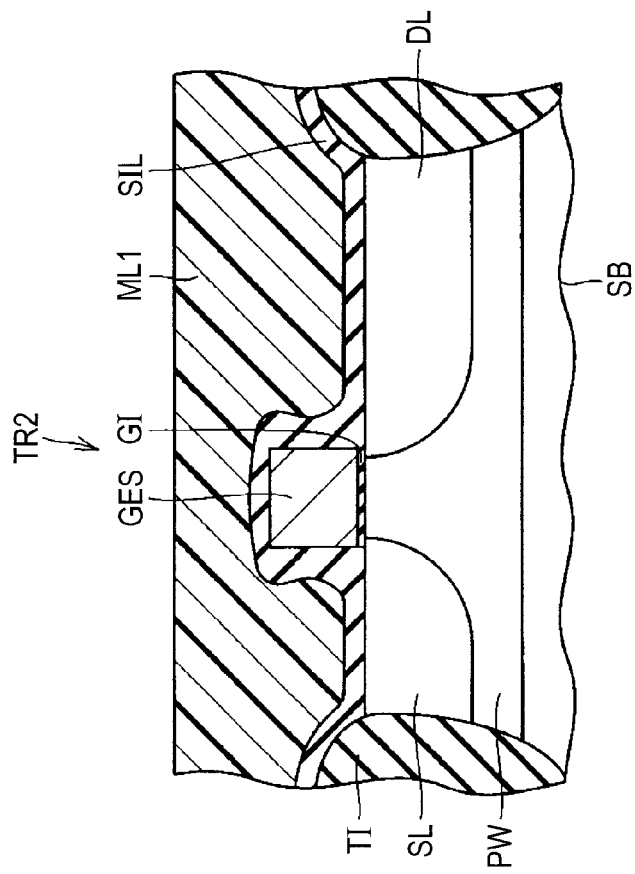

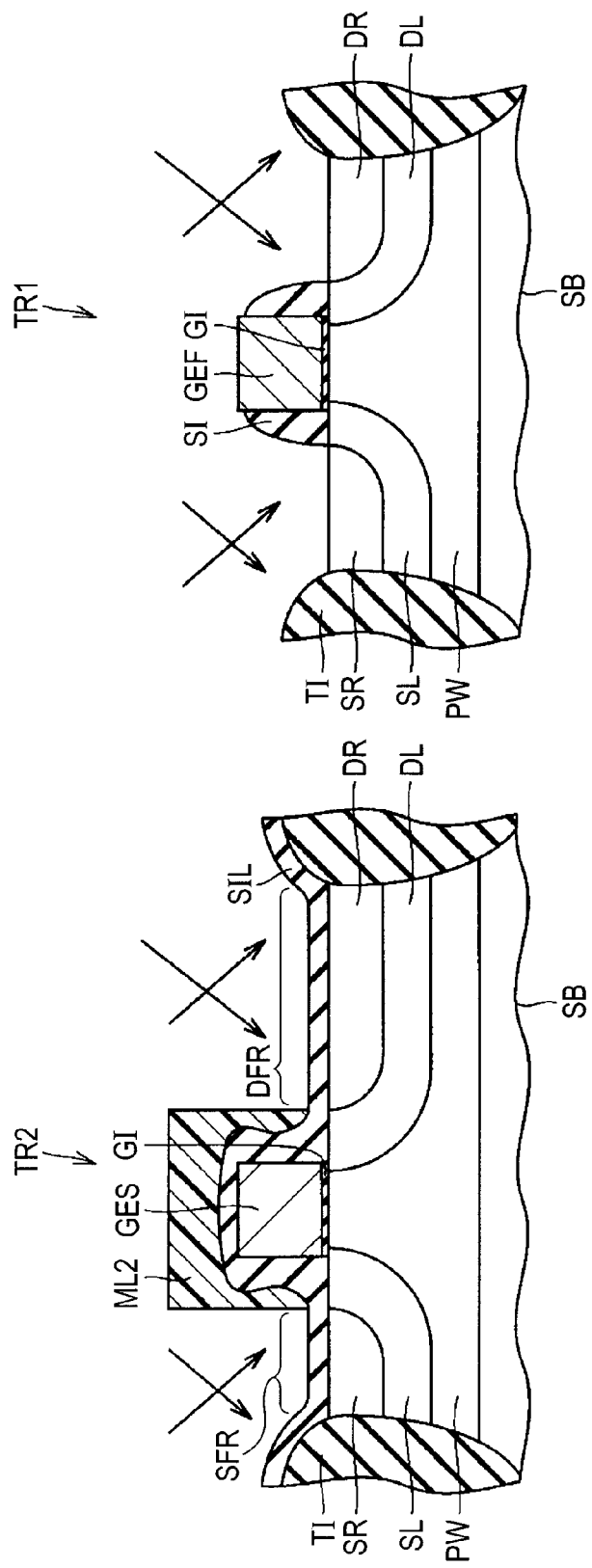

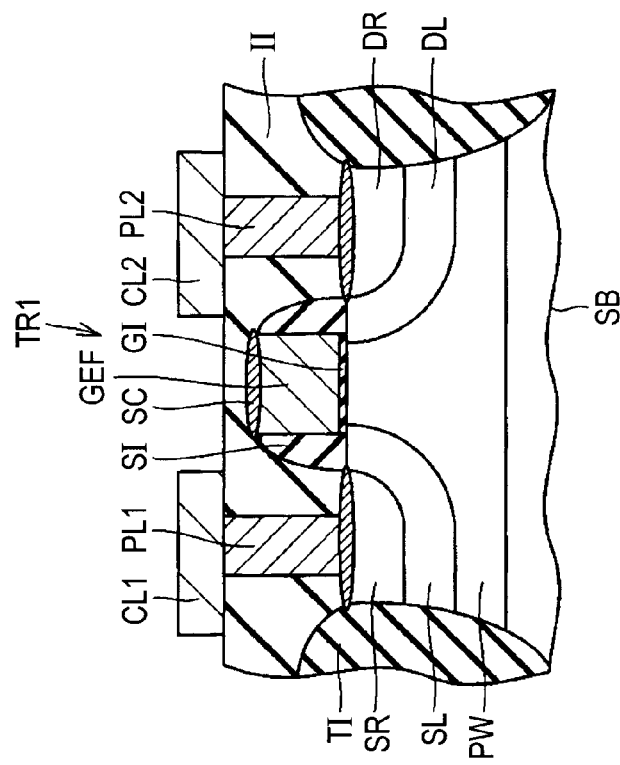
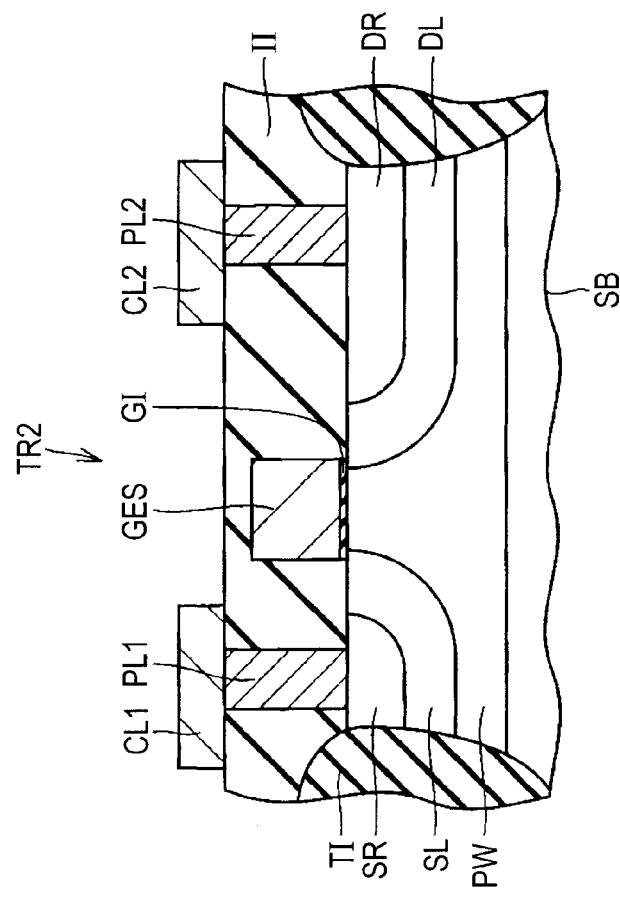

SEMICONDUCTOR DEVICE HAVING GATE IN RECESS

CROSS-REFERENCE TO RELATED APPLICATIONS

The disclosure of Japanese Patent Application No. 2010-48755 filed on Mar. 5, 2010 including the specification, drawings and abstract is incorporated herein by reference in its entirety.

BACKGROUND OF THE INVENTION

The present invention relates to a semiconductor device and a manufacturing method thereof. More particularly, it relates to a semiconductor device in which recesses are formed in the main surface of a semiconductor substrate, and a manufacturing method thereof.

A semiconductor device in which recesses are formed in the main surface of a semiconductor substrate is disclosed in, for example, Japanese Unexamined Patent Publication No. Hei 7(1995)-131009. In the semiconductor device of the publication, in the channel region of a MOS (Metal Oxide Semiconductor) transistor, a fine trench (recess) is formed orthogonal to the channel width direction. Accordingly, the effective channel width can be made longer than the actual gate dimension. As a result, it is possible to obtain a MOS transistor miniaturized in the channel width direction to the maximum with the stable operation characteristic being kept. This is described in this publication.

CITATION LIST

Patent Literature

[PTL 1]
Japanese Unexamined Patent Publication No. Hei 7(1995)-131009

The semiconductor device described in this publication has a problem of an insufficient drain current. For this reason, it is difficult to miniaturize the semiconductor device without deteriorating the characteristics.

SUMMARY OF THE INVENTION

The present invention was completed in view of the foregoing problem. It is an object of the present invention to provide a semiconductor device which can be miniaturized without being deteriorated in characteristics, and a manufacturing method thereof.

The semiconductor device of the present embodiment includes: a semiconductor substrate having a main surface; a source region and a drain region formed apart from each other in the main surface; a gate electrode layer formed over the main surface sandwiched between the source region and the drain region; a first conductive layer formed in such a manner as to be in contact with the surface of the source region; and a second conductive layer formed in such a manner as to be in contact with the surface of the drain region, wherein a recess is formed in the main surface in such a manner as to extend from the contact region between the first conductive layer and the source region through a part underlying the gate electrode layer to the contact region between the second conductive layer and the drain region.

In accordance with the semiconductor device of the present embodiment, a recess is formed in the main surface in such a manner as to extend from the contact region between the first conductive layer and the source region through a part underlying the gate electrode layer to the contact region between the second conductive layer and the drain region. Accordingly, in addition to the bottom wall of the recess, the side surface thereof serves as a path for drain current between the source region and the drain region, which can increase the drain current. As a result, it is possible to miniaturize the semiconductor device without deteriorating the characteristics.

BRIEF DESCRIPTION OF THE DRAWINGS

FIGS. 2A to 2D are schematic cross-sectional views of FIG. 1, in which FIG. 2A is a schematic cross-sectional view along line IIA-IIA, FIG. 2B is a schematic cross-sectional view along line IIB-IIB, FIG. 2C is a schematic cross-sectional view along line IIC-IIC, and FIG. 2D is a schematic cross-sectional view along line IID-IID;

FIGS. 11A to 11D are schematic cross-sectional views of FIG. 10, in which FIG. 11A is a schematic cross-sectional view along line XIA-XIA, FIG. 11B is a schematic cross-sectional view along line XIB-XIB, FIG. 11C is a schematic cross-sectional view along line XIC-XIC, and FIG. 11D is a schematic cross-sectional view along line XID-XID;

FIGS. 23A to 23D are schematic cross-sectional views of FIG. 22, in which FIG. 23A is a schematic cross-sectional view along line XXIIIA-XXIIIA, FIG. 23B is a schematic cross-sectional view along line XXIIIB-XXIIIB, FIG. 23C is a schematic cross-sectional view along line XXIIIC-XXIIIC, and FIG. 23D is a schematic cross-sectional view along line XXIIID-XXIIID;

FIGS. 26A to 26D are schematic cross-sectional views of FIG. 25, in which FIG. 26A is a schematic cross-sectional view along line XXVIA-XXIVA, FIG. 26B is a schematic cross-sectional view along line XXVIB-XXVIB, FIG. 26C is a schematic cross-sectional view along line XXVIC-XXVIC, and FIG. 26D is a schematic cross-sectional view along line XXVID-XXVID;

FIGS. 28A to 28D are schematic cross-sectional views of FIG. 27, in which FIG. 28A is a schematic cross-sectional view along line XXVIIIA-XXVIIIA, FIG. 28B is a schematic cross-sectional view along line XXVIIIB-XXIIIVB, FIG. 28C is a schematic cross-sectional view along line XXVIIIC-XXVIIIC, and FIG. 28D is a schematic cross-sectional view along line XXVIIID-XXVIIID;

FIG. 29A is a schematic plan view of a semiconductor device of Comparative Example 1 in Embodiment 1 of the present invention, and FIG. 29B is a schematic plan view of a semiconductor device of Comparative Example 2 in Embodiment 1 of the present invention;

FIGS. 35A to 35D are schematic cross-sectional views of FIG. 34, in which FIG. 35A is a schematic cross-sectional view along line XXXVA-XXXVA, FIG. 35B is a schematic cross-sectional view along line XXXVB-XXXVB, FIG. 35C is a schematic cross-sectional view along line XXXVC-XXXVC, and FIG. 35D is a schematic cross-sectional view along line XXXVD-XXXVD;

FIGS. 37A to 37D are schematic cross-sectional views of FIG. 36, in which FIG. 37A is a schematic cross-sectional view along line XXXVIIA-XXXVIIA, FIG. 37B is a schematic cross-sectional view along line XXXVIIB-XXXVIIB, FIG. 37C is a schematic cross-sectional view along line XXXVIIC-XXXVIIC, and FIG. 37D is a schematic cross-sectional view along line XXXVIID-XXXVIID;

FIGS. 43A to 43D are schematic cross-sectional views of FIG. 42, in which FIG. 43A is a schematic cross-sectional view along line XLIIIA-XLIIIA, FIG. 43B is a schematic cross-sectional view along line XLIIIB-XLIIIB, FIG. 43C is a schematic cross-sectional view along line XLIIIC-XLIIIC, and FIG. 43D is a schematic cross-sectional view along line XLIIID-XLIIID;

FIG. 45 is a schematic plan view showing a ninth step of the method for manufacturing a semiconductor device in Embodiment 2 of the present invention;

FIGS. 46A to 46D are schematic cross-sectional views of FIG. 45, in which FIG. 46A is a schematic cross-sectional view along line XLVIA-XLVIA, FIG. 46B is a schematic cross-sectional view along line XLVIB-XLVIB, FIG. 46C is a schematic cross-sectional view along line XLVIC-XLVIC, and FIG. 46D is a schematic cross-sectional view along line XLVID-XLVID;

FIGS. 48A to 48D are schematic cross-sectional views of FIG. 47, in which FIG. 48A is a schematic cross-sectional view along line XLVIIIA-XLVIIIA, FIG. 48B is a schematic cross-sectional view along line XLVIIIB-XLVIIIB, FIG. 48C is a schematic cross-sectional view along line XLVIIIC-XLVIIIC, and FIG. 48D is a schematic cross-sectional view along line XLVIIID-XLVIIID;

FIGS. 61A to 61C are schematic cross-sectional views of FIG. 60 in which FIG. 61A is a schematic cross-sectional view along line LXIA-LXIA, FIG. 61B is a schematic cross-sectional view along line LXIB-LXIB, and FIG. 61C is a schematic cross-sectional view along line LXIC-LXIC;

FIGS. 69A and 69B are schematic cross-sectional views showing a first step of a method for manufacturing a semiconductor device in Embodiment 6 of the present invention, in which FIG. 69A is a schematic cross-sectional view of the semiconductor device including a recess formed therein, and FIG. 69B is a schematic cross-sectional view of the semiconductor device including no recess formed therein, with the cross-sectional positions respectively corresponding to FIG. 2B;

FIGS. 71A and 71B are schematic cross-sectional views showing a second step of a method for manufacturing a semiconductor device in Embodiment 6 of the present invention, in which FIG. 71A is a schematic cross-sectional view of the semiconductor device including a recess formed therein, and FIG. 71B is a schematic cross-sectional view of the semiconductor device including no recess formed therein, with the cross-sectional positions corresponding to FIGS. 69A and 69B, respectively;

FIGS. 73A and 73B are schematic cross-sectional views showing a third step of the method for manufacturing a semiconductor device in Embodiment 6 of the present invention, in which FIG. 73A is a schematic cross-sectional view of the semiconductor device including a recess formed therein, and FIG. 73B is a schematic cross-sectional view of the semiconductor device including no recess formed therein, with the cross-sectional positions corresponding to FIGS. 69A and 69B, respectively;

FIGS. 74A and 74B are schematic cross-sectional views showing a fourth step of the method for manufacturing a semiconductor device in Embodiment 6 of the present invention, in which FIG. 74A is a schematic cross-sectional view of the semiconductor device including a recess formed therein, and FIG. 74B is a schematic cross-sectional view of the semiconductor device including no recess formed therein, with the cross-sectional positions corresponding to FIGS. 69A and 69B, respectively;

FIGS. 76A and 76B are schematic cross-sectional views showing a fifth step of the method for manufacturing a semiconductor device in Embodiment 6 of the present invention, in which FIG. 76A is a schematic cross-sectional view of the semiconductor device including a recess formed therein, and FIG. 76B is a schematic cross-sectional view of the semiconductor device including no recess formed therein, with the cross-sectional positions corresponding to FIGS. 69A and 69B, respectively;

FIGS. 77A and 77B are schematic cross-sectional views showing a sixth step of the method for manufacturing a semiconductor device in Embodiment 6 of the present invention, in which FIG. 77A is a schematic cross-sectional view of the semiconductor device including a recess formed therein, and FIG. 77B is a schematic cross-sectional view of the semiconductor device including no recess formed therein, with the cross-sectional positions corresponding to FIGS. 69A and 69B, respectively;

FIG. 78A is a schematic cross-sectional view showing a state in which a silicide protection mask is formed in a semiconductor device including a recess formed therein, and FIG. 78B is a schematic cross-sectional view showing a state in which a silicide protection mask is not formed in a semiconductor device including no recess formed therein, with the cross-sectional positions corresponding to FIGS. 69A and 69B, respectively, in the method for manufacturing a semiconductor device in Embodiment 6 of the present invention;

FIG. 79A is a schematic cross-sectional view showing a state in which a silicide is formed in a semiconductor device including a recess formed therein, and 79B is a schematic cross-sectional view showing a state in which a silicide is formed in a semiconductor device including no recess formed therein, with the cross-sectional positions corresponding to FIGS. 69A and 69B, respectively, in the method for manufacturing a semiconductor device in Embodiment 6 of the present invention;

FIGS. 80A and 80B are schematic cross-sectional views showing a first step of a method for manufacturing a semiconductor device in Embodiment 7 of the present invention, in which FIG. 80A is a schematic cross-sectional view of the semiconductor device including a recess formed therein, and FIG. 80B is a schematic cross-sectional view of the semiconductor device including no recess formed therein, with the cross-sectional positions respectively corresponding to FIG. 2B;

FIGS. 81A and 81B are schematic cross-sectional views showing a second step of the method for manufacturing a semiconductor device in Embodiment 7 of the present invention, in which FIG. 81A is a schematic cross-sectional view of the semiconductor device including a recess formed therein, and FIG. 80B is a schematic cross-sectional view of the semiconductor device including no recess formed therein, with the cross-sectional positions corresponding to FIGS. 80A and 80B, respectively;

FIGS. 83A and 83B are schematic cross-sectional views showing a third step of the method for manufacturing a semiconductor device in Embodiment 7 of the present invention, in which FIG. 83A is a schematic cross-sectional view of the semiconductor device including a recess formed therein, and FIG. 80B is a schematic cross-sectional view of the semiconductor device including no recess formed therein, with the cross-sectional positions corresponding to FIGS. 80A and 80B, respectively; and FIGS. 84A and 84B are schematic cross-sectional views showing a fourth step of the method for manufacturing a semiconductor device in Embodiment 7 of the present invention, in which FIG. 84A is a schematic cross-sectional view of the semiconductor device including a recess formed therein, and FIG. 84B is a schematic cross-sectional view of the semiconductor device including no recess formed therein, with the cross-sectional positions corresponding to FIGS. 80A and 80B, respectively.

DETAILED DESCRIPTION OF THE PREFERRED EMBODIMENTS

Below, embodiments of the present invention will be described by reference to the accompanying drawings.

Embodiment 1

First, a description will be given to a configuration of a semiconductor device of Embodiment 1 of the present invention.

Figure 1:
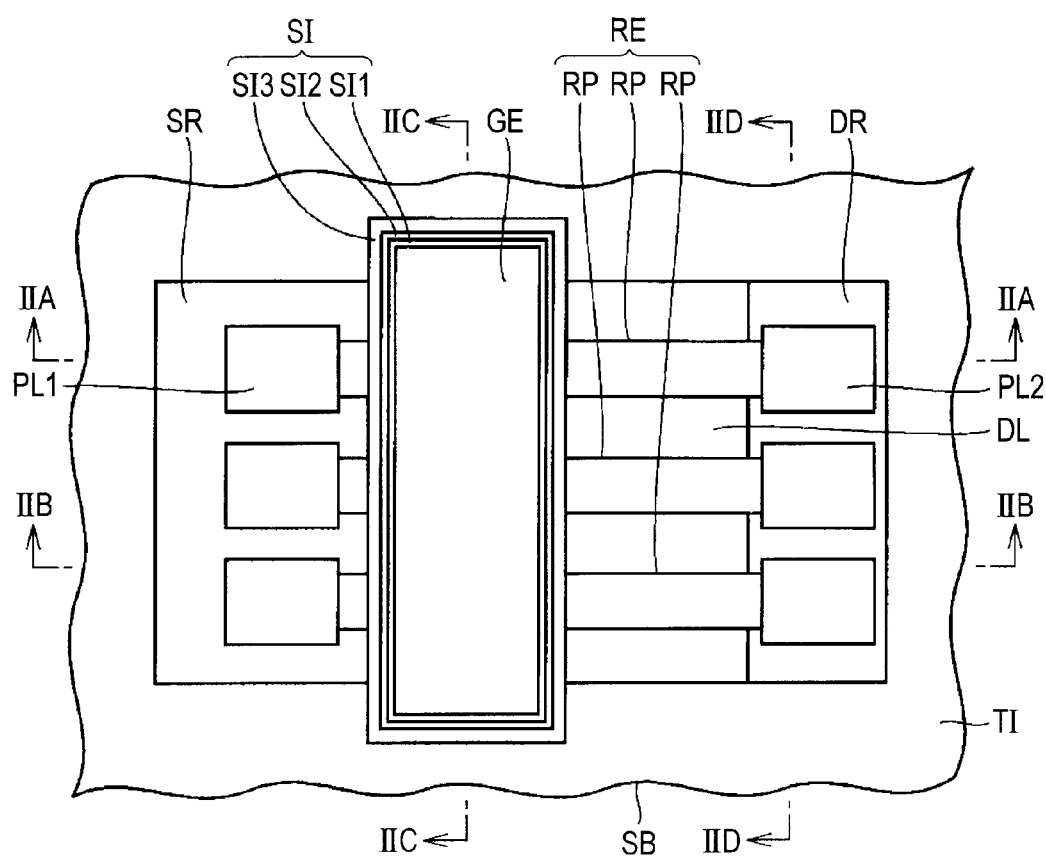
FIG. 1 is a schematic plan view of a semiconductor device in Embodiment 1 of the present invention.

Referring to FIG. 1, the semiconductor device in the present embodiment mainly has a semiconductor substrate SB having a main surface, and MOSFETs (Metal Oxide Semiconductor Field Effect Transistors) formed in the semiconductor substrate SB. To the semiconductor substrate SB, for example, a silicon substrate is applicable.

Figure 2A:
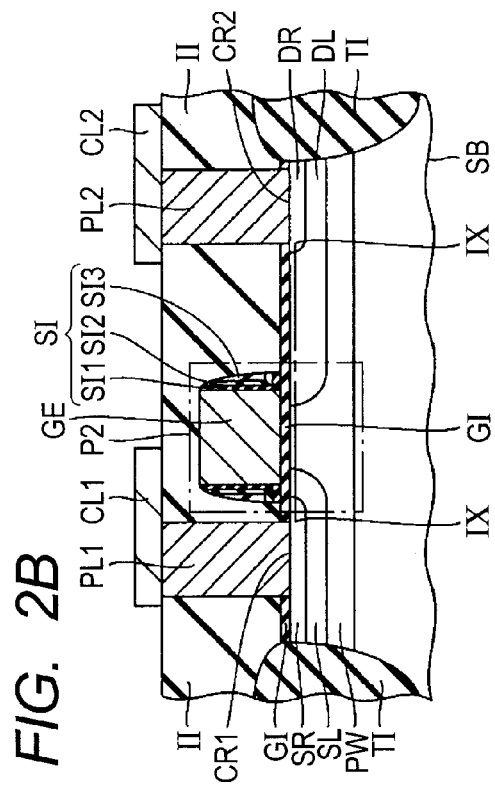
Figure 2C:
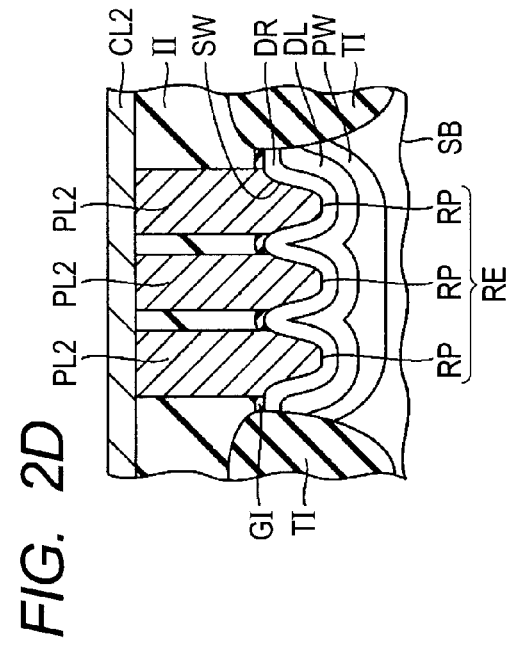
Figure 2B:
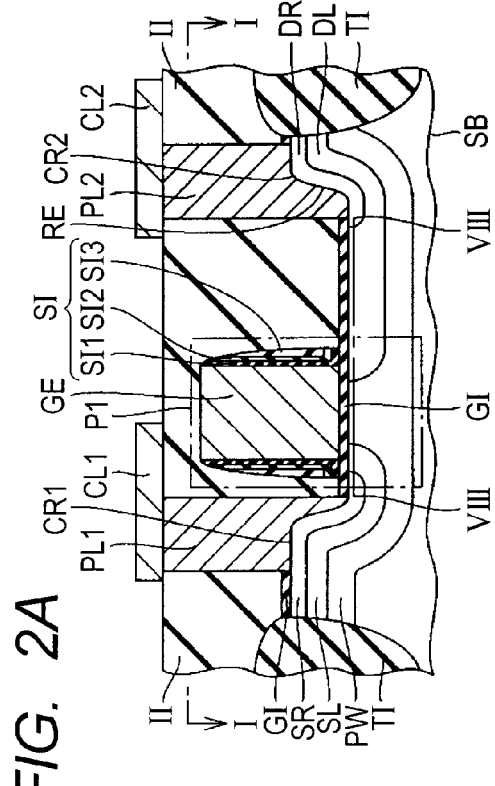

Referring to FIGS. 1, and 2A and 2B, in the main surface of the semiconductor substrate SB, an element isolation film TI formed with, for example, LOCOS (Local Oxidation of Silicon) is formed. Incidentally, FIG. 1 is a plan view along line I-I of FIG. 2A. In FIG. 1, a source-side conductive layer CL1, a drain-side conductive layer CL2, an interlayer insulation film II, and a gate insulation film GI are not shown for ease of viewing.

In a region isolated by the element isolation film TI, a MOSFET is formed. The MOSFET includes, for example, an n type MOSFET, and is formed in a p type well region PW in the main surface of the semiconductor substrate SB. Incidentally, the MOSFET may be a p type MOSFET. Although not shown, in the case of a p type MOSFET, the p type MOSFET is formed in an n type well region.

The n type MOSFET may have a LDD (Lightly Doped Drain) structure of a low-concentration region and a high-concentration region of n type impurities. Below, as one example of the present embodiment, an n type MOSFET having a LDD structure will be described.

The n type MOSFET having a LDD structure mainly has a pair of n type low-concentration regions to be a source-side low-concentration region SL and a drain-side low-concentration region DL, a pair of n type high-concentration regions to be a source region SR and a drain region DR, a gate electrode layer GE, a gate insulation film GI, and a recess RE.

The source region SR and the drain region DR are formed apart from each other in the main surface of the semiconductor substrate SB in the p type well region PW. The source region SR and the drain region DR include a pair of n type impurity regions. The source region SR and the drain region DR are formed asymmetrically with respect to the gate electrode layer GE. The drain region DR is formed to be more offset from the gate electrode layer GE than the source region SR.

The source-side low-concentration region SL and the drain-side low-concentration region DL are formed apart from each other in the main surface of the semiconductor substrate SB in the p type well region PW. The source-side low-concentration region SL is formed in such a manner as to cover the periphery of the source region SR. The source-side low-concentration region SL has a lower impurity concentration than that of the source region SR. The source-side low-concentration region SL is formed with the same conductivity type as that of the source region SR.

The drain-side low-concentration region DL is formed in such a manner as to cover the periphery of the drain region DR. The drain-side low-concentration region DL has a lower impurity concentration than that of the drain region DR. The drain-side low-concentration region DL is formed with the same conductivity type as that of the drain region DR. The recess RE is formed in such a manner as to pass through the drain-side low-concentration region DL and the source-side low-concentration region SL. The source-side low-concentration region SL and the drain-side low-concentration region DL form the LDD layer having the n type impurity regions.

The gate electrode layer GE is formed over the main surface of the semiconductor substrate SB sandwiched between the source region SR and the drain region DR. The gate electrode layer GE is formed over a channel formation region sandwiched between a pair of n type impurity regions to be the source-side low-concentration region SL and the drain-side low-concentration region DL with the gate insulation film GI sandwiched therebetween. Over the sidewall of the gate electrode layer GE, the sidewall insulation film SI is formed. The drain region DR and the sidewall insulation film SI are spaced apart from each other.

The interlayer insulation film II is formed in such a manner as to cover the gate insulation film GI, the gate electrode layer GE, the sidewall insulation film SI, and the element isolation film TI. A first conductive layer PL1 and a second conductive layer PL2 are formed in such a manner as to penetrate through the gate insulation film GI and the interlayer insulation film II. The first conductive layer PL1 is formed in such a manner as to be in contact with the surface of the source region SR. The second conductive layer PL2 is formed in such a manner as to be in contact with the surface of the drain region DR.

Over the interlayer insulation film II, the source-side conductive layer CL1 and the drain-side conductive layer CL2 are formed. The source-side conductive layer CL1 and the first conductive layer PL1 are electrically coupled with each other. The drain-side conductive layer CL2 and the second conductive layer PL2 are electrically coupled with each other.

Referring to FIGS. 1, and 2A, 2C, and 2D, in the main surface of the semiconductor substrate SB, the recess RE is formed. The recess RE is formed in such a manner as to extend from the contact region CR1 between the first conductive layer PL1 and the source region SR through a part underlying the gate electrode layer GE to a contact region CR2 between the second conductive layer PL2 and the drain region DR.

Figure 2D:
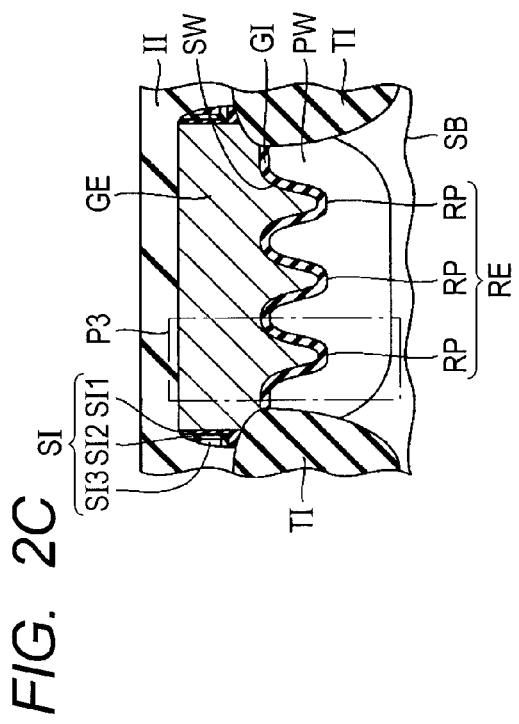

The recess RE may include a plurality of recess parts RP. A plurality of recess parts RP may be formed in such a manner as to respectively run in parallel to one another. As shown in FIGS. 2C and 2D, a plurality of the recess parts RP may form a ripple shape in the channel width direction of the n type MOSFET. The drain region DR and the drain-side low-concentration region DL are formed in the main surface of the semiconductor substrate SB in the p type well region PW along the ripple shape. Over a plurality of the recess parts RP, the gate electrode layer GE is formed with the gate insulation film GI sandwiched therebetween.

The second conductive layer PL2 is formed in such a manner as to be in contact with each sidewall SW in the channel length direction of a plurality of recess parts RP of the recess RE. The second conductive layer PL2 may be configured in such a manner as to be in contact with each wall surface in the channel width direction of a plurality of recess parts RP of the recess RE.

Incidentally, the source region SR side not shown also has the same configuration as that of the drain region DR side. The source region SR and the source-side low-concentration region SL are formed in the main surface of the semiconductor substrate SB in the p type well region PW along the ripple shape of a plurality of the recess parts RP. The first conductive layer PL1 is in contact with each sidewall SW in the channel length direction of a plurality of the recess parts RP of the recess RE.

Subsequently, a description will be given to the concentration of each layer (region) of the n type MOSFET forming the semiconductor device in the present embodiment. The B (boron) shown in FIGS. 3 to 5 is ion-implanted at, for example, an accelerating voltage of 70 keV, an angle of 45 degrees, a concentration of $2\times10^{12}/cm^2$, and a frequency of 4 times.

Figure 3:
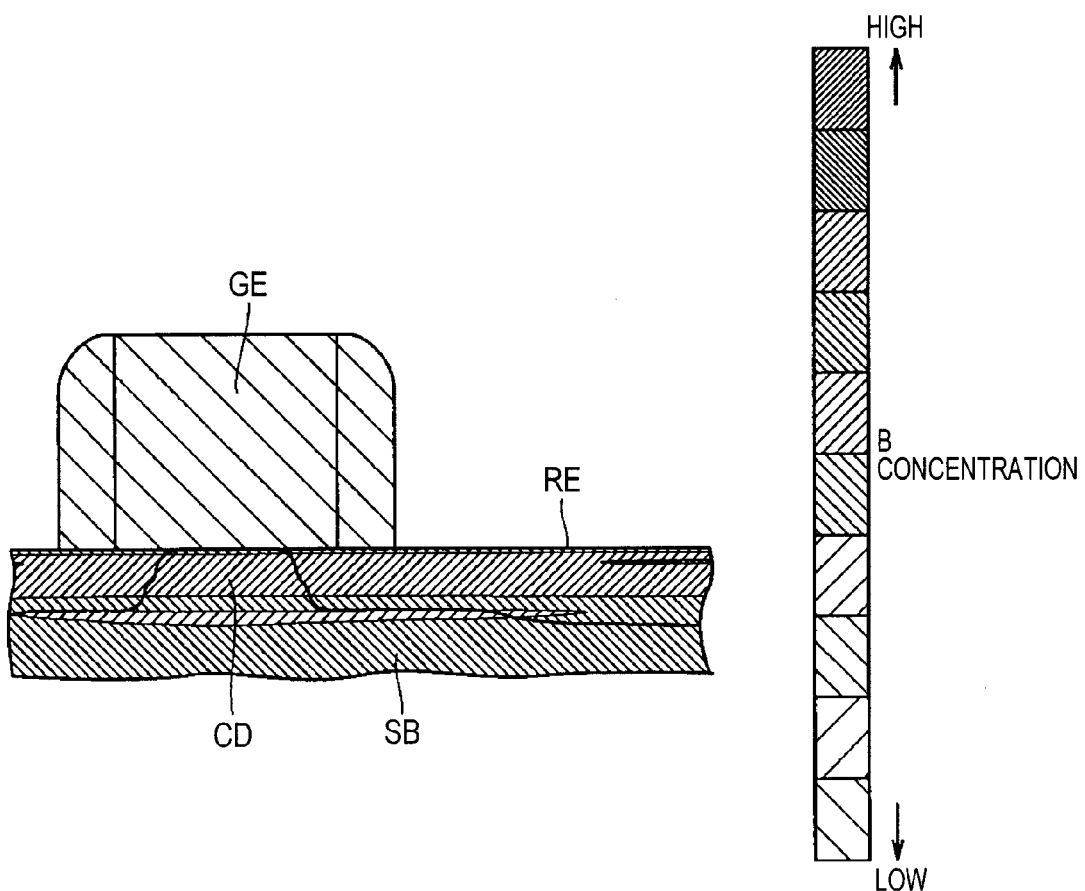
FIG. 3 is a view showing the distribution of the B concentration of a P1 part of FIG. 2A.
Figure 4:
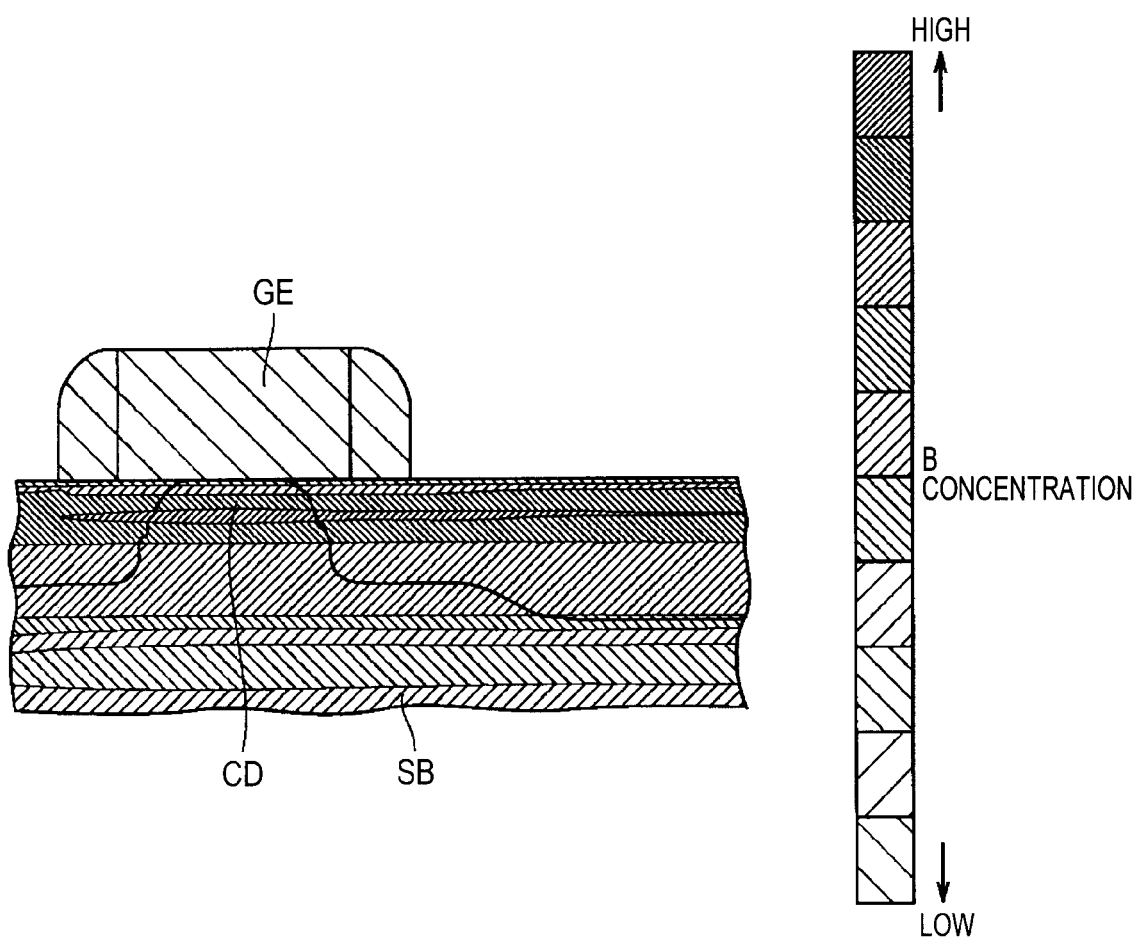
FIG. 4 is a view showing the distribution of the B concentration of a P2 part of FIG. 2B.

Referring to FIG. 3, for the concentration distribution of the P1 part of FIG. 2A, the B (boron) concentration of the n type MOSFET is uniformly distributed in the channel doped layer CD. Referring to FIG. 4, for the concentration distribution of the P2 part of FIG. 2B, the B (boron) concentration of the n type MOSFET is uniformly distributed in the channel doped layer CD.

Figure 5:
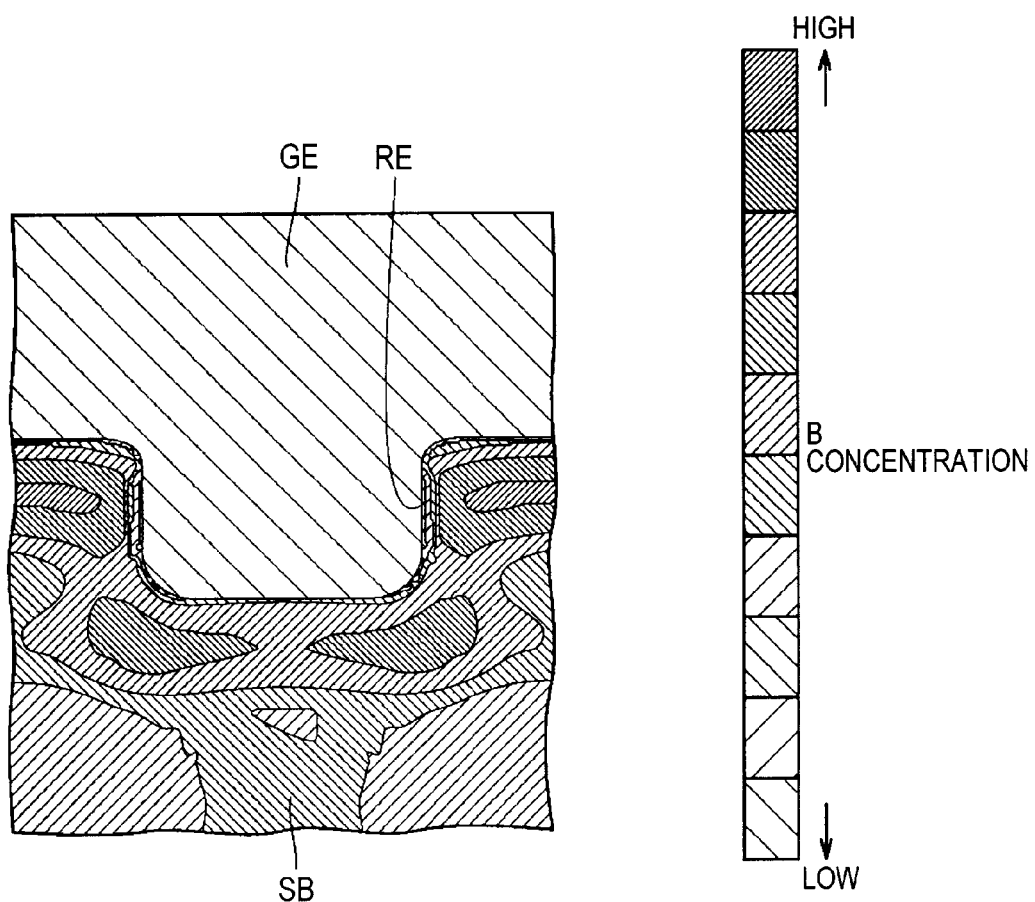
FIG. 5 is a view showing the distribution of the B concentration of a P3 part of FIG. 2C.

Referring to FIG. 5, for the B concentration of the n type MOSFET, a high impurity concentration region is uniformly distributed throughout the bottom, corner parts, and side parts of the recess RE. A high B concentration region is also distributed in the corner parts of the recess RE.

Figure 6:
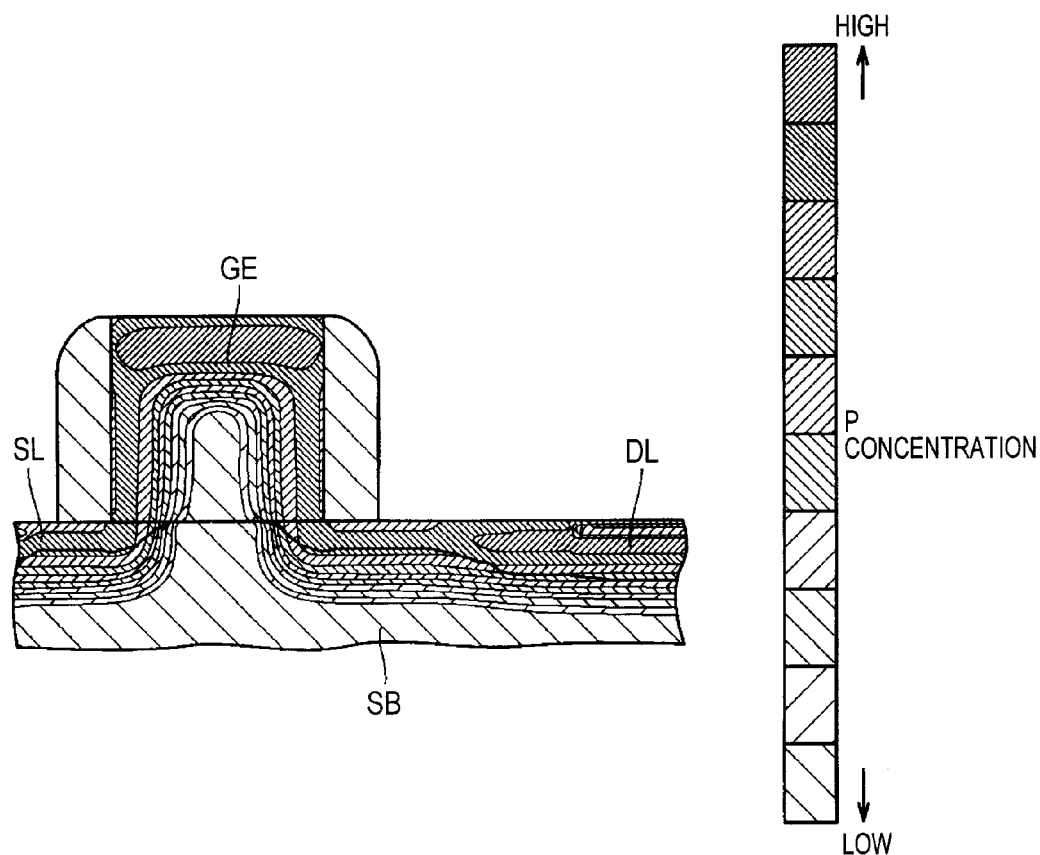
FIG. 6 is a view showing the distribution of the P concentration of the P1 part of FIG. 2A.

Referring to FIG. 6, for the P (phosphorus) concentration of the n type MOSFET, there are formed the source-side low-concentration region SL and the drain-side low-concentration region DL which are high P concentration regions. The source-side low-concentration region SL and the drain-side low-concentration region DL form a LDD structure. The P (phosphorus) shown in FIG. 6 is ion-implanted at, for example, an accelerating voltage of 130 keV, an angle of 45 degrees, a concentration of $3.75\times10^{12}/cm^2$, and a frequency of 4 times or an accelerating voltage of 150 keV, an angle of 45 degrees, a concentration of $5\times10^{12}/cm^2$, and a frequency of 4 times.

Figure 7:
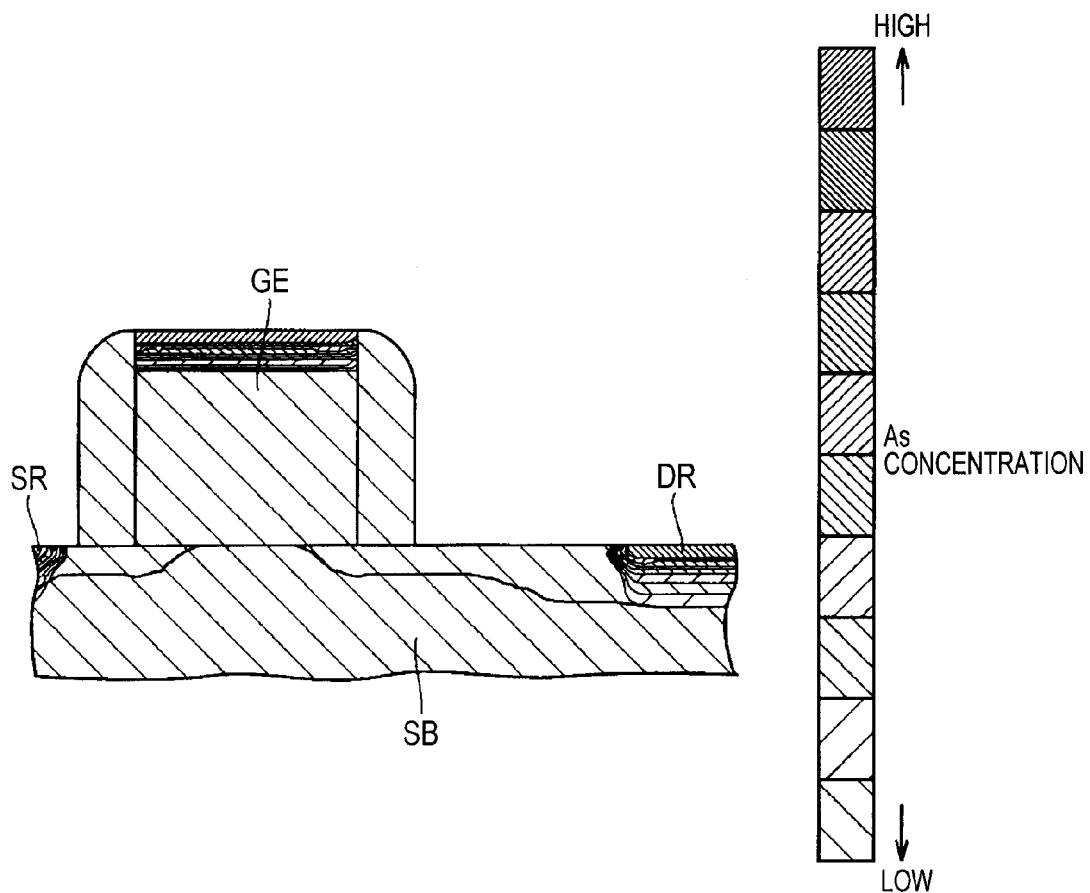
FIG. 7 is a view showing the distribution of the As concentration of the P1 part of FIG. 2A.

Referring to FIG. 7, for the As (arsenic) concentration of the n type MOSFET, there are formed the source region SR and the drain region DR which are high As concentration regions. The drain region DR is formed apart from the sidewall insulation film SI. The As (arsenic) shown in FIG. 7 is ion-implanted at, for example, an accelerating voltage of 50 keV, an angle of 7 degrees, a concentration of $4\times10^{15}/cm^2$, and a frequency of 1 time.

Figure 8:
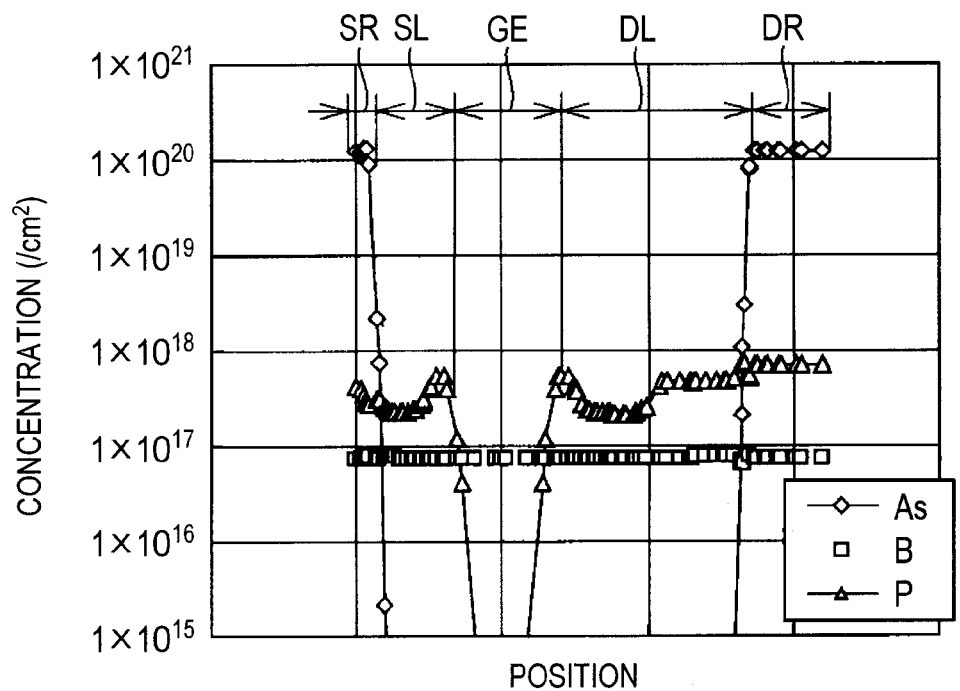
FIG. 8 is a view showing the profile of the impurity concentration along line VIII-VIII of FIG. 2A.
Figure 9:
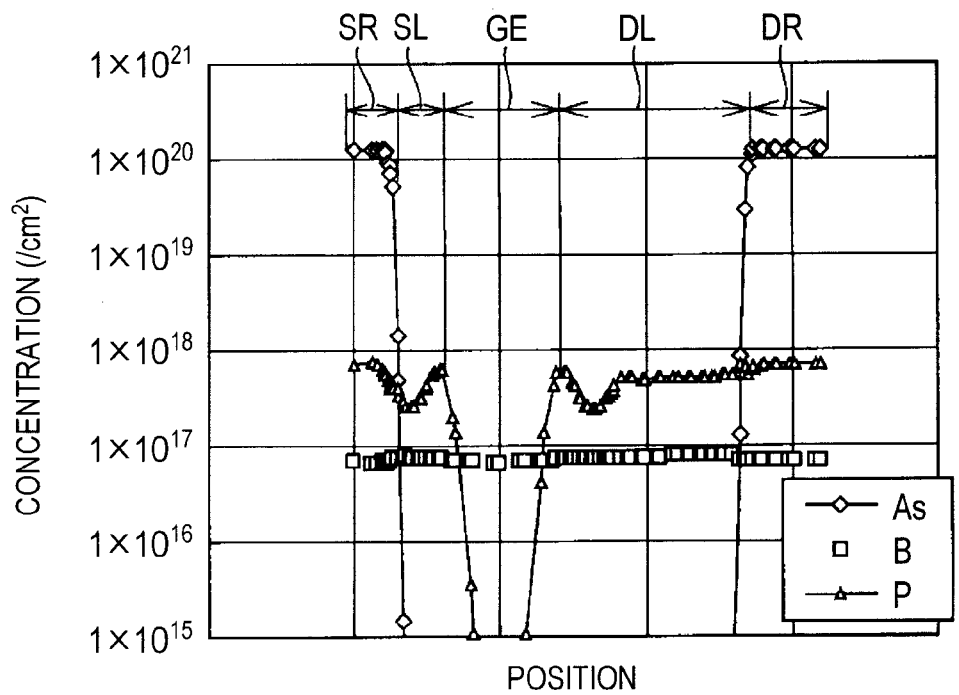
FIG. 9 is a view showing the profile of the impurity concentration along line IX-IX of FIG. 2B.
Figure 10:
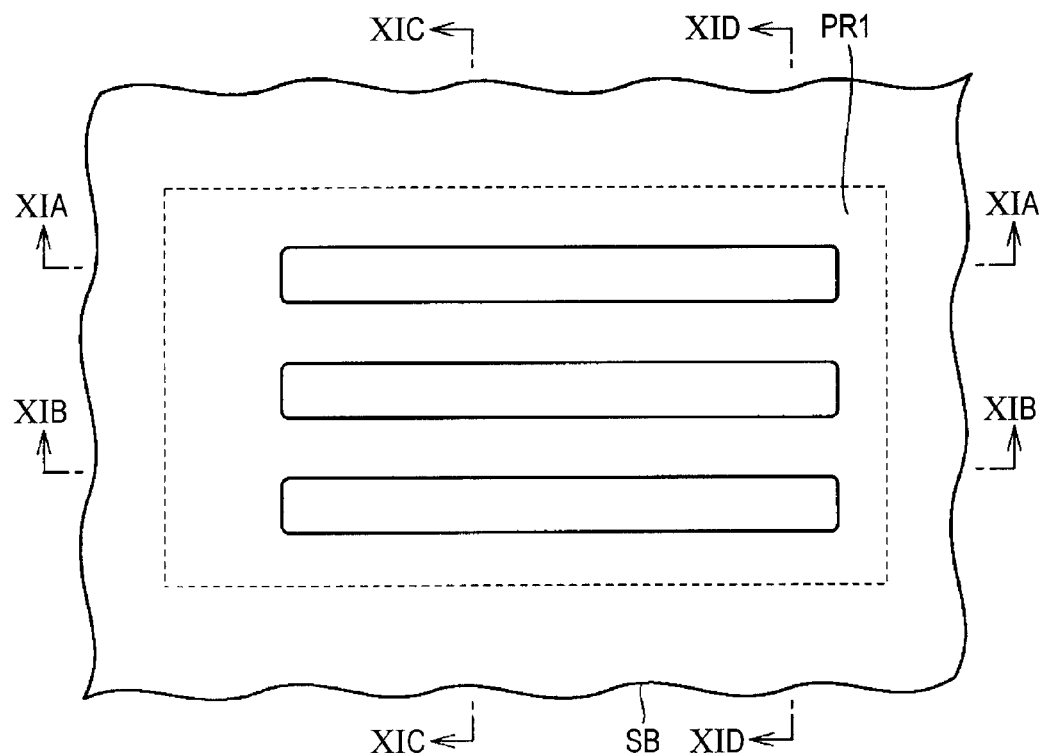
FIG. 10 is a schematic plan view showing a first step of a method for manufacturing a semiconductor device in Embodiment 1 of the present invention.
Figure 11A:
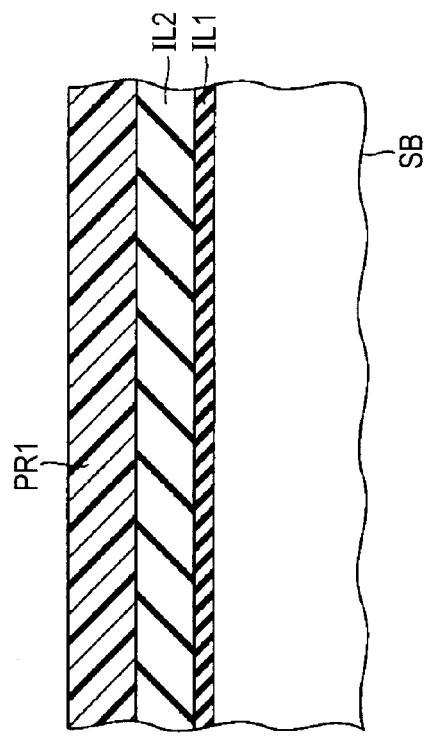
Figure 11B:
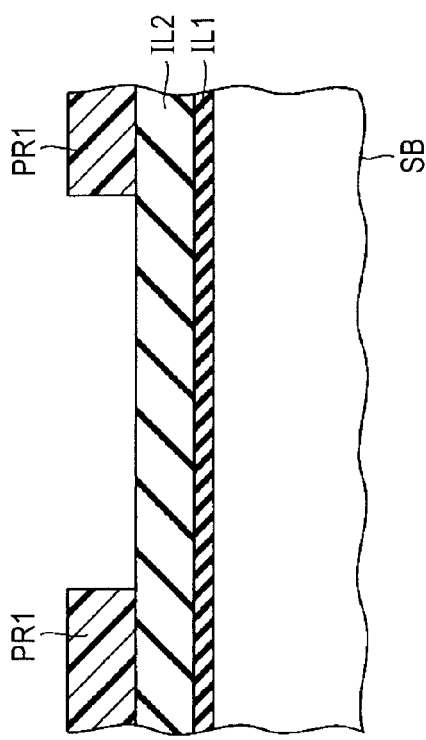
Figure 11C:
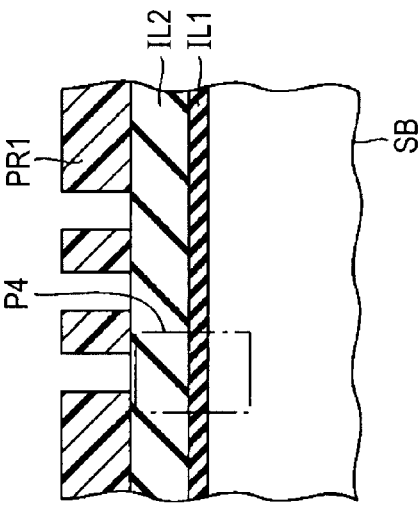
Figure 11D:
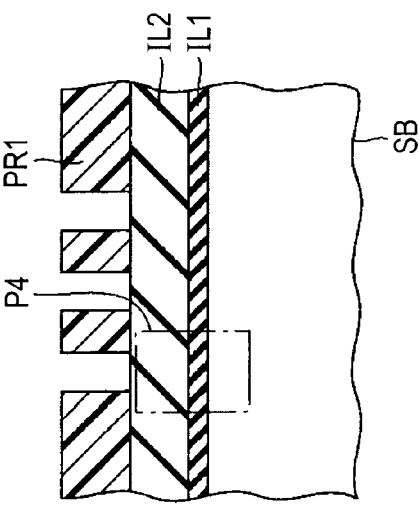

Referring to FIGS. 8 and 9, the abscissas of FIGS. 8 and 9 denote the positions along line VIII-VIII of FIG. 2A and line IX-IX of FIG. 2B, respectively. The ordinates of FIGS. 8 and 9 denote the impurity concentrations (unit (cm$^2$)) at respective positions. The impurities are As, B, and P. As shown in FIGS. 8 and 9, in the source region SR and the drain region DR, the As concentration is high. The As concentration has a peak concentration of about $2\times10^{20}$/cm$^{-2}$. In the source-side low-concentration region SL and the drain-side low-concentration region DL, the P concentration is high. The P concentration has a peak concentration of about $9\times10^{15}$/cm$^{-2}$. The B concentration has a roughly constant concentration of about $9\times10^{16}$/cm$^{-2}$. As shown in the P1 part of FIG. 2A and the P2 part of FIG. 2B, there is no large difference in impurity concentration between in the bottom of the recess RE and in the periphery of the recess RE.

Then, a description will be given to a method for manufacturing a semiconductor device of the present embodiment. Referring to FIGS. 10 and 11A to 11D, first, the semiconductor substrate SB is prepared. In the main surface of the semiconductor substrate SB, a silicon oxide film (SiO) IL1 is formed. Not the silicon oxide film but a silicon oxynitride film (SiON) may be formed. The silicon oxide film IL1 is formed with a thickness of, for example, about 5 to 50 nm. Over the silicon oxide film IL1, a silicon nitride film (SiN) IL2 is formed. The silicon nitride film IL2 is formed with a thickness of, for example, about 50 to 200 nm. By general photography, over the silicon nitride film IL2, a photoresist pattern PR1 is formed. With the photoresist pattern PR1 as a mask, the silicon oxide film IL1 and the silicon nitride film IL2 are etched and patterned. Then, the photoresist pattern PR1 is removed by, for example, asking.

Figure 12:
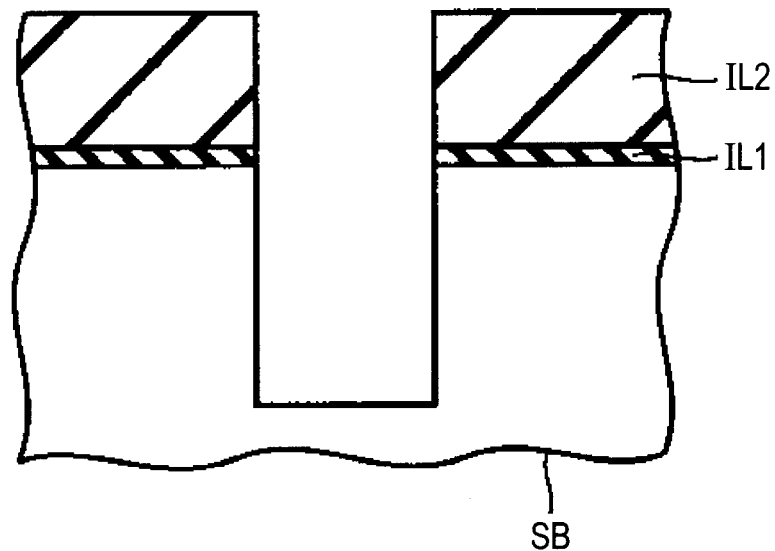
FIG. 12 is a schematic cross-sectional view showing a second step of the method for manufacturing a semiconductor device in Embodiment 1 of the present invention, the schematic cross-sectional view showing the state in which a trench is formed at a position corresponding to the P3 part of FIG. 2C.

Referring to FIG. 12, anisotropic etching is performed with the patterned silicon oxide film IL1 and silicon nitride film IL2 as a mask, thereby to form a trench in the main surface of the semiconductor substrate SB. The trench is formed with a thickness of, for example, about 50 to 500 nm.

Figure 13:
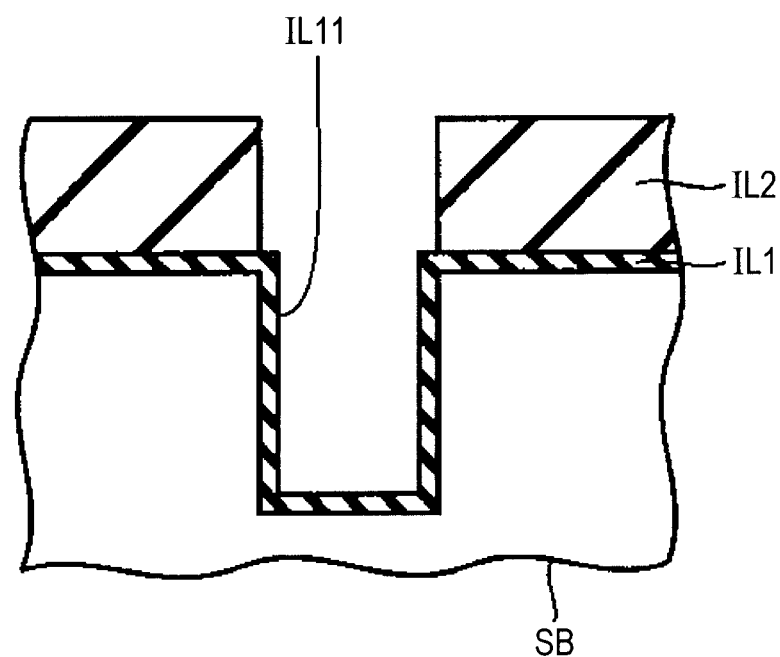
FIG. 13 is a schematic cross-sectional view showing the second step of the method for manufacturing a semiconductor device in Embodiment 1 of the present invention, the schematic cross-sectional view showing the state in which a silicon oxide film is formed in the trench at the position corresponding to the P3 part of FIG. 2C.

Then, referring to FIG. 13, for example, by a furnace body or RTP (Rapid Thermal Process), the silicon oxide film IL11 is formed in the inner surface of the trench in a dry atmosphere or a wet atmosphere. At this step, oxidation is performed under conditions under which the silicon oxide film IL11 is formed over the inner surface of the trench without oxidation of the surface of the silicon nitride film IL2. The silicon oxide film IL11 is formed with a thickness of, for example, about 5 to 20 nm.

Figure 14:
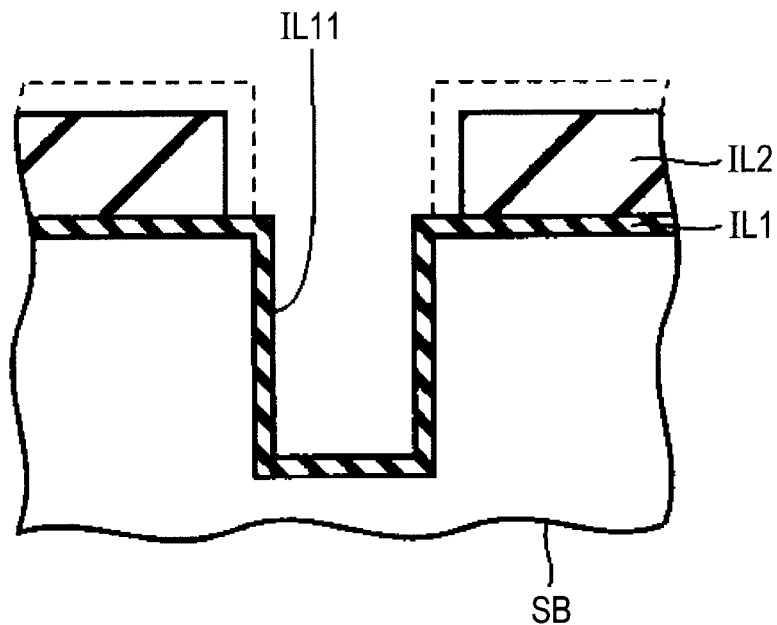
FIG. 14 is a schematic cross-sectional view showing the second step of the method for manufacturing a semiconductor device in Embodiment 1 of the present invention, the schematic cross-sectional view showing the state in which a part of a silicon nitride film has been etched at the position corresponding to the P3 part of FIG. 2C.

Subsequently, referring to FIG. 14, a part of the silicon nitride film IL2 is etched by, for example, hot phosphoric acid. The etching amount is about 5 to 50 nm. As a result, the silicon nitride film IL2 is shaped to be retreated from the opening of the trench.

Figure 15:
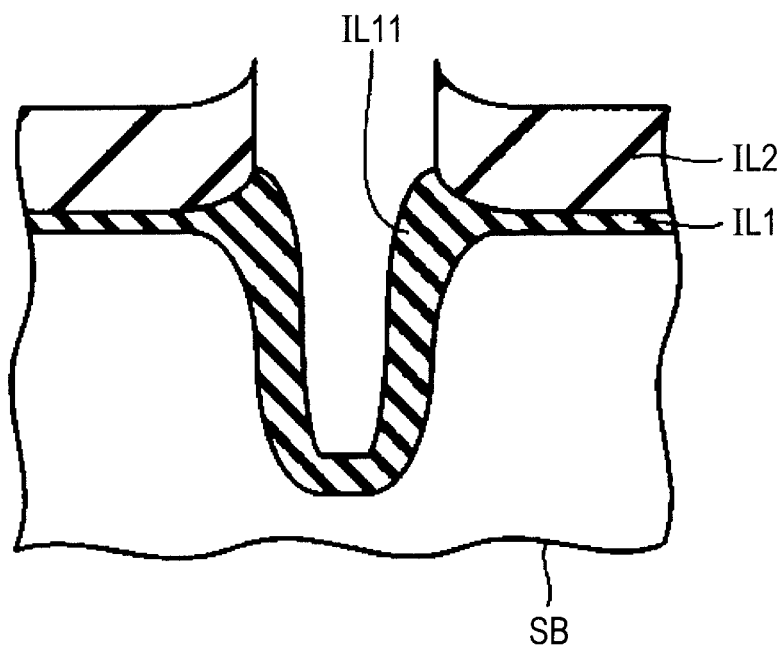
FIG. 15 is a schematic cross-sectional view showing the second step of the method for manufacturing a semiconductor device in Embodiment 1 of the present invention, the schematic cross-sectional view showing the state in which a silicon oxide film is further formed at the position corresponding to the P3 part of FIG. 2C.

Then, referring to FIG. 15, oxidation is further carried out with the silicon nitride film IL2 retreated from the opening of the trench. As a result, the silicon oxide film IL1 and the silicon oxide film IL11 are formed so as to be further thicker. At this step, the silicon oxide film IL1 and the silicon oxide film IL11 at the trench opening protrude from the silicon nitride film IL2, and hence are formed in such a manner that the corner part of the opening of the trench is rounded by oxidation.

Figure 16:
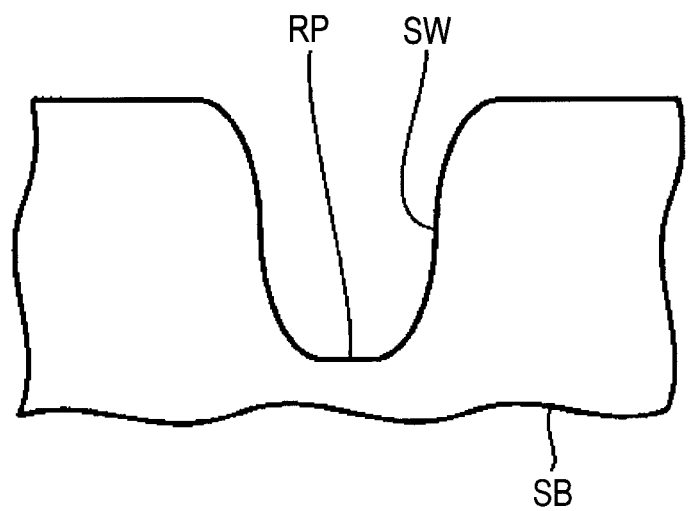
FIG. 16 is a schematic cross-sectional view showing the second step of the method for manufacturing a semiconductor device in Embodiment 1 of the present invention, the schematic cross-sectional view showing the state in which the silicon oxide film and the silicon nitride film have been etched at the position corresponding to the P3 part of FIG. 2C.
Figure 17A:
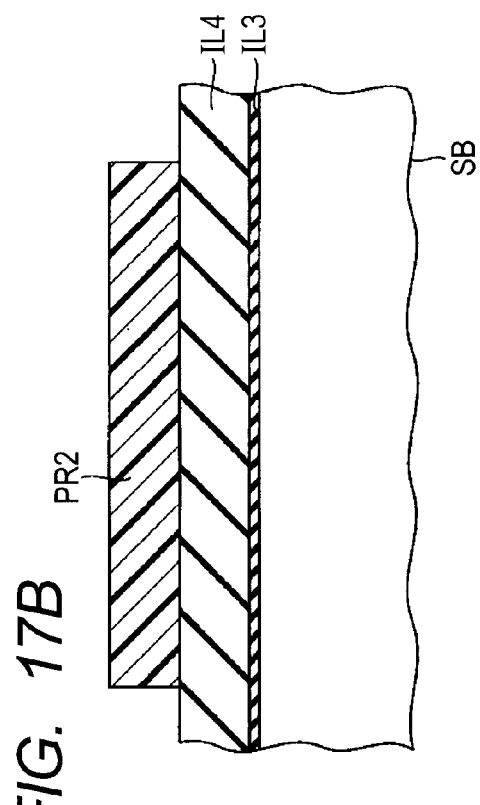
FIGS. 17A to 17D are schematic cross-sectional views showing a third step of the method for manufacturing a semiconductor device in Embodiment 1 of the present invention, with the cross-sectional positions corresponding to FIGS. 11A to 11D, respectively.
Figure 17B:
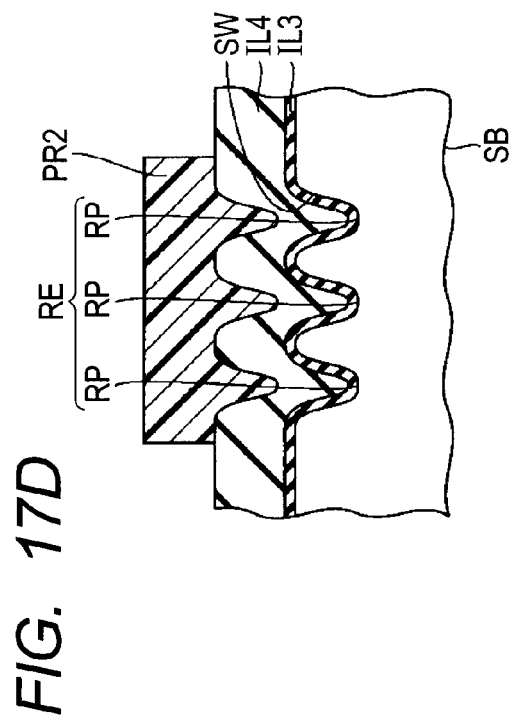
Figure 17C:
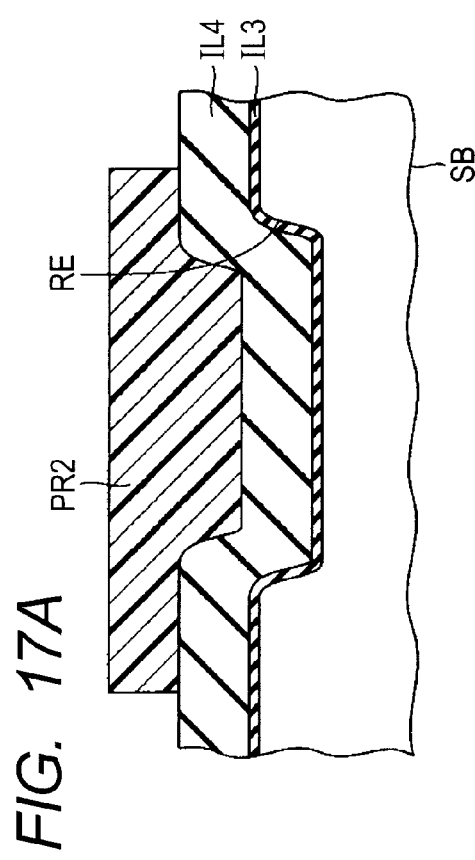
Figure 17D:
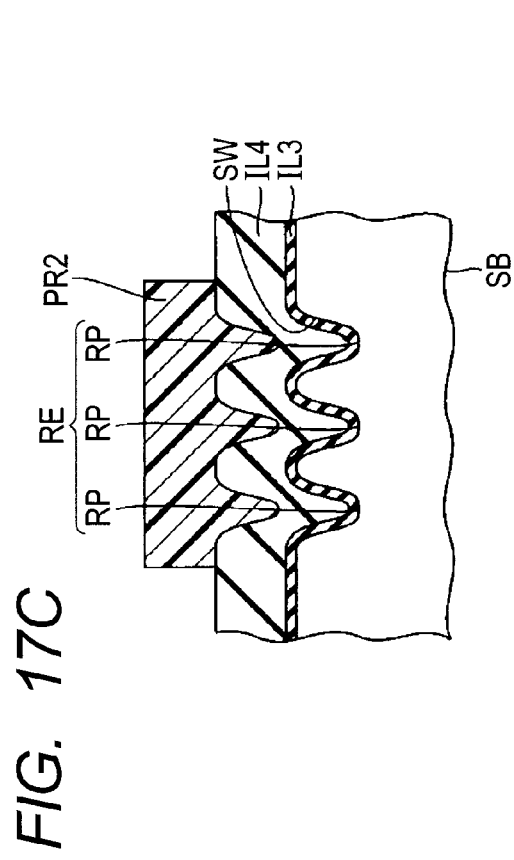
Figure 18A:
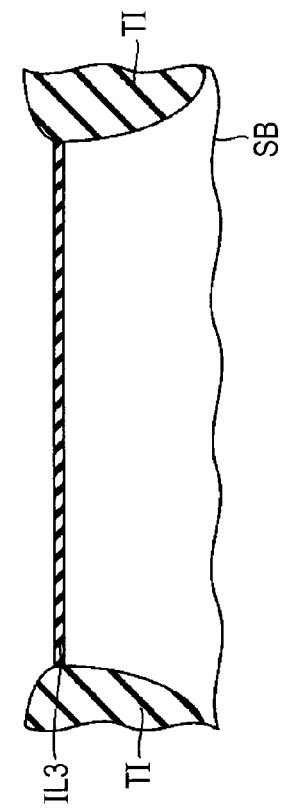
FIGS. 18A to 18D are schematic cross-sectional views showing a fourth step of the method for manufacturing a semiconductor device in Embodiment 1 of the present invention, with the cross-sectional positions corresponding to FIGS. 11A to 11D, respectively.
Figure 18B:
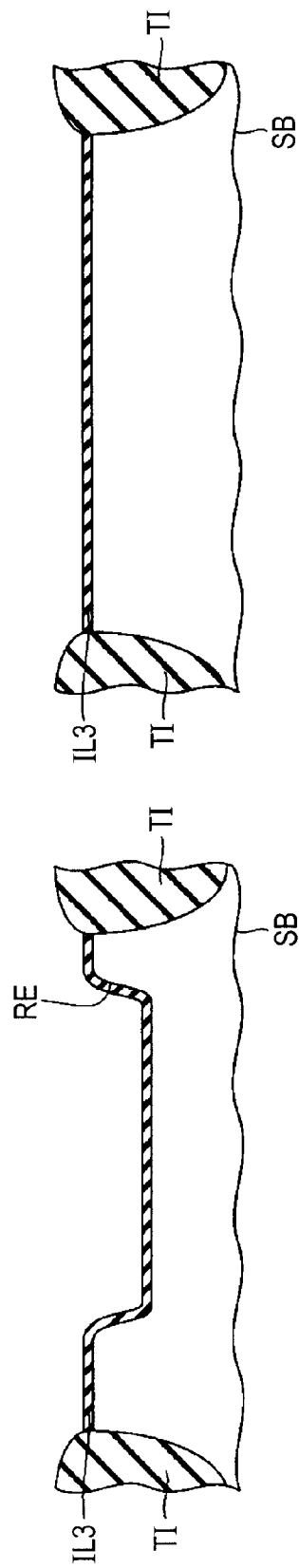
Figure 18C:
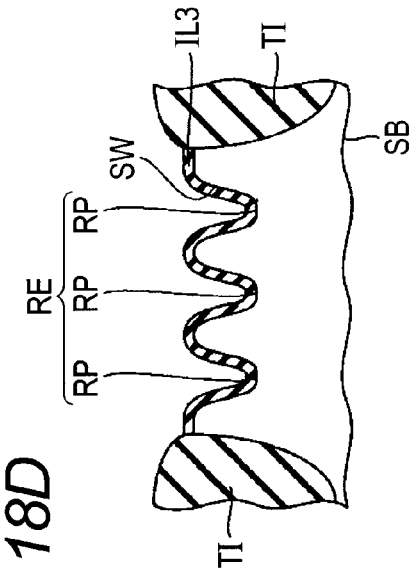
Figure 18D:
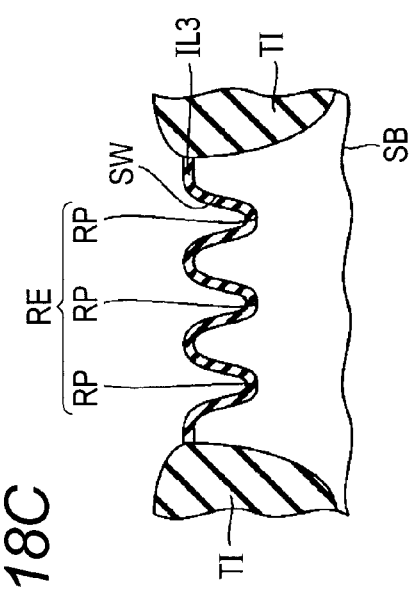

Then, for example, by hot phosphoric acid, the silicon nitride film IL2 is etched. Subsequently, for example, by hydrofluoric acid, the silicon oxide film IL1 and the silicon oxide film IL11 are etched. Referring to FIG. 16, by the etching, the corner part of the recess part RP is formed to be rounded. The sidewall of the recess RE is formed to have a curve shape. The recess parts RP are formed in plural number (e.g., in a number of three) in such a manner as to run in parallel to one another. This results in the formation of the recess RE including a plurality of recess parts RP.

Then, referring to FIGS. 17A to 17D, over the main surface of the semiconductor substrate SB including the recess RE formed therein, a silicon oxide film IL3 is formed. Over the silicon oxide film IL3, a silicon nitride film IL4 is formed. By general photography, over the silicon nitride film IL4, a photoresist pattern PR2 is formed. With the photoresist pattern PR2 as a mask, the silicon nitride film IL4 is etched and patterned. Then, the photoresist pattern PR2 is removed by, for example, ashing.

With the patterned silicon nitride film IL4 as a mask, the silicon oxide film IL3 is further oxidized. Then, for example, by hot phosphoric acid, the silicon nitride film IL4 is etched.

Referring to FIGS. 18A to 18D, by oxidation of the silicon oxide film IL3, the element isolation film TI formed by LOCOS is formed in the main surface of the semiconductor substrate SB. Then, for example, by hydrofluoric acid, the silicon oxide film IL3 is etched. Incidentally, the element isolation film TI may be formed by STI (Shallow Trench Isolation).

Then, by a general CMOS (Complementary Metal Oxide Semiconductor) transistor formation process, a well region is formed. Referring to FIGS. 19A to 19D, over the main surface of the semiconductor substrate SB, a shield oxide film SO is formed. Subsequently, the shield oxide film SO is annealed. By general lithography, there is patterned a p type well region PW-forming region in the main surface of the semiconductor substrate SB. Into the patterned region, for example, B (boron) is ion-implanted. This results in formation of the p type well region PW in the main surface of the semiconductor substrate SB. Alternatively, channel implantation may be carried out in order to adjust the threshold voltage.

Further, by general lithography, there is patterned an n type well region-forming region in the main surface of the semiconductor substrate SB. Into the patterned region, for example, P (phosphorus) is ion-implanted. This results in formation of the n type well region not shown in the main surface of the semiconductor substrate SB.

The ion implantation for well formation is generally performed by vertical implantation along the direction of the normal to the main surface of the semiconductor substrate SB for general MOSFET formation. With the method for manufacturing a semiconductor device of the present embodiment, in the main surface of the semiconductor substrate SB, the recess RE is formed. Accordingly, the main surface of the semiconductor substrate SB has a three-dimensional structure. For this reason, the ion implantation corresponding to the three-dimensional structure is carried out.

Figure 19A:
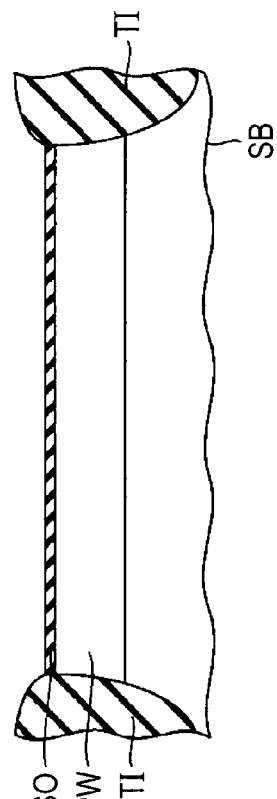
FIGS. 19A to 19D are schematic cross-sectional views showing a fifth step of the method for manufacturing a semiconductor device in Embodiment 1 of the present invention, with the cross-sectional positions corresponding to FIGS. 11A to 11D, respectively.
Figure 19C:
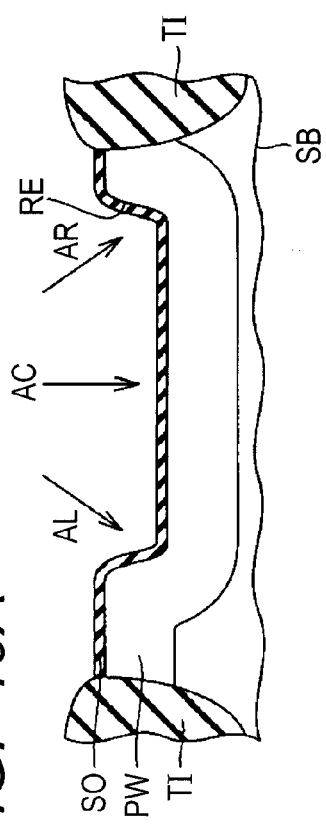
Figure 19B:
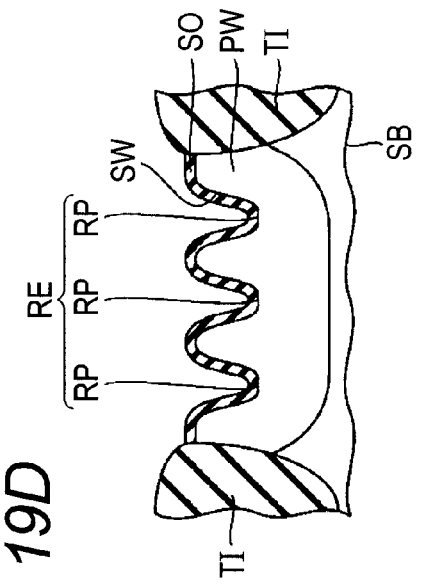
Figure 19D:
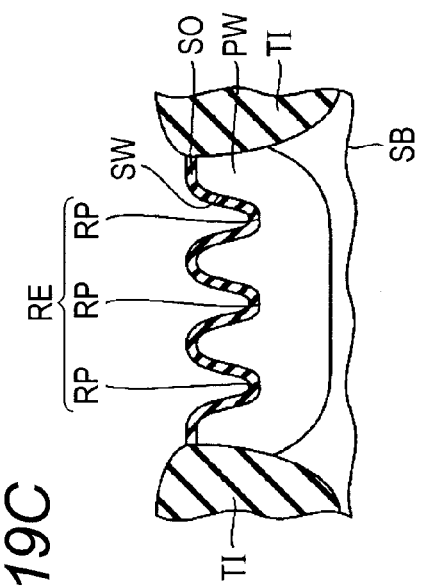

As shown in FIG. 19A, by combining vertical implantation, oblique implantation, and the like, ion implantation is carried out so as to equalize the ion implantation amounts in the main surface of the semiconductor substrate SB, the sidewall SW of the recess RE, and the bottom wall of the recess RE. For vertical implantation, ion implantation is carried out from the direction of an arrow AC in the figure to the main surface of the semiconductor substrate SB. For oblique implantation, ion implantation is carried out from the directions of arrows AL and AR in the figure to the main surface of the semiconductor substrate SB.

Figure 20:
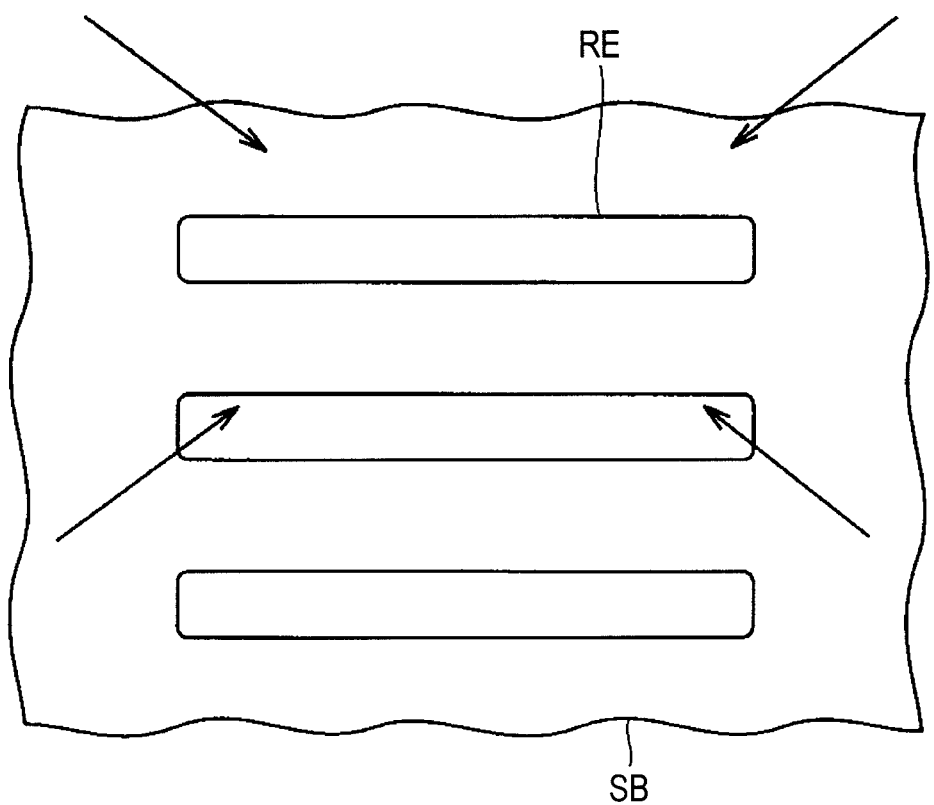
FIG. 20 is a schematic plan view showing ion implantation into the recesses of the method for manufacturing a semiconductor device in Embodiment 1 of the present invention.
Figure 21A:
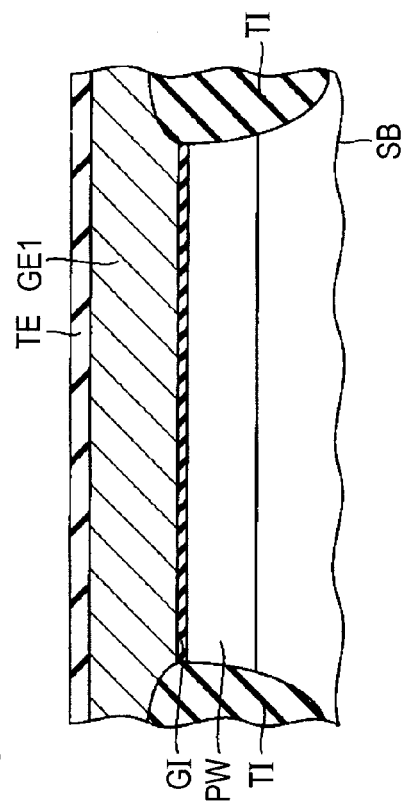
FIGS. 21A to 21D are schematic cross-sectional views showing a sixth step of the method for manufacturing a semiconductor device in Embodiment 1 of the present invention, with the cross-sectional positions corresponding to FIGS. 11A to 11D, respectively.
Figure 21B:
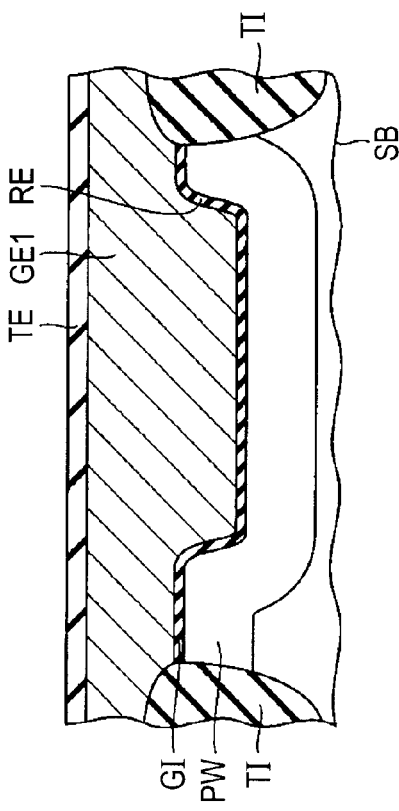
Figure 21C:
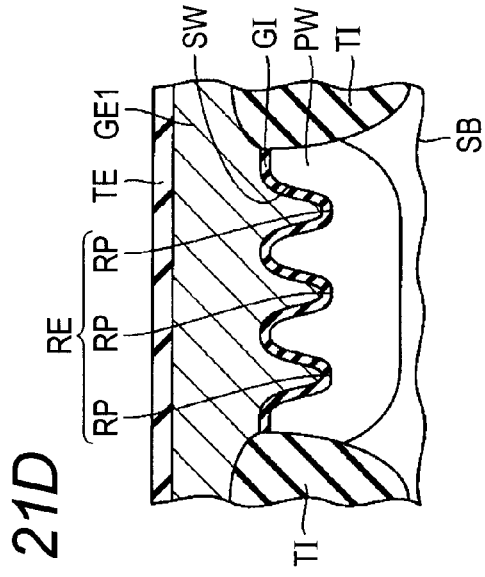
Figure 21D:
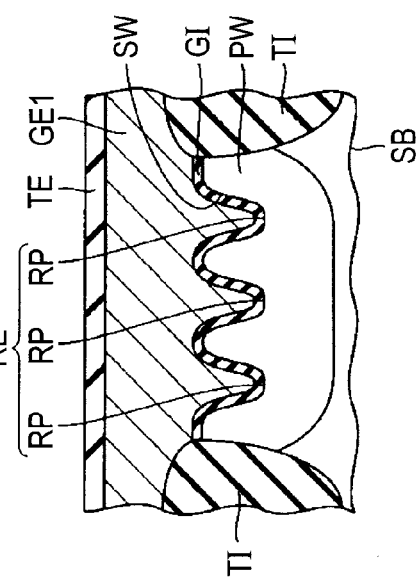
Figure 22:
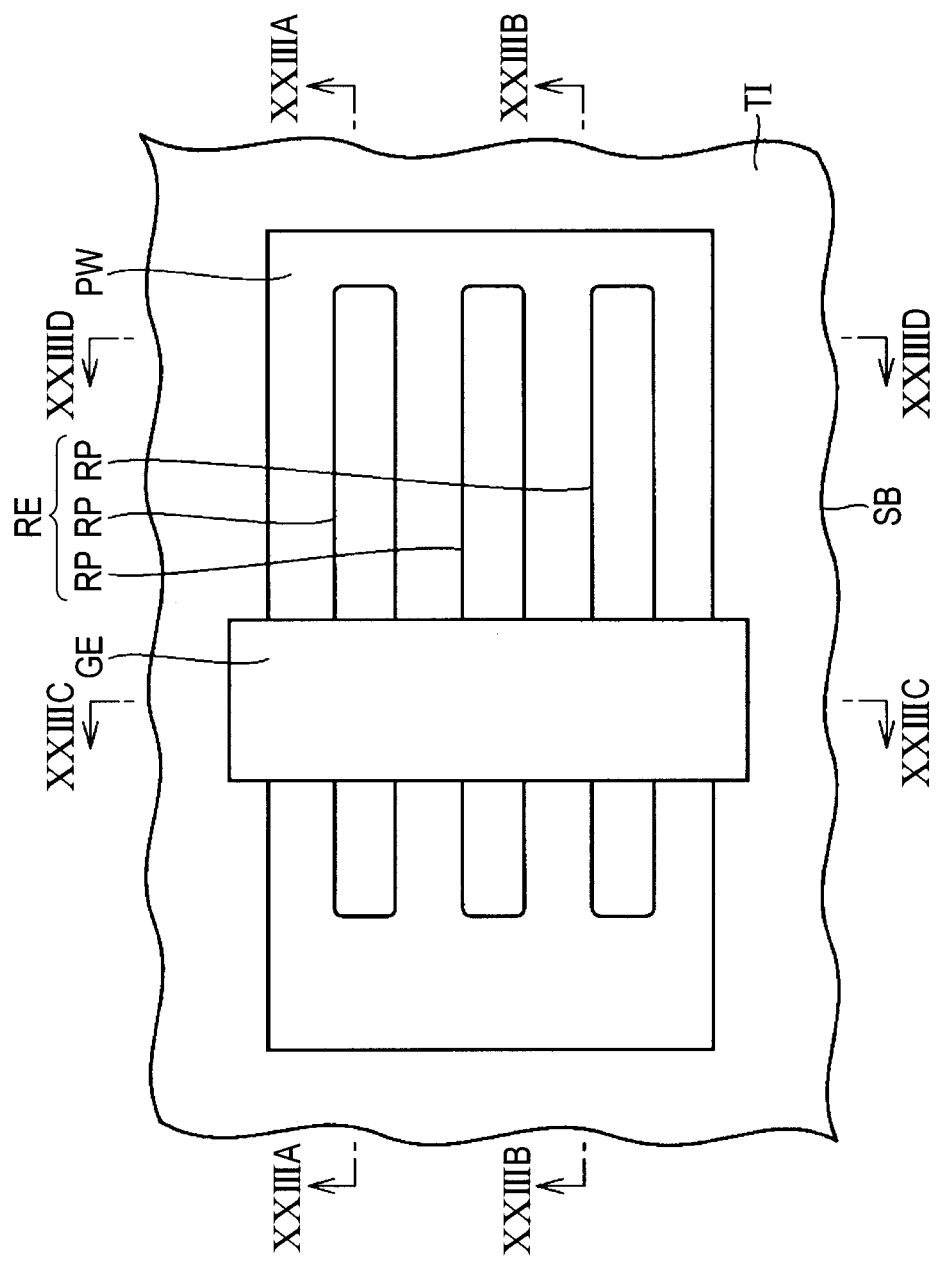
FIG. 22 is a schematic plan view showing a seventh step of the method for manufacturing a semiconductor device in Embodiment 1 of the present invention.
Figure 24A:
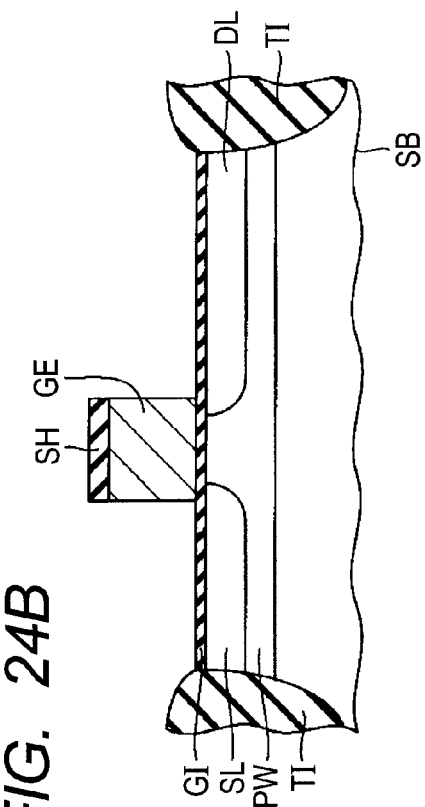
FIGS. 24A to 24D are schematic cross-sectional views showing an eighth step of the method for manufacturing a semiconductor device in Embodiment 1 of the present invention, with the cross-sectional positions corresponding to FIGS. 11A to 11D, respectively.
Figure 24B:
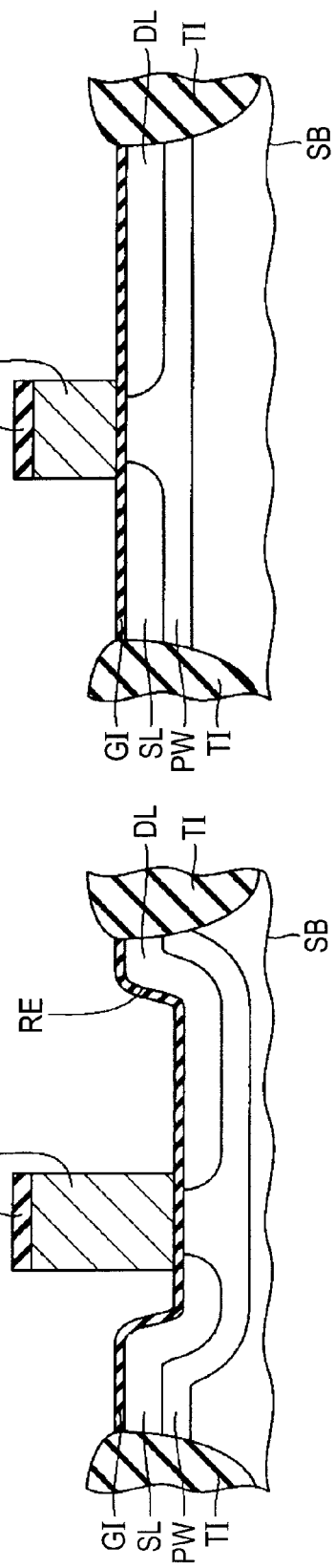
Figure 24C:
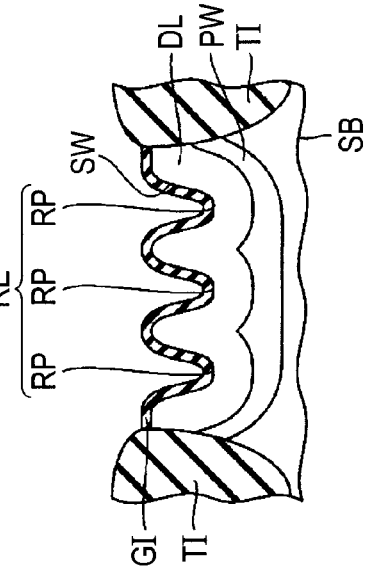
Figure 24D:
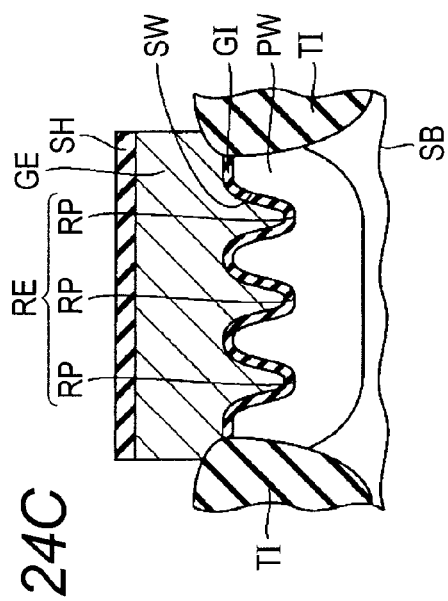
Figure 25:
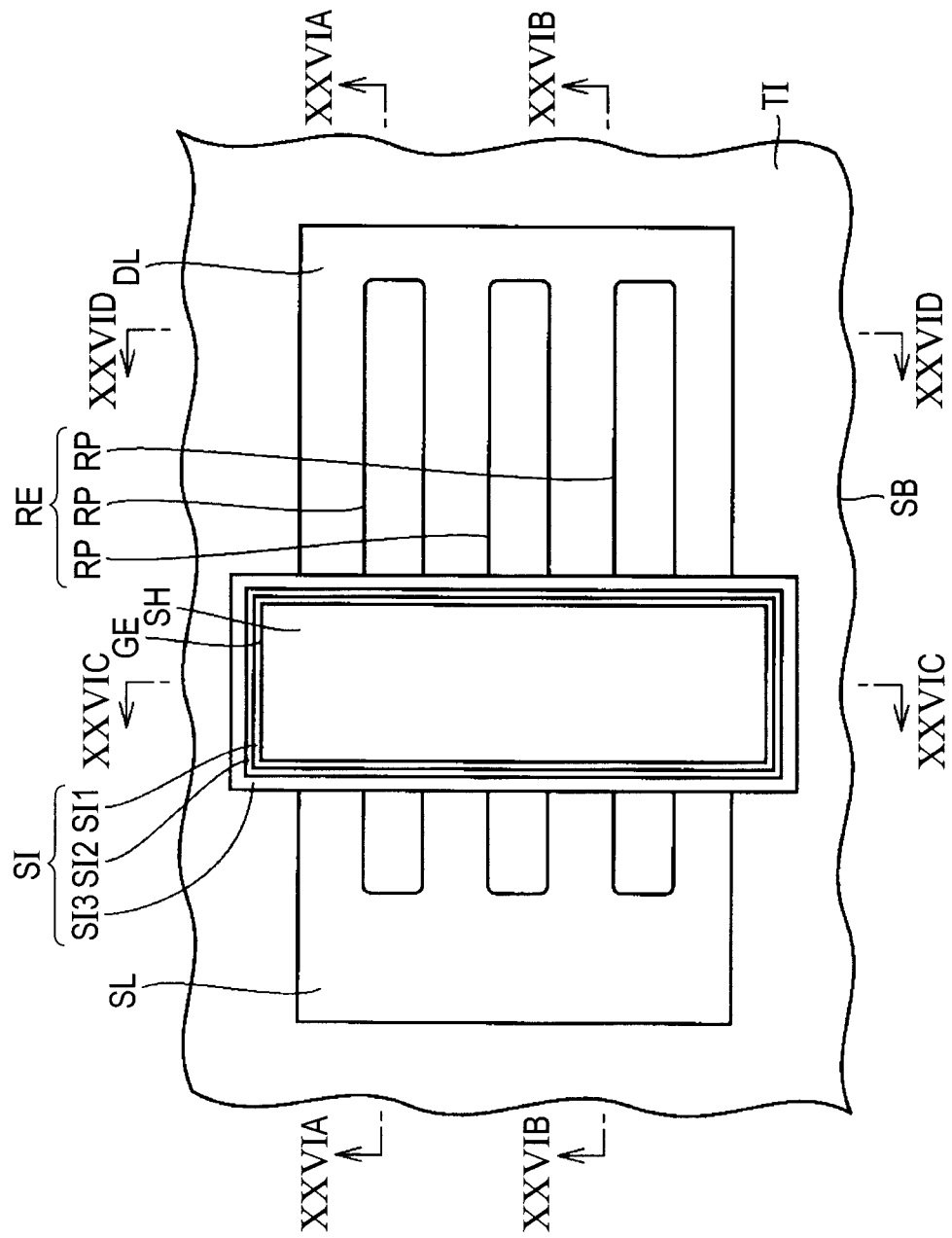
FIG. 25 is a schematic plan view showing a ninth step of the method for manufacturing a semiconductor device in Embodiment 1 of the present invention.
Figure 26A:
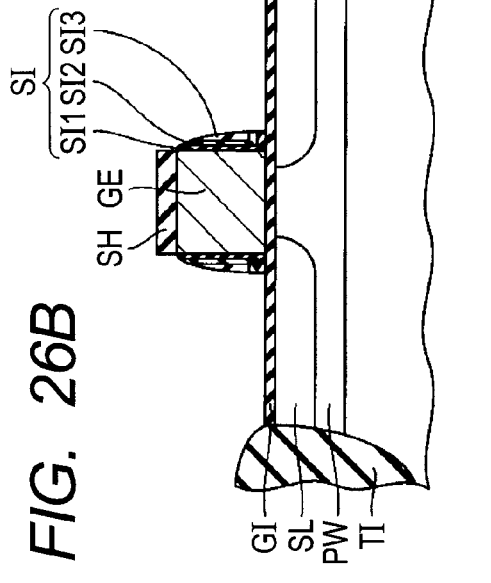
Figure 26B:
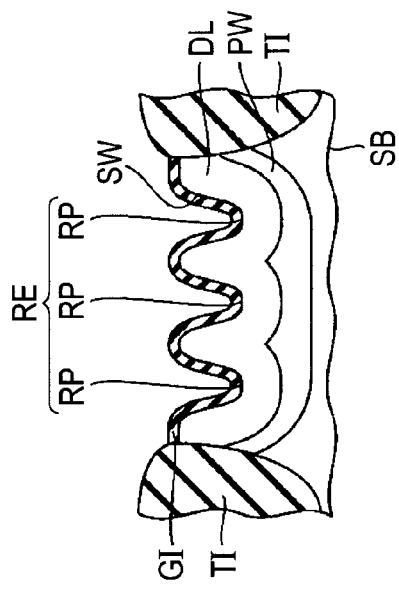
Figure 26C:
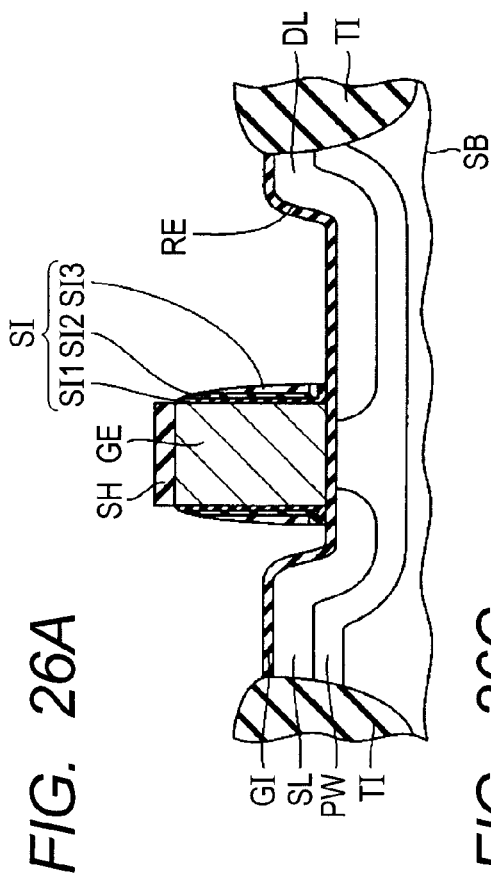
Figure 26D:
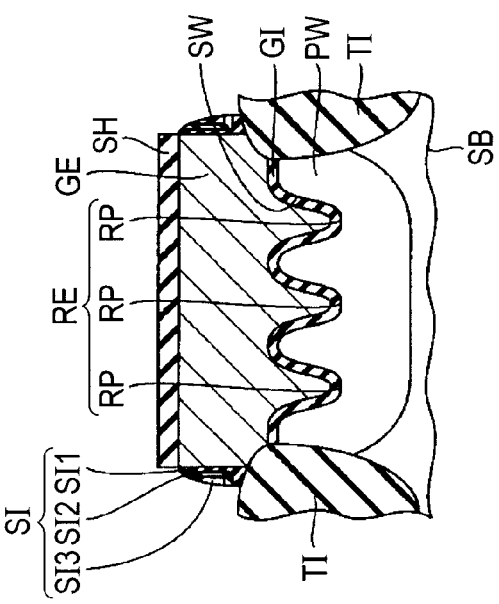
Figure 27:
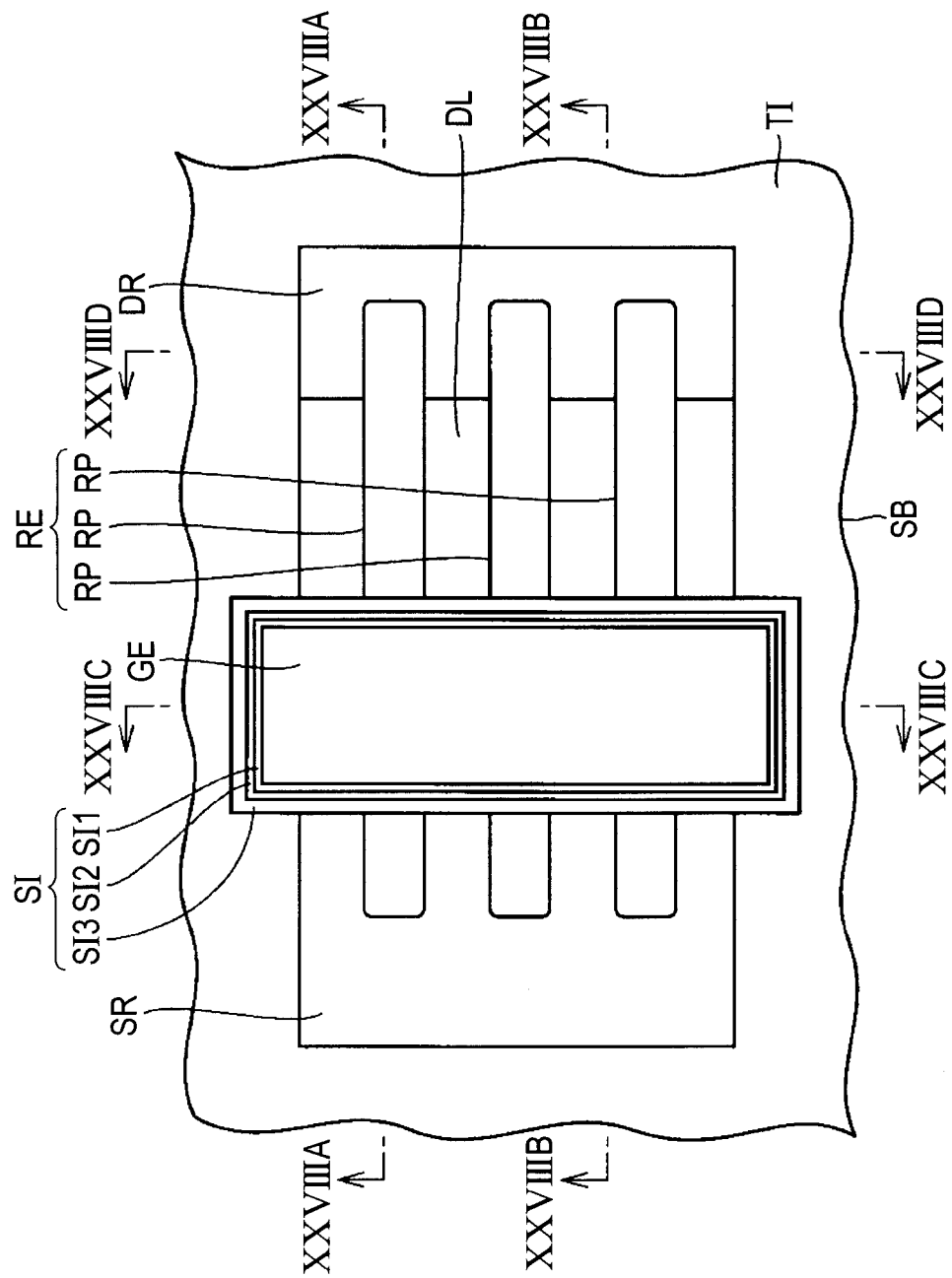
FIG. 27 is a schematic plan view showing a tenth step of the method for manufacturing a semiconductor device in Embodiment 1 of the present invention.
Figure 28A:
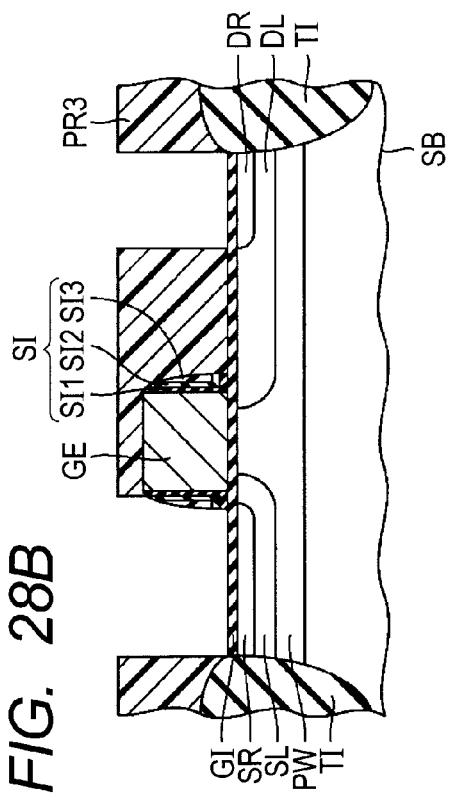
Figure 28B:
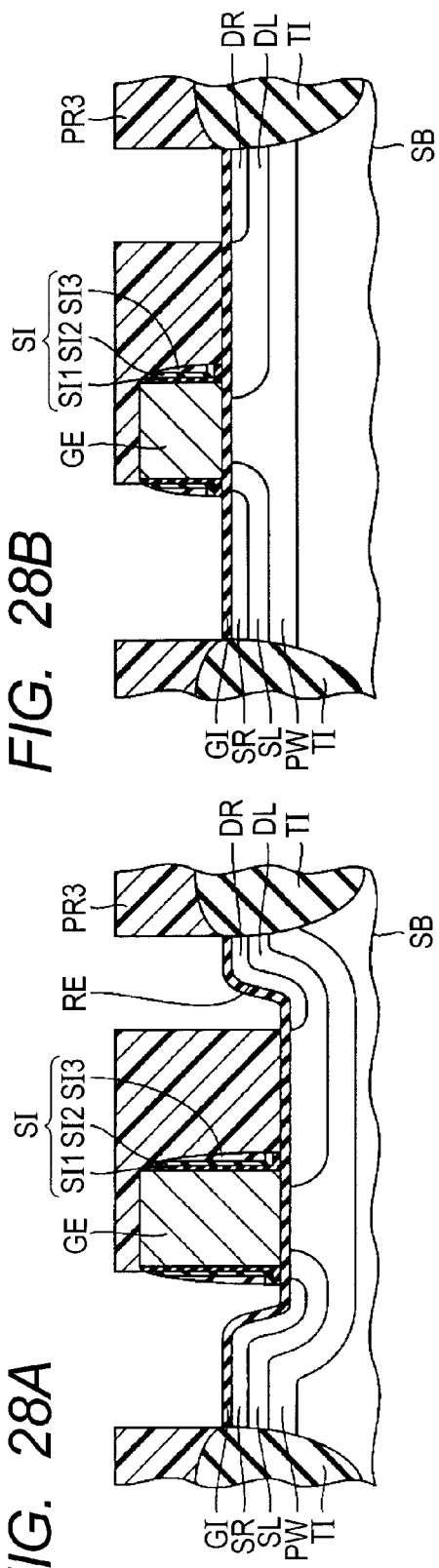
Figure 28C:
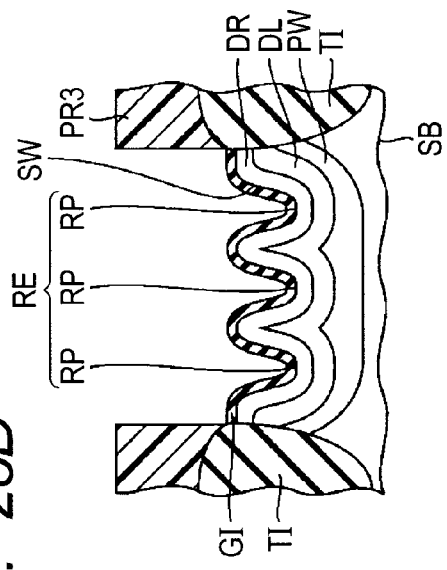
Figure 28D:
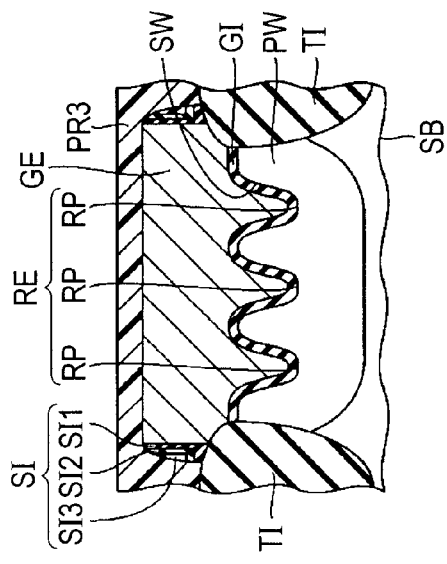

For oblique implantation, ion implantation may be carried out not only from one direction, but also from mutually opposite directions such as the direction of the arrow AL in the figure and the direction of the arrow AR in the figure. Whereas, for rotational implantation, as shown in FIG. 20, in a plane along the main surface of the semiconductor substrate SB, ion implantation may be carried out in a plurality of divided steps in a rotary manner from a plurality of directions. For example, the angle of oblique implantation is set at about 15° to 60° with respect to the main surface of the semiconductor substrate SB. Further, the number of steps of the rotational implantation is set at 1 to 8. As shown in FIG. 20, when ion implantation is carried out in four steps, the angle of oblique implantation is set at 45°. In order to reduce the difference in ion implantation amount between to the bottom wall and the sidewall SW of the recess RE, it is effective to carry out ion implantation two times with vertical implantation and oblique implantation. Then, the shield oxide film SO is removed.

Referring to FIGS. 21A to 21D, over the main surface of the semiconductor substrate SB, the gate insulation film GI is formed. The gate insulation film GI is formed of a silicon oxide film. The film thickness of the gate insulation film GI is determined by the voltage value provided by MOSFET. The gate insulation film GI is formed with a thickness of, for example, about 10 to 50 nm.

Over the gate insulation film GI, there is formed a polysilicon film (below, gate polysilicon film) GE1 to be the gate electrode layer GE. The top surface of the gate polysilicon film GE1 is subjected to CMP (Chemical Mechanical Polishing). This planarizes the step of the top surface of the gate polysilicon film GE1 formed following the shape of the recess RE. Subsequently, the gate polysilicon film GE1 is cleaned with HF (hydrogen fluoride). Then, further, the gate polysilicon film GE1 is formed.

The gate polysilicon film GE1 is formed with a thickness corresponding to the depth of the recess RE formed in the main surface of the semiconductor substrate SB. In other words, the gate polysilicon film GE1 deposited in the recess RE is formed with a thickness such that the top surface thereof is sufficiently higher than the main surface of the semiconductor substrate SB. The gate polysilicon film GE1 is formed with a thickness of, for example, about 500 to 1000 nm. Subsequently, over the gate polysilicon film GE1, a TEOS (Tetraethoxysilane) film TE is formed.

Referring to FIGS. 22, and 23A to 23D, over the TEOS film TE, a polysilicon film not shown is formed. By general lithography, the polysilicon film is etched, and patterned. With the patterned polysilicon film as a mask, the TEOS film TE is etched and patterned. Then, the polysilicon film is removed. With the patterned TEOS film TE as a mask, the gate polysilicon film GE1 is anisotropically etched. Then, the TEOS film TE is removed. This results in formation of the gate electrode layer GE as shown in FIGS. 22, and 23A to 23D.

Referring to FIGS. 24A to 24D, over the gate electrode layer GE and the gate insulation film GI, a shield HTO (High Temperature Oxide) film SH is formed. By general lithography, the shield HTO film SH is etched and patterned so as to leave a portion of the shield HTO film SH over the gate electrode layer GE. Then, with the shield HTO film SH and the gate electrode layer GE as a mask, in the p type well region PW, a LDD layer is formed by ion implantation. Into the LDD layer, for example, P (phosphorus) is ion-implanted. This results in formation of the source-side low-concentration region SL and the drain-side low-concentration region DL.

By combining vertical implantation, oblique implantation, and the like, in the source-side low-concentration region SL and the drain-side low-concentration region DL, ion implantation is carried out so as to equalize the ion implantation amounts in the main surface of the semiconductor substrate SB, the sidewall SW of the recess RE, and the bottom wall of the recess RE. Incidentally, in the case of the n type well region, into the LDD layer, for example, B (phosphorus) is ion-implanted. This results in formation of the source-side low-concentration region SL and the drain-side low-concentration region DL.

Referring to FIGS. 25, and 26A to 26D, over the sidewall of the gate electrode layer GE, the sidewall insulation film SI is formed. The sidewall insulation film SI is first stacked over the gate insulation film GI and the shield HTO film SH in the order of, for example, a TEOS film ($SiO_2$) SI1, a silicon nitride film (SiN) SI2, and a TEOS film ($SiO_2$) SI3. Then, the top-layer TEOS film ($SiO_2$) SI1 is anisotropically etched.

Subsequently, the silicon nitride film (SiN) SI2 is isotropically etched by dry or wet etching. Subsequently, the bottom-layer TEOS film ($SiO_2$) SI3 is isotropically etched by dry or wet etching. Thus, over the sidewall of the gate electrode layer GE, the sidewall insulation film SI is formed.

Referring to FIGS. 27, and 28A to 28D, by general lithography, over the gate insulation film GI, the gate electrode layer GE, and the sidewall insulation film SI, a photoresist pattern PR3 is formed. With the photoresist pattern PR3 as a mask, in the source-side low-concentration region SL and the drain-side low-concentration region DL, the source region SR and the drain region DR are formed. Into the source region SR and the drain region DR, for example, As (arsenic) is ion-implanted. By combining the vertical implantation, oblique implantation, and the like, in the source region SR and the drain region DR, ion implantation is carried out so as to equalize the ion implantation amounts in the main surface of the semiconductor substrate SB, the sidewall SW of the recess RE, and the bottom wall of the recess RE. Subsequently, the source region SR and the drain region DR are annealed.

Incidentally, in the case of the n type well region, into the source region SR and the drain region DR, for example, $BF_2$ (boron difluoride) is ion-implanted. Subsequently, the source region SR and the drain region DR are annealed.

Then, over the gate insulation film GI, the gate electrode layer GE, and the sidewall insulation film SI, the interlayer insulation film II (FIG. 2A) is formed. By general lithography, the interlayer insulation film II is etched. In the etched portions of the interlayer insulation film II, the source-side conductive layer CL1 and the drain-side conductive layer CL2 (FIG. 2A) are formed in an embedded manner. Subsequently, over the interlayer insulation film II, the source-side conductive layer CL1, and the drain-side conductive layer CL2, a wiring layer is formed. Then, by general lithography, the wiring layer is etched and patterned. This results in formation of the first conductive layer PL1 and the second conductive layer PL2. Subsequently, hydrogen sintering is carried out. This results in formation of a CMOS including an n type MOSFET of the present embodiment (FIG. 1).

Figure 30:
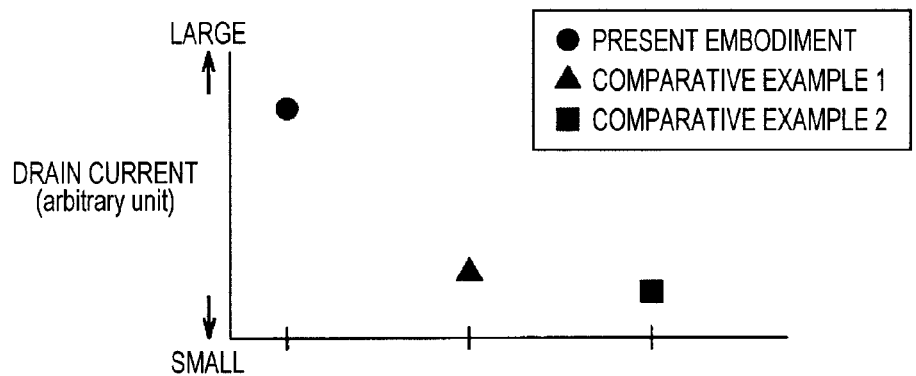
FIG. 30 is a view showing drain currents in configurations of the semiconductor devices of Comparative Examples 1 and 2 in the present embodiment.

Then, the operational effects of the present embodiment will be described. First, a description will be given to the operational effect for the semiconductor device of the present embodiment to be able to increase in drain current. In order to study the effects of the increase in drain current in the semiconductor device of the present embodiment, a study was conducted on the configuration of the semiconductor device of FIG. 1 as the present embodiment, the configuration of the semiconductor device of FIG. 29A as Comparative Example 1, and the configuration of the semiconductor device of FIG. 29B as Comparative Example 2. These results are shown in FIG. 30.

Incidentally, for the study, as one example of the conditions, the drain currents when the drain voltages Vd=5 V and Vd=0.5 V were measured. The pitch of the recess RE of each semiconductor device of the present embodiment, Comparative Example 1, and Comparative Example 2 was set at 0.7 μm (L (line)/S (space)=0.35/0.35. The depth of the recess RE was set at 0.35 μm.

Referring to FIG. 29A, with the configuration of the semiconductor device of Comparative Example 1, the recess RE is not formed in the source region SR. Accordingly, the recess RE is not formed in the contact region CR1 (FIG. 2A) between the first conductive layer PL1 and the source region SR.

Referring to FIG. 29B, with the configuration of the semiconductor device of Comparative Example 2, the recess RE is not formed in either of the source region SR and the drain region DR. Accordingly, the recess RE is not formed in the contact region CR1 (FIG. 2A) between the first conductive layer PL1 and the source region SR, and the contact region CR2 (FIG. 2A) between the second conductive layer PL2 and the drain region DR.

As shown in FIG. 30, with the configuration of the semiconductor device of the present embodiment, the drain current is larger than that of each semiconductor device of Comparative Example 1 and Comparative Example 2.

With the configuration of the semiconductor device of Comparative Example 1 shown in FIG. 29A, the recess RE is not formed in the source region SR. Therefore, the coupling part between the first conductive layer PL1 and the source region SR is flat. Accordingly, the coupling area between the first conductive layer PL1 and the source region SR is small. For this reason, with this configuration, the area for the path of drain current is small. Accordingly, the increase in drain current is limited by the region including no recess RE formed therein.

With the configuration of the semiconductor device of Comparative Example 2 shown in FIG. 29B, the recess RE is not formed either of the source region SR and the drain region DR. Therefore, both of the coupling part between the first conductive layer PL1 and the source region SR, and the coupling part between the second conductive layer PL2 and the drain region DR are flat. Accordingly, the coupling area between the first conductive layer PL1 and the source region SR and the coupling area between the second conductive layer PL2 and the drain region DR are both small. For this reason, with this configuration, the area of the path for drain current is further smaller. Accordingly, the increase in drain current is further limited by the region including no recess RE formed therein.

In contrast, in accordance with the semiconductor device of the present embodiment, the recess RE is formed in the main surface in such a manner as to extend from the contact region CR1 between the first conductive layer PL1 and the source region SR through a part underlying the gate electrode layer GE to the contact region CR2 between the second conductive layer PL2 and the drain region DR. Accordingly, in addition to the bottom wall of the recess RE, the sidewall SW serves as the path for drain current between the source region SR and the drain region DR. Therefore, the drain current can be increased. For this reason, it is possible to obtain an effective channel width by the recess RE even when the device size of the MOSFET is reduced. As a result, it is possible to miniaturize the semiconductor device without deteriorating the characteristics.

Further, in accordance with the semiconductor device of the present embodiment, the first conductive layer PL1 and the second conductive layer PL2 may be respectively in contact with the sidewall SW of the recess RE. As a result, the sidewall SW of the recess RE can surely serve as the path for drain current.

Alternatively, the semiconductor device of the present embodiment may be formed to further include: a drain-side low-concentration region DL formed in such a manner as to cover the periphery of the drain region DR, having a lower impurity concentration than that of the drain region DR, and being of the same conductivity type as that of the drain region DR, and a source-side low-concentration region SL formed in such a manner as to cover the periphery of the source region SR, having a lower impurity concentration than that of the source region SR, and being of the same conductivity type as that of the source region SR, wherein the recess RE is formed in such a manner as to pass through the drain-side low-concentration region DL and the source-side low-concentration region SL. As a result, a LDD structure can be adopted.

Still alternatively, in accordance with the semiconductor device of the present embodiment, the recess RE includes a plurality of recess parts RP, and a plurality of the recess parts RP run in parallel to one another. As a result, it is possible to increase the sidewall SW of the recess RE. Therefore, a drain current can be increased.

Then, a description will be given to the operational effects for the method for manufacturing a semiconductor device of the present embodiment to allow uniformalization of the impurity concentration of the recess RE formed in the main surface of the semiconductor substrate SB.

Figure 31:
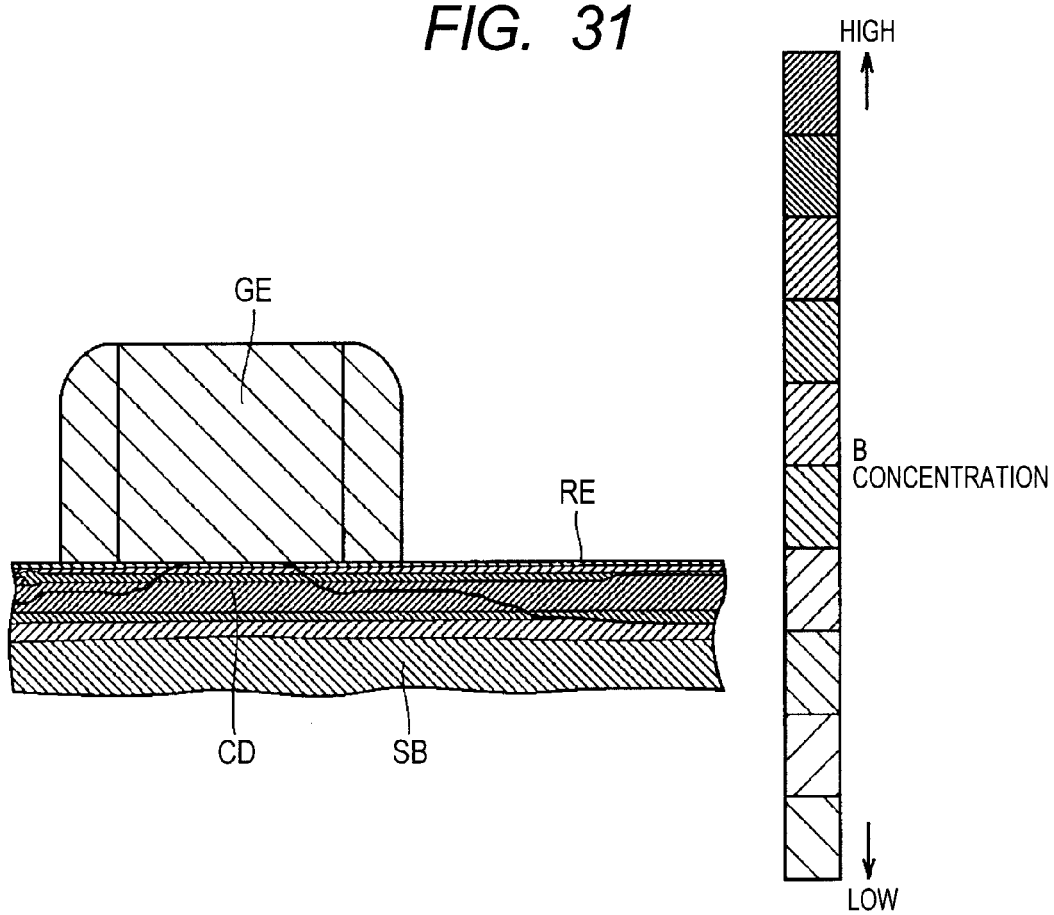
FIG. 31 is a view showing the distribution of the B concentration of Comparative Example 3, with the position being a position corresponding to FIG. 3.
Figure 32:
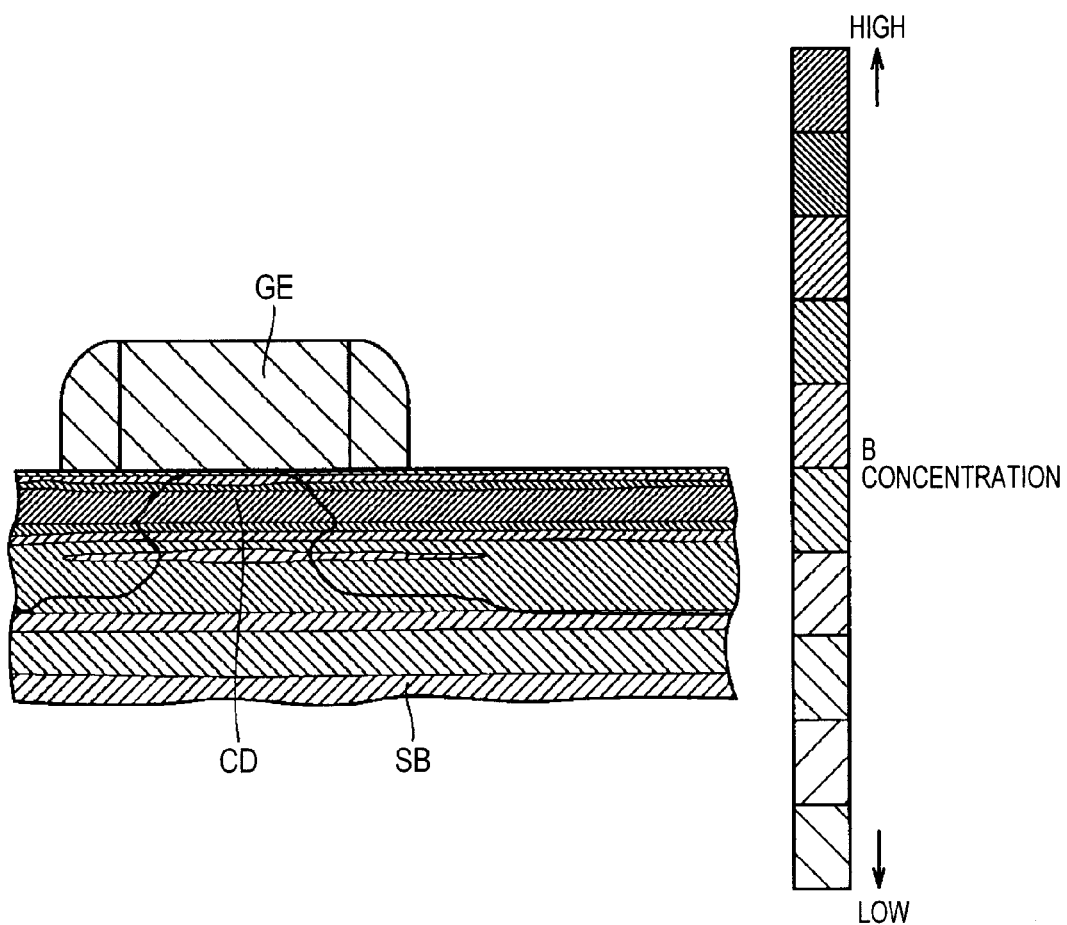
FIG. 32 is a view showing the distribution of the B concentration of Comparative Example 3, with the position being a position corresponding to FIG. 4.
Figure 33:
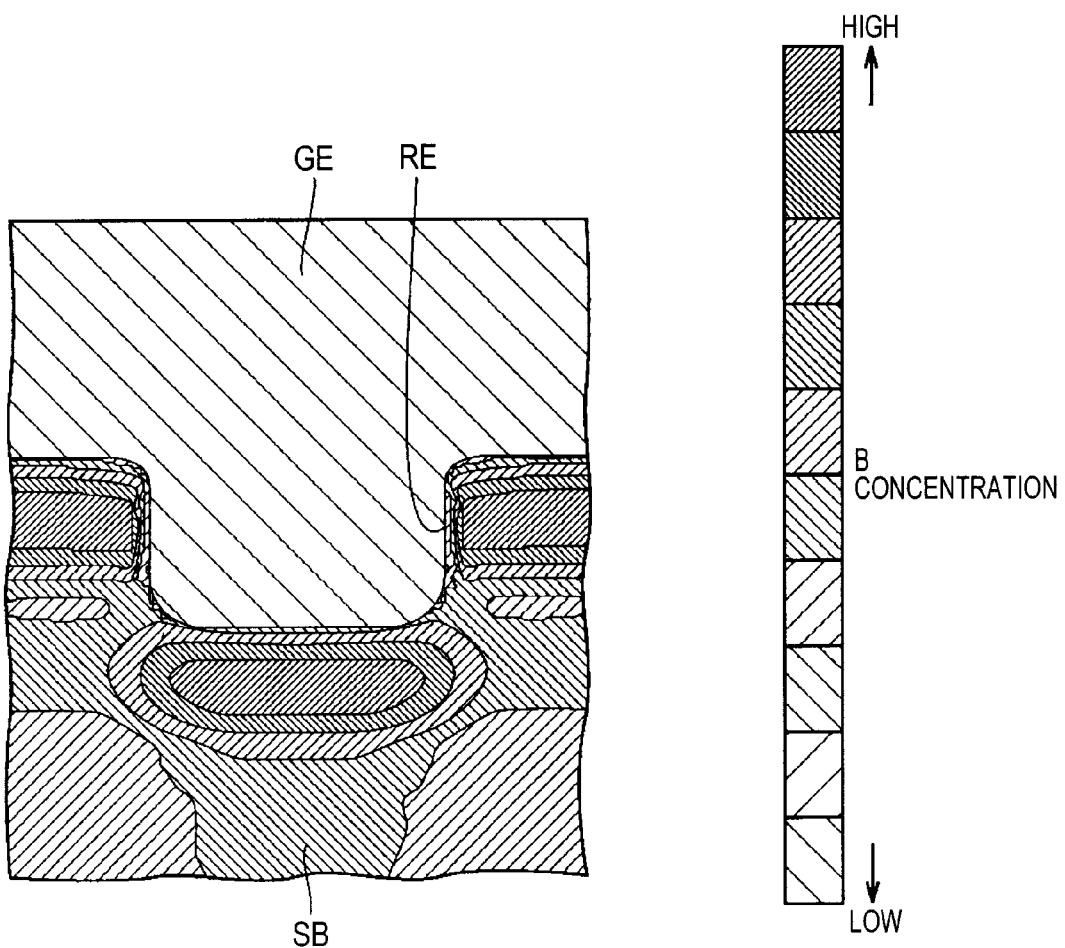
FIG. 33 is a view showing the distribution of the B concentration of Comparative Example 3, with the position being a position corresponding to FIG. 5.

The B (boron) of Comparative Example 3 shown in FIGS. 31 to 33 is ion-implanted at, for example, an accelerating voltage of 50 keV, an angle of 7 degrees, a concentration of $2\times10^{12}/cm^2$, and a frequency of 4 times. In Comparative Example 3, there is shown the case where the angle is set at 7 degrees, so that B (boron) is not sufficiently ion-implanted into the corner parts of the recess RE.

Referring to FIGS. 31 and 32, the distribution of the B concentration of Comparative Example 3 shows the same tendency in the main surface of the semiconductor substrate SB as compared with the distribution of the B concentration of the present embodiment shown in FIGS. 3 and 4. Referring to FIG. 33, the distribution of the B concentration of Comparative Example 3 is not made uniform in the recess RE. Specifically, the distribution of the B concentration of Comparative Example 3 differs at the corner parts coupling the bottom wall and the sidewall SW of the recess RE as compared with the distribution of the B concentration of the present embodiment shown in FIG. 5. The angle of ion implantation is close to the vertical angle, and hence B (boron) is not sufficiently implanted into the corner parts. For this reason, at the corner part, the B concentration of Comparative Example 3 is lower than the B concentration of the present embodiment.

With the method for manufacturing a semiconductor device of the present embodiment, by combining vertical implantation, oblique implantation, and the like, impurities are ion-implanted. For this reason, impurities can be ion-implanted according to the shapes of the bottom surface, the corner parts, the side surface, and the like of the recess RE. This can equalize the concentrations of impurities such as B (boron) in the recess RE. Thus, the impurity concentration can be made uniform. Therefore, ion implantation can be carried out with a high concentration uniformly throughout the bottom surface, corner parts, and side surfaces of the recess RE.

Embodiment 2

The semiconductor device of Embodiment 2 of the present invention is mainly different in configuration of the recess as compared with the semiconductor device of Embodiment 1.

Figure 34:
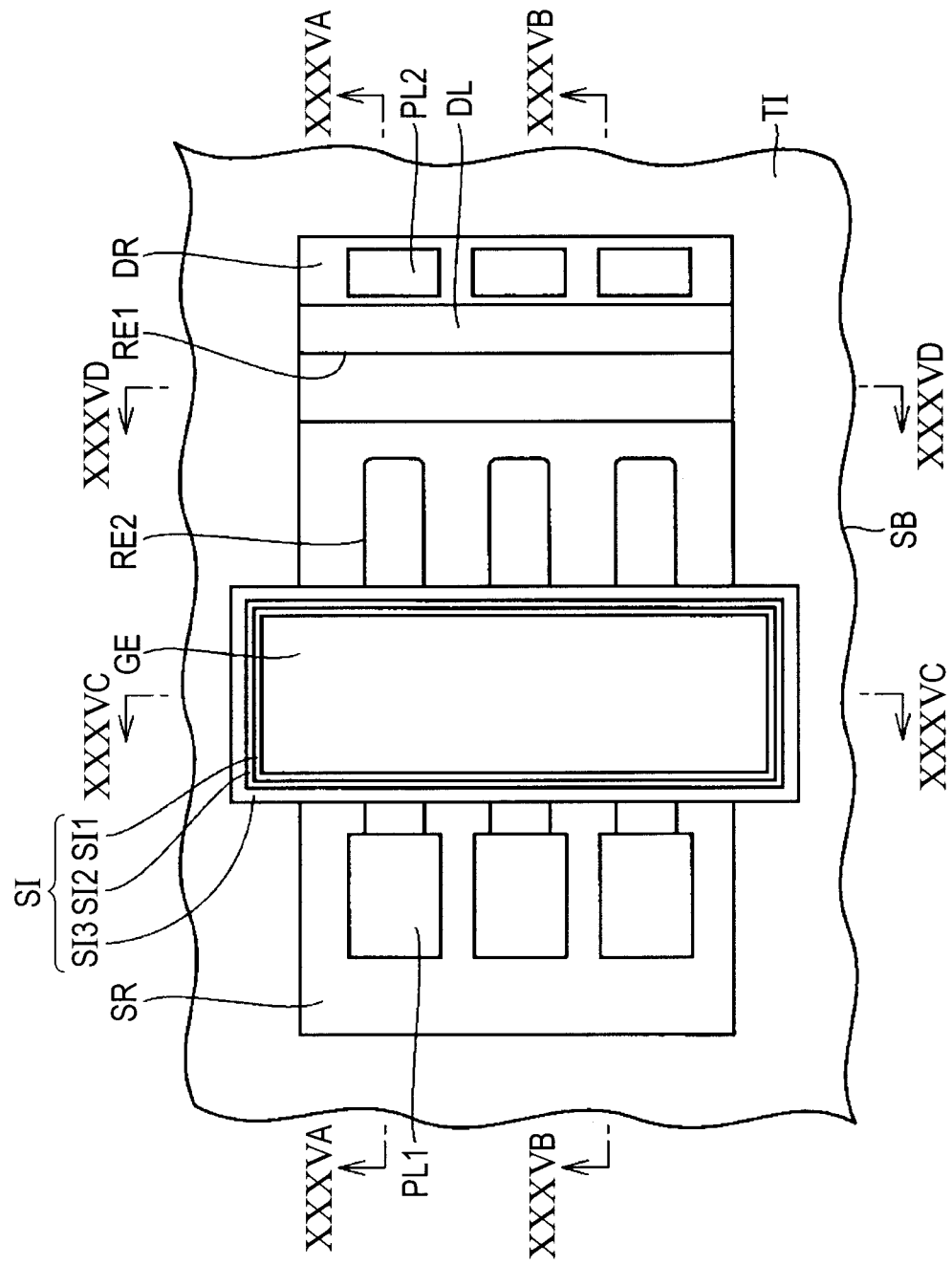
FIG. 34 is a schematic plan view of a semiconductor device in Embodiment 2 of the present invention.

Referring to FIG. 34, the semiconductor device in the present embodiment includes a semiconductor substrate SB having a main surface, and a MOSFET formed over the semiconductor substrate SB.

Figure 35:
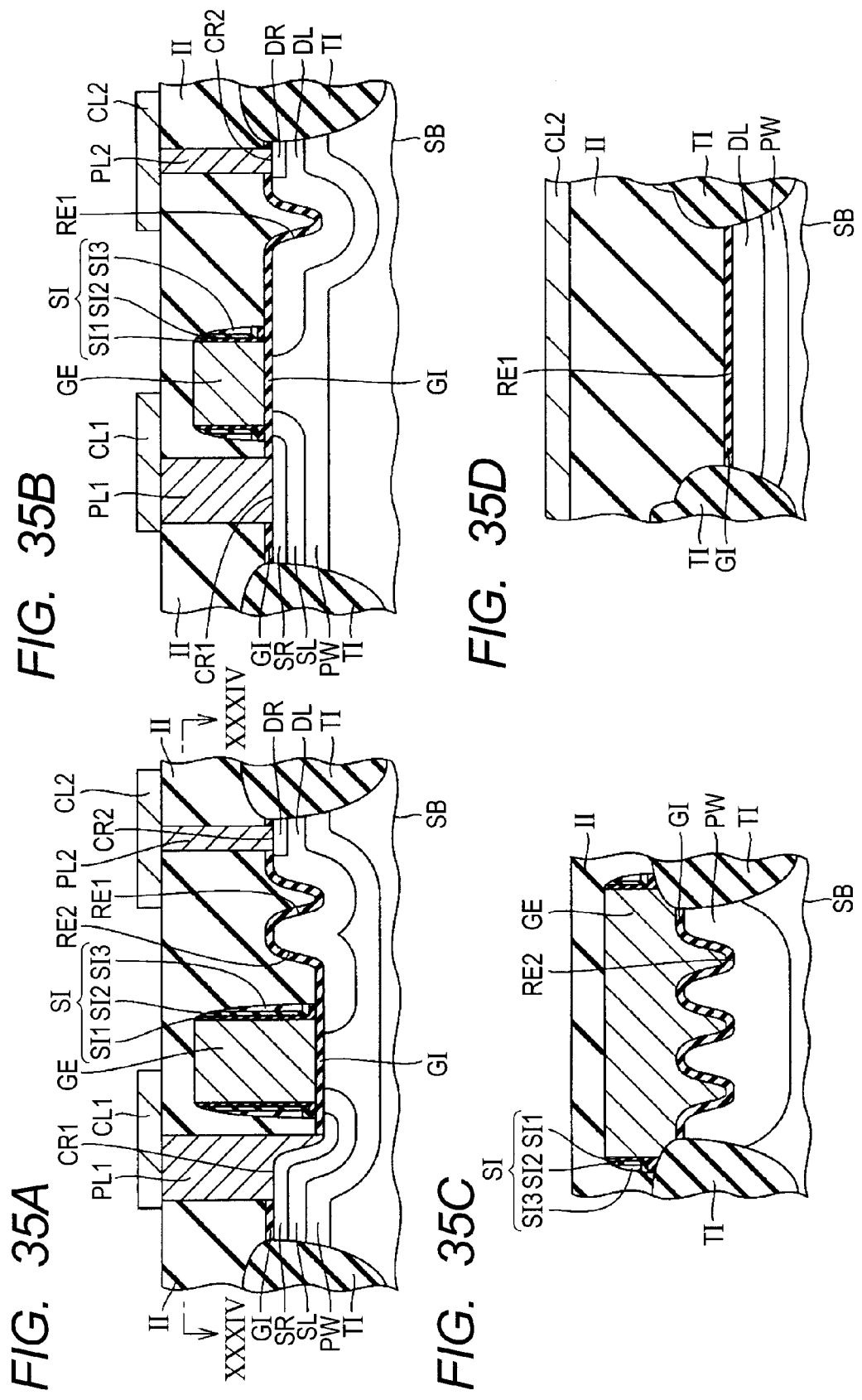
Figure 36:
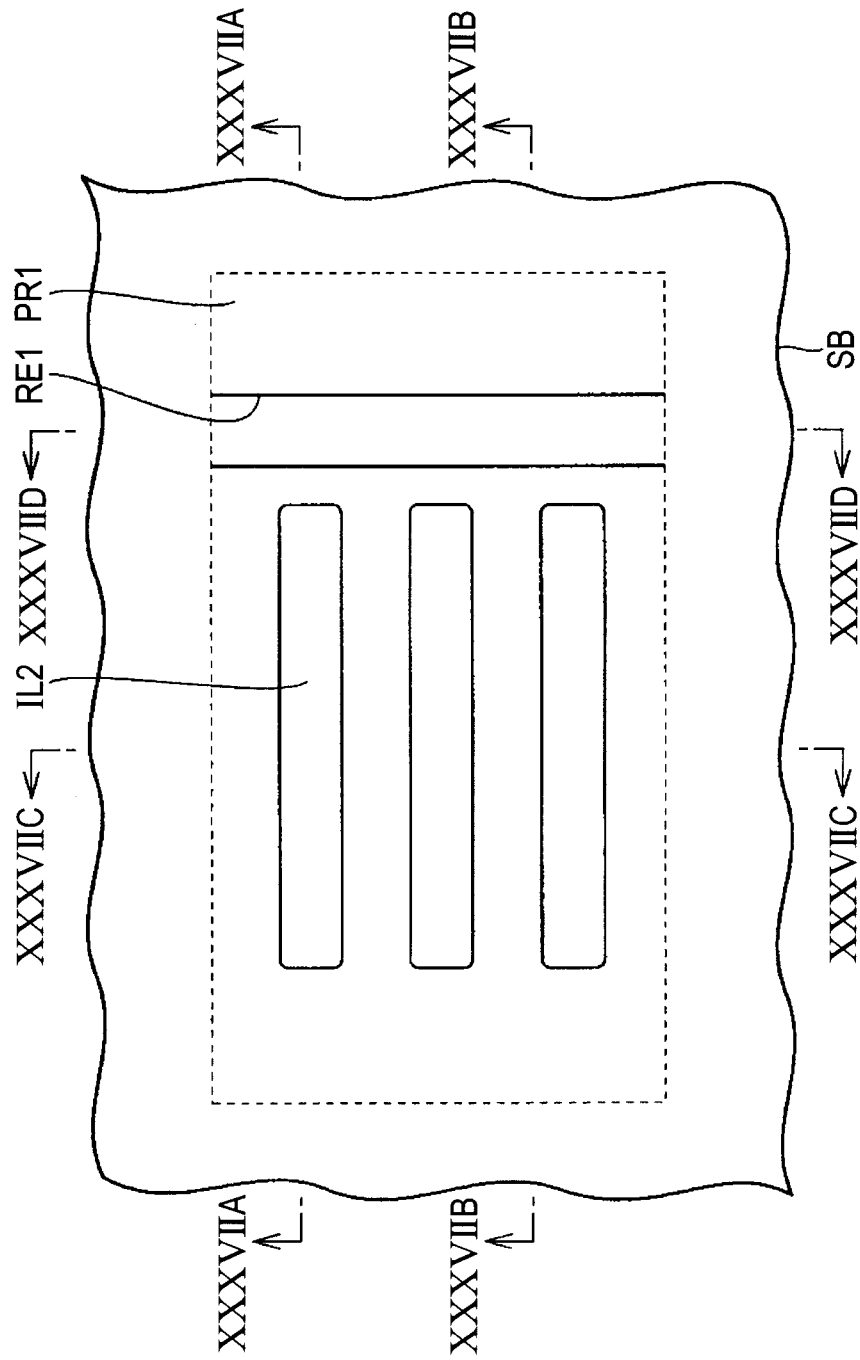
FIG. 36 is a schematic plan view showing a first step of a method for manufacturing a semiconductor device in Embodiment 2 of the present invention.
Figure 37A:
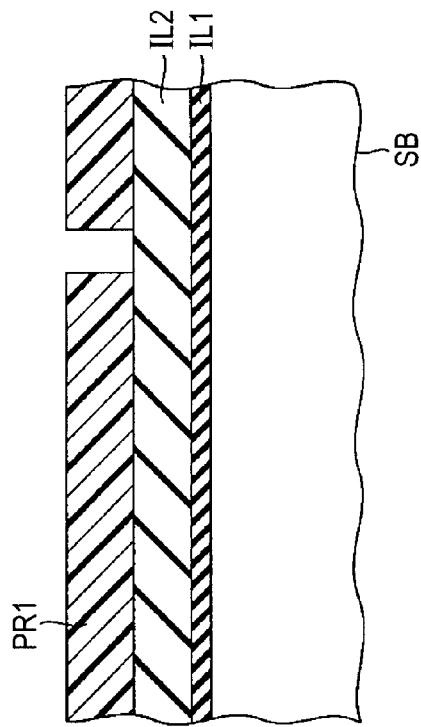
Figure 37B:
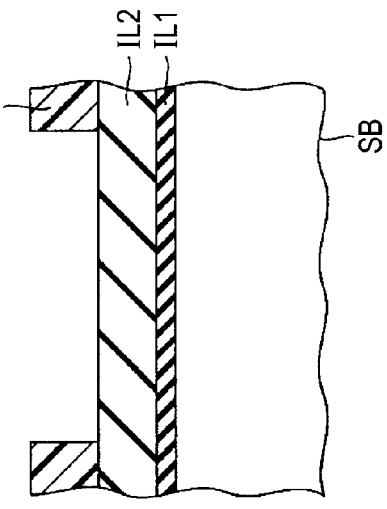
Figure 37C:
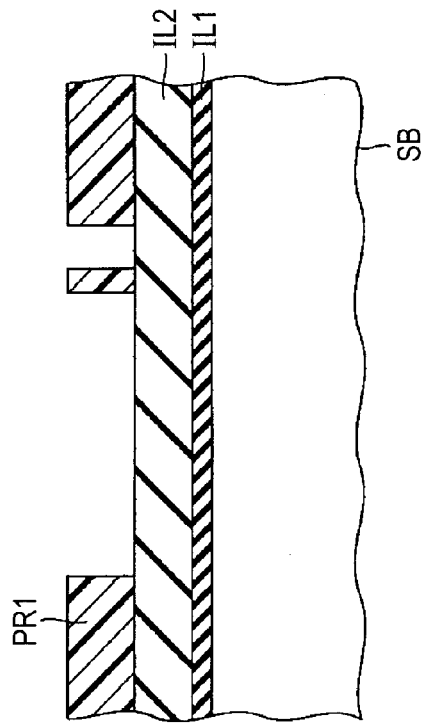
Figure 37D:
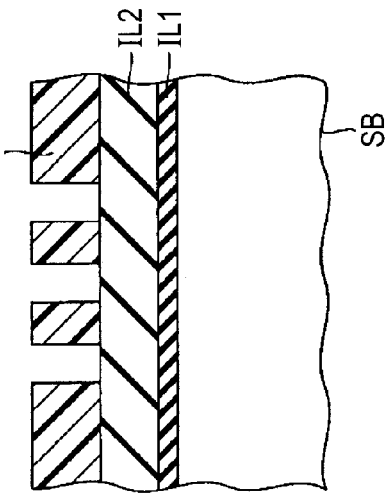
Figure 38A:
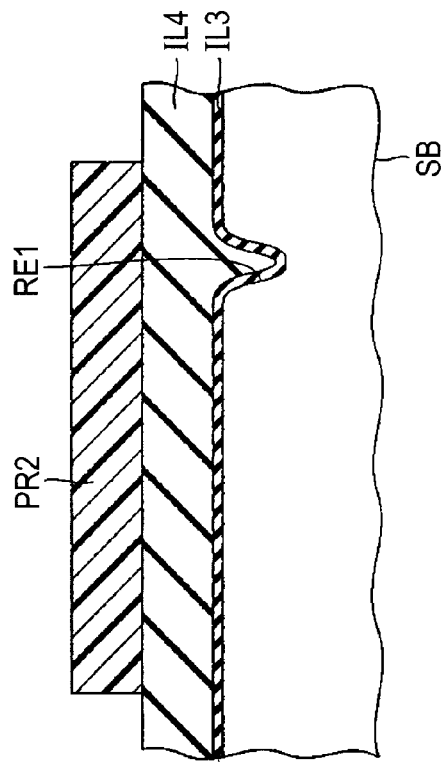
FIGS. 38A to 38D are schematic cross-sectional views showing a third step of the method for manufacturing a semiconductor device in Embodiment 2 of the present invention, with the cross-sectional positions corresponding to FIGS. 37A to 37D, respectively.
Figure 38B:
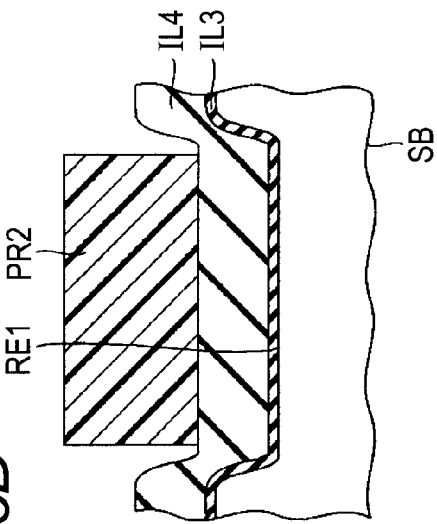
Figure 38C:
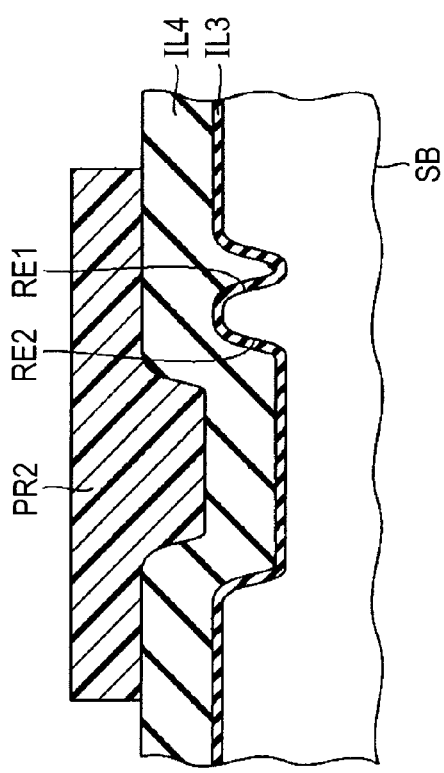
Figure 38D:
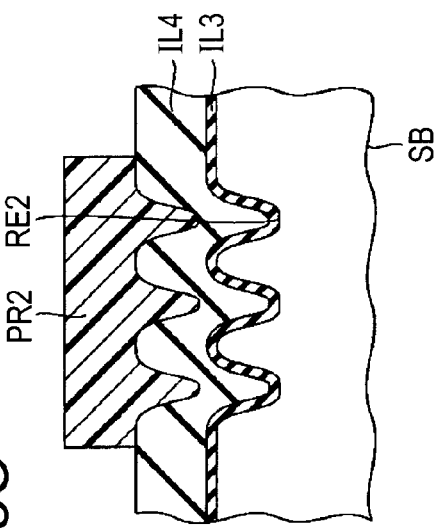
Figure 39B:
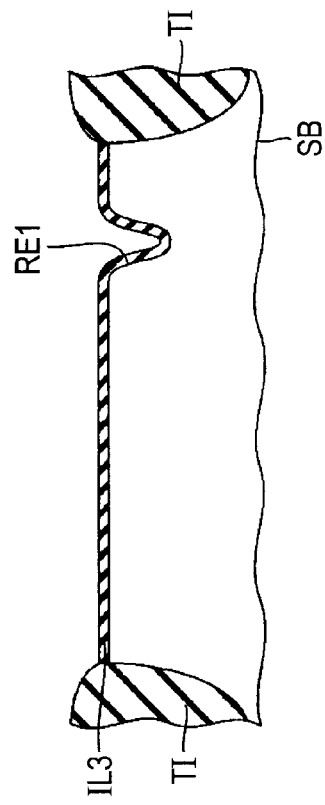
FIGS. 39A to 39D are schematic cross-sectional views showing a fourth step of the method for manufacturing a semiconductor device in Embodiment 2 of the present invention, with the cross-sectional positions corresponding to FIGS. 37A to 37D, respectively.
Figure 39D:
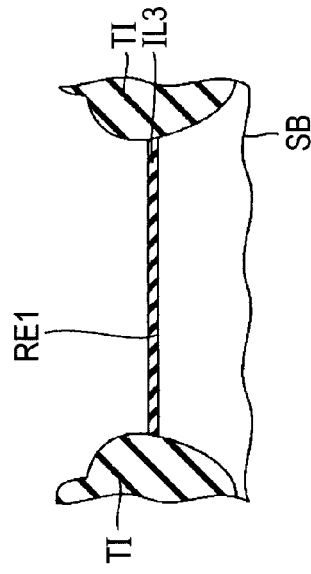
Figure 39A:
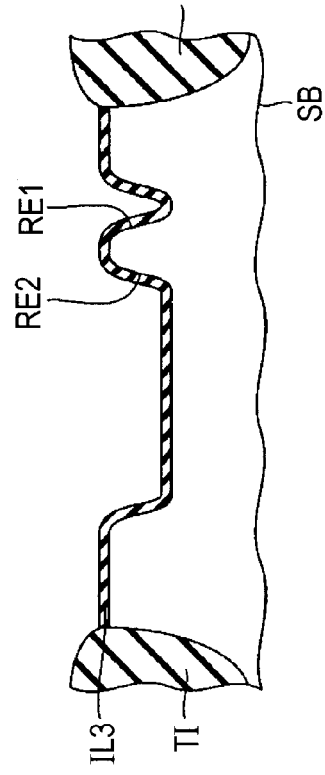
Figure 39C:
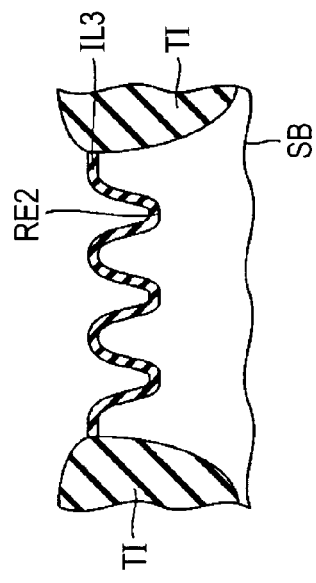

Referring to FIGS. 34, and 35A and 35B, in the main surface of the semiconductor substrate SB, in the region isolated by the element isolation film TI, a MOSFET is formed. Incidentally, FIG. 34 is a plan view along line XXXIV-XXXIV of FIG. 35. In FIG. 34, the source-side conductive layer CL1, the drain-side conductive layer CL2, the interlayer insulation film II, and the gate insulation film GI are not shown for ease of viewing. Below, as one example of the present embodiment, a description will be given to an n type MOSFET having a LDD structure.

The n type MOSFET having a LDD structure mainly has a pair of n type low-concentration regions to be a source-side low-concentration region SL and a drain-side low-concentration region DL, a pair of n type high-concentration regions to be a source region SR and a drain region DR, a gate electrode layer GE, a gate insulation film GI, a first recess RE1, and a second recess RE2.

The source region SR and the drain region DR are formed apart from each other in the main surface of the semiconductor substrate SB in the p type well region PW. The source-side low-concentration region SL is formed in such a manner as to cover the periphery of the source region SR. The drain-side low-concentration region DL is formed in such a manner as to cover the periphery of the drain region DR. The source-side low-concentration region SL and the drain-side low-concentration region DL form a LDD layer having an n type impurity region. The gate electrode layer GE is formed over the main surface of the semiconductor substrate SB sandwiched between the source region SR and the drain region DR.

Referring to FIGS. 34, and 35A, 35B, and 35D, in the main surface of the semiconductor substrate SB, the first recess RE1 is formed. The first recess RE1 is formed in such a manner as to cross the direction in which the source region SR and the drain region DR are opposed each other. The first recess RE1 extends long, for example, in the channel width direction of the MOSFET. The first recess RE1 is disposed in plan view between the gate electrode layer GE and the drain region DR.

Referring to FIGS. 34, and 35A to 35C, in the main surface of the semiconductor substrate SB, the second recess RE2 may be formed. The second recess RE2 is formed to be sandwiched between the source region SR and the drain region DR so as to extend long in the direction in which the source region SR and the drain region DR are opposed to each other (e.g., the channel length direction). The second recess RE2 may be formed in a ripple shape in the channel width direction of the n type MOSFET. The first recess RE1 is formed in plan view between the gate electrode layer GE and the drain region DR. The second recess RE2 is formed between the first recess RE1 and the source region SR. For this reason, the second recess RE2 is not formed in the drain region DR.

Incidentally, other configurations of the present embodiment are the same as the configurations of Embodiment 1. Therefore, the same elements are given the same reference numerals and signs, and a description thereon will not be repeated.

Then, a description will be given to a method for manufacturing a semiconductor device of the present embodiment. Referring to FIGS. 36, and 37A to 37D, a silicon oxide film IL1 is formed. Over the silicon oxide film IL1, a silicon nitride film IL2 is formed. By general photography, over the silicon nitride film IL2, a photoresist pattern PR1 is formed.

With the photoresist pattern PR1 as a mask, the silicon oxide film IL1 and the silicon nitride film IL2 are etched and patterned. With the patterned silicon oxide film IL1 and silicon nitride film IL2 as a mask, anisotropic etching is performed. As a result, in the main surface of the semiconductor substrate SB, trenches to be the first recess RE1 and the second recess RE2 are formed. Then, with the same method as that of Embodiment 1 described by reference to FIGS. 12 to 16, the first recess RE1 and the second recess RE2 are formed.

Then, referring to FIGS. 38A to 38D, over the main surface of the semiconductor substrate SB including the first recess RE1 and the second recess RE2 formed therein, a silicon oxide film IL3 is formed. Over the silicon oxide film IL3, a silicon nitride film IL4 is formed. By general photography, over the silicon nitride film IL4, a photoresist pattern PR2 is formed. With the photoresist pattern PR2 as a mask, the silicon nitride film IL4 is etched and patterned. With the patterned silicon nitride film IL4 as a mask, the silicon oxide film IL3 is further oxidized. Then, the silicon nitride film IL4 is etched.

By reference to FIGS. 39A to 39D, by oxidation of the silicon oxide film IL3, in the main surface of the semiconductor substrate SB, the element isolation film TI formed by LOCOS is formed. Then, the silicon oxide film IL3 is etched.

Then, by reference to FIGS. 40A to 40D, over the main surface of the semiconductor substrate SB, the shield oxide film SO is formed. Subsequently, the shield oxide film SO is annealed. By general lithography, the p type well region PW-forming region in the main surface of the semiconductor substrate SB is patterned, and ion-implanted. As a result, in the main surface of the semiconductor substrate SB, the p type well region PW is formed.

Figure 40A:
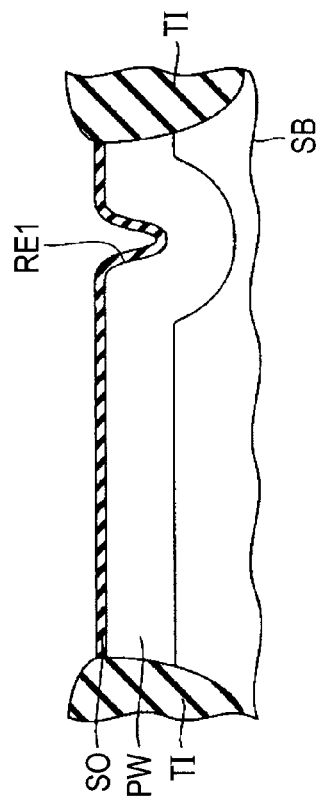
FIGS. 40A to 40D are schematic cross-sectional views showing a fifth step of the method for manufacturing a semiconductor device in Embodiment 2 of the present invention, with the cross-sectional positions corresponding to FIGS. 37A to 37D, respectively.
Figure 40B:
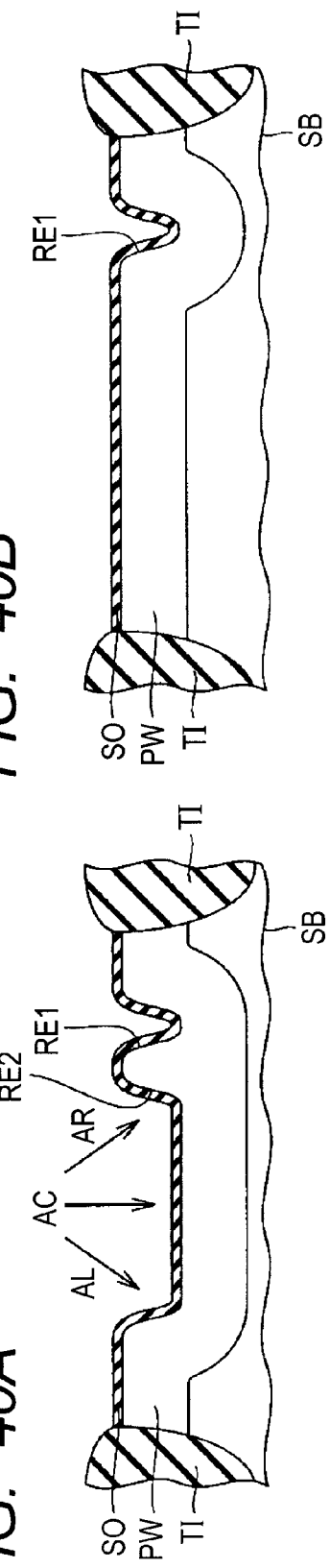
Figure 40C:
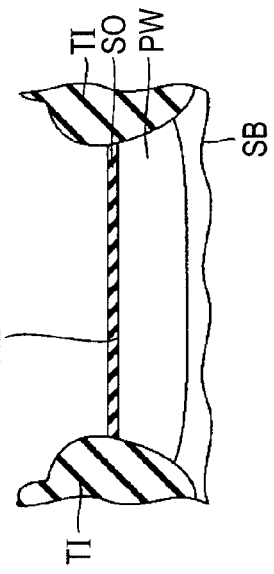
Figure 40D:
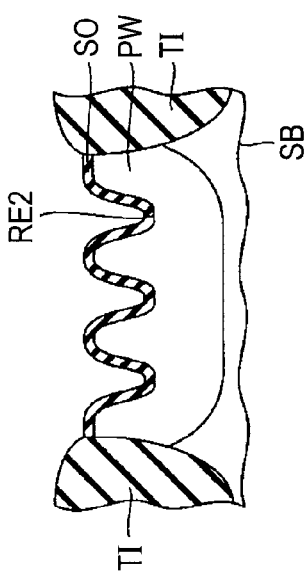
Figure 41A:
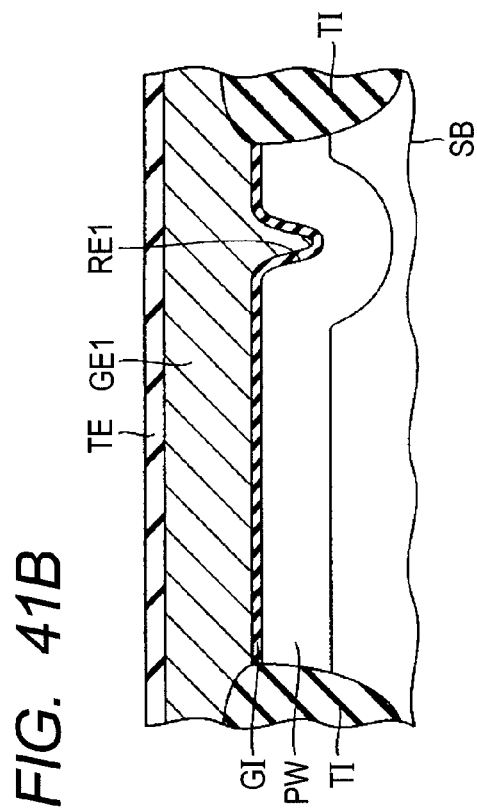
FIGS. 41A to 41D are schematic cross-sectional views showing a sixth step of the method for manufacturing a semiconductor device in Embodiment 2 of the present invention, with the cross-sectional positions corresponding to FIGS. 37A to 37D, respectively.
Figure 41B:
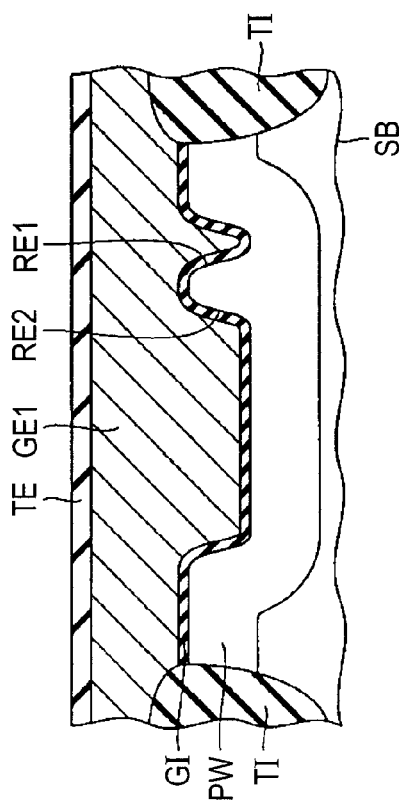
Figure 41C:
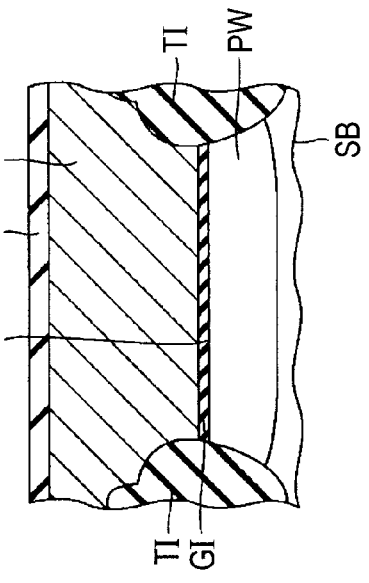
Figure 41D:
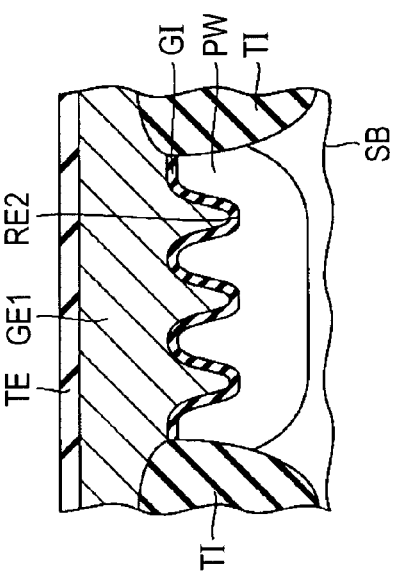
Figure 42:
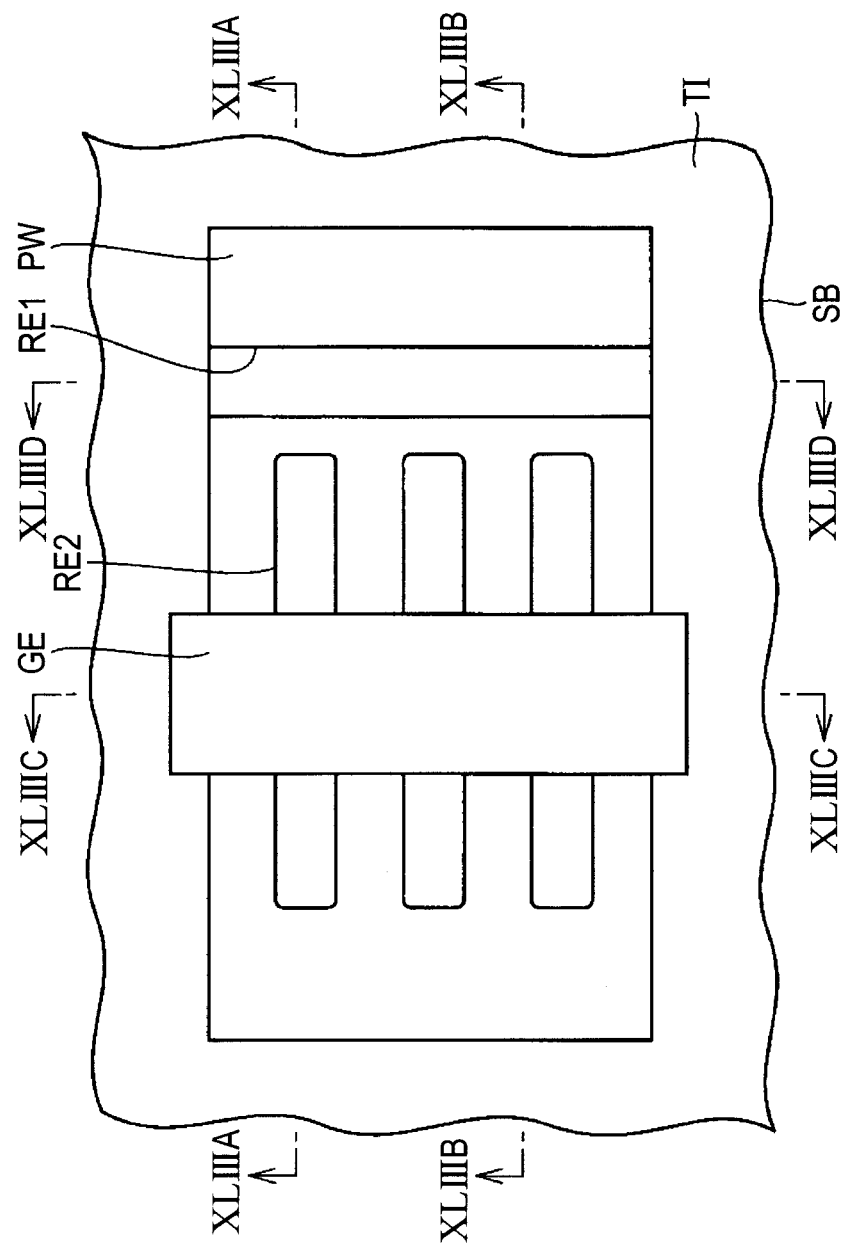
FIG. 42 is a schematic plan view showing a seventh step of the method for manufacturing a semiconductor device in Embodiment 2 of the present invention.
Figure 43A:
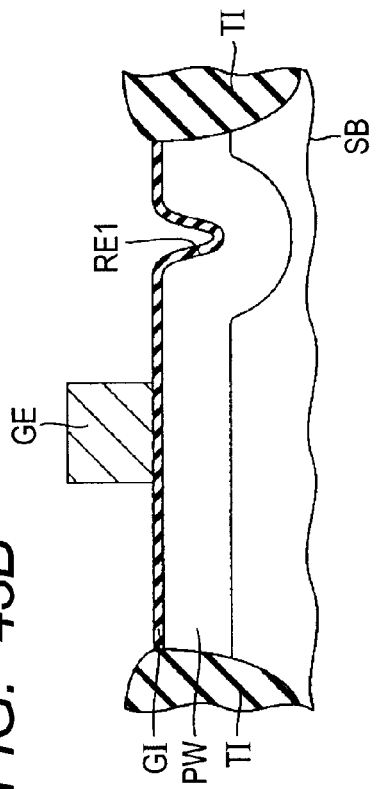
Figure 43B:
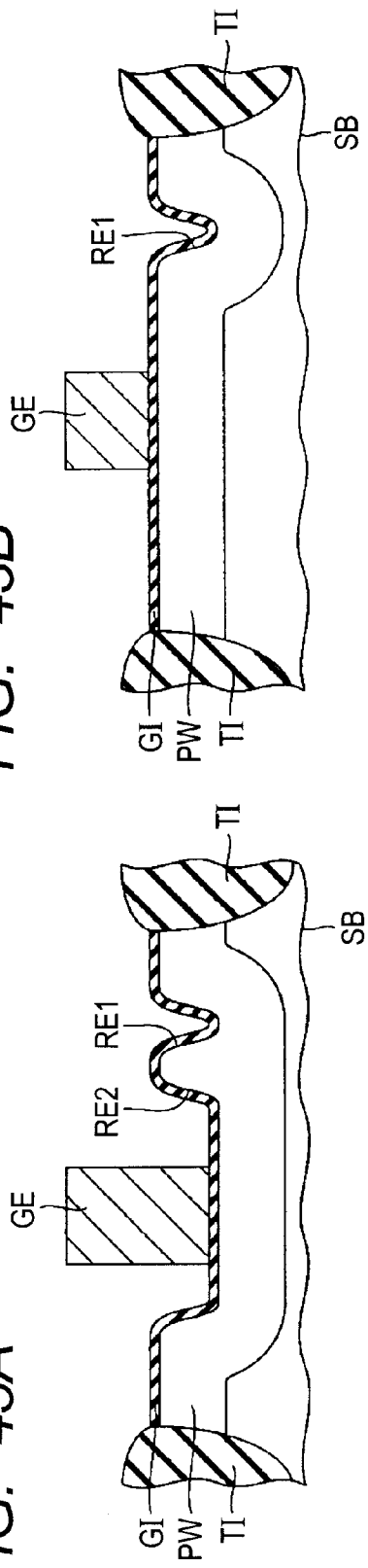
Figure 43C:
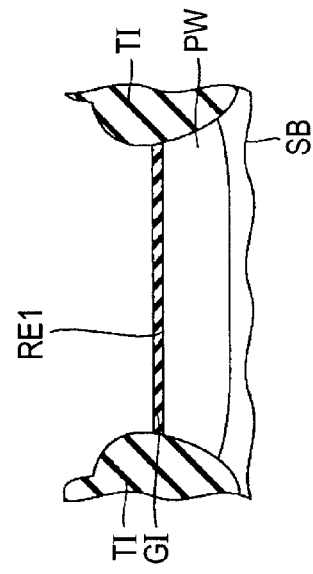
Figure 43D:
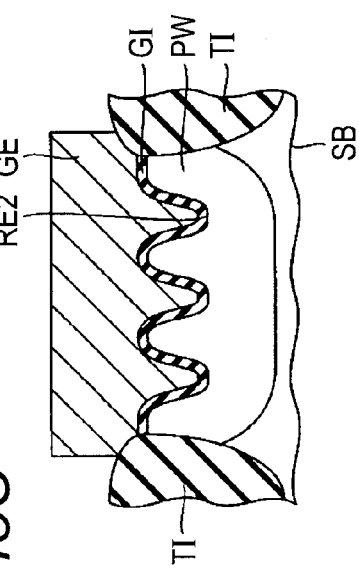
Figure 44A:
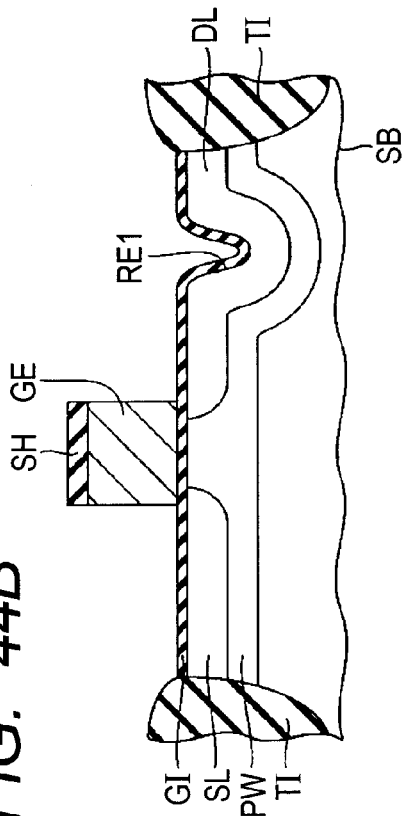
FIGS. 44A to 44D are schematic cross-sectional views showing an eighth step of the method for manufacturing a semiconductor device in Embodiment 2 of the present invention, with the cross-sectional positions corresponding to FIGS. 37A to 37D, respectively.
Figure 44D:
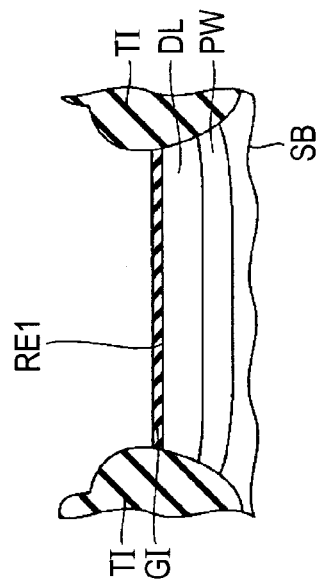
Figure 44B:
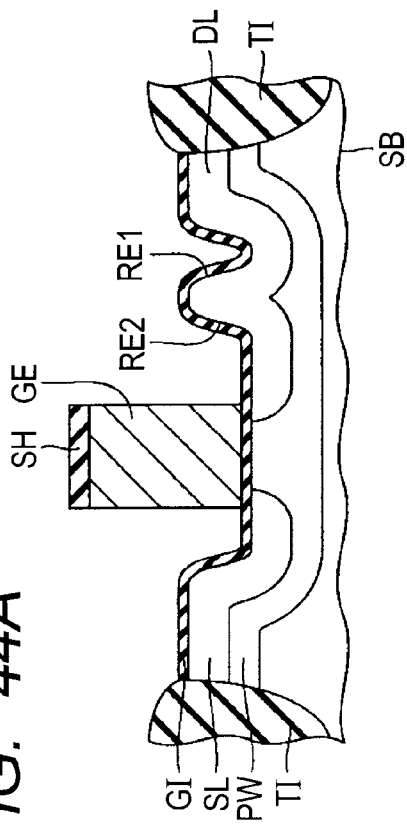
Figure 44C:
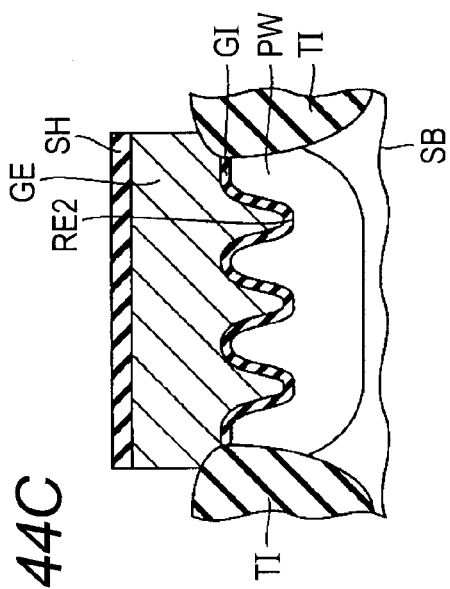
Figure 47:
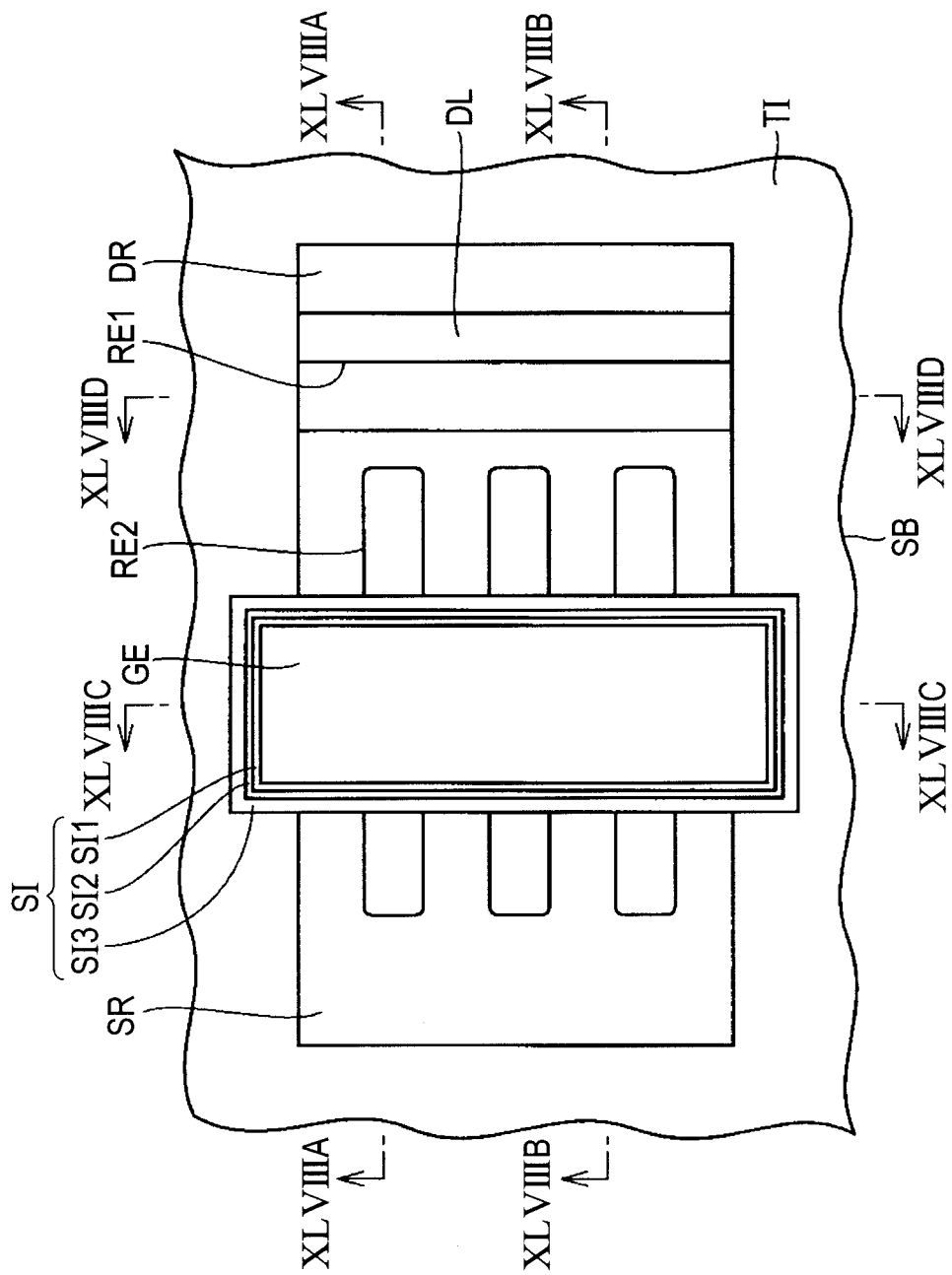
FIG. 47 is a schematic plan view showing a tenth step of the method for manufacturing a semiconductor device in Embodiment 2 of the present invention.
Figure 48A:
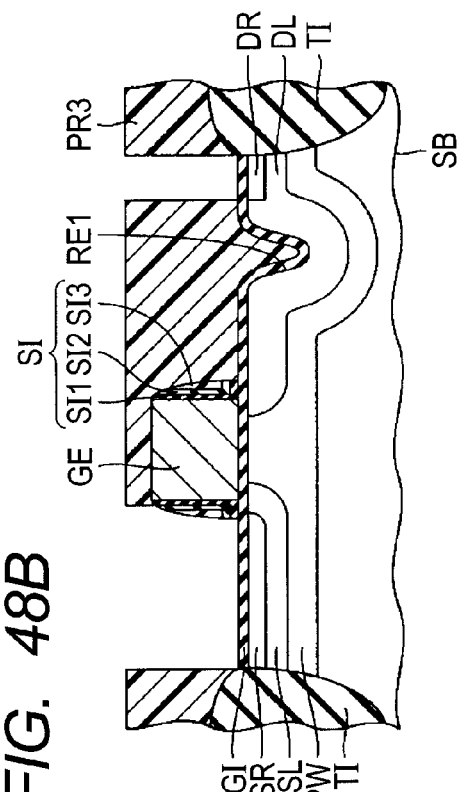
Figure 48B:
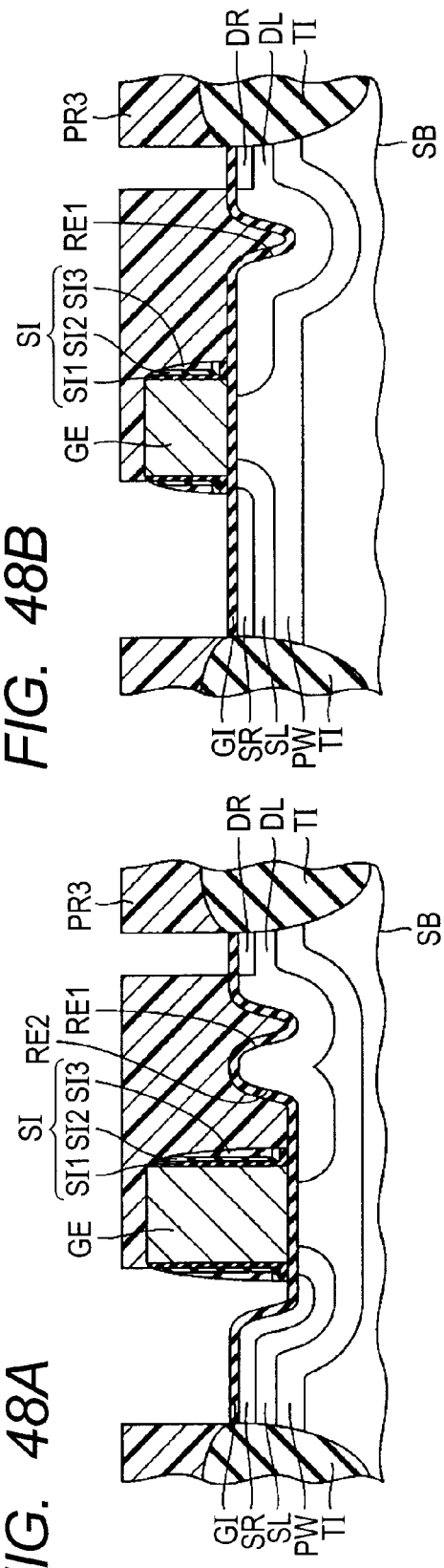
Figure 48C:
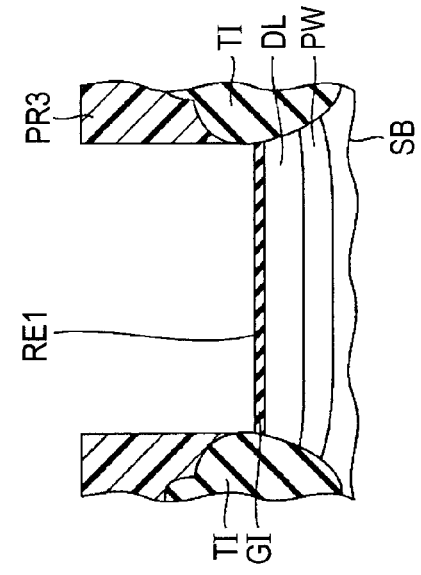
Figure 48D:
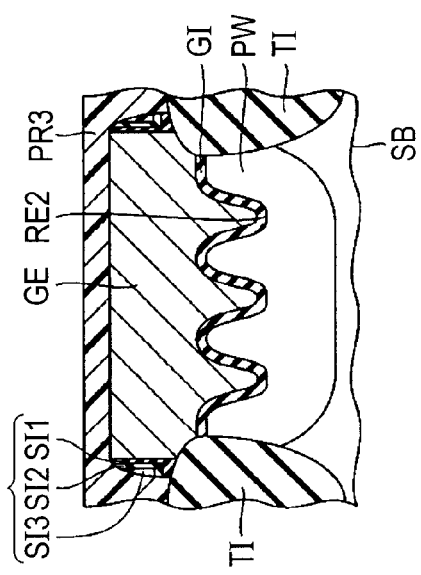

As shown in FIG. 40A, by combining vertical implantation, oblique implantation, and the like, ion implantation for well formation is performed so as to equalize the ion implantation amounts in the main surface of the semiconductor substrate SB, and the sidewall SW and the bottom wall in each of the first recess RE1, and the second recess RE2. Then, the shield oxide film SO is removed.

Referring to FIGS. 41A to 41D, over the main surface of the semiconductor substrate SB, the gate insulation film GI is formed. Over the gate insulation film GI, the gate polysilicon film GE1 to be the gate electrode layer GE is formed. The top surface of the gate polysilicon film GE1 is subjected to CMP. Subsequently, the gate polysilicon film GE1 is subjected to HF cleaning. Then, further, the gate polysilicon film GE1 is formed. Subsequently, over the gate polysilicon film GE1, the TEOS film TE is formed.

Referring to FIGS. 42, and 43A to 43D, with a polysilicon film not shown as a mask, the TEOS film TE is etched and patterned. Then, the polysilicon film is removed. With the patterned TEOS film TE as a mask, the gate polysilicon film GE1 is anisotropically etched. Thereafter, the TEOS film TE is removed. As a result, as shown in FIGS. 42 and 43A to 43D, the gate electrode layer GE is formed.

Referring to FIGS. 44A to 44D, over the gate electrode layer GE and the gate insulation film GI, the shield HTO film SH is formed. By general lithography, the shield HTO film SH is etched and patterned so as to leave the shield HTO film SH over the gate electrode layer GE. Then, with the shield HTO film SH and the gate electrode layer GE as a mask, a LDD layer is formed in the p type well region PW by ion implantation of combination of vertical implantation, oblique implantation, and the like. As a result, the source-side low-concentration region SL and the drain-side low-concentration region DL are formed.

Referring to 45, and 46A to 46D, over the sidewall of the gate electrode layer GE, the sidewall insulation film SI is formed.

Referring to FIGS. 47, and 48A to 48D, by general lithography, over the gate insulation film GI, the gate electrode layer GE, and the sidewall insulation film SI, a photoresist pattern PR3 is formed. With the photoresist pattern PR3 as a mask, with ion implantation by combining vertical implantation, oblique implantation, and the like, in the source-side low-concentration region SL and the drain-side low-concentration region DL, the source region SR and the drain region DR are formed. Subsequently, the source region SR and the drain region DR are annealed.

Then, an interlayer insulation film II (FIG. 35A) is formed. In the interlayer insulation film II, the source-side conductive layer CL1 and the drain-side conductive layer CL2 (FIG. 35A) are formed in an embedded manner. Subsequently, the first conductive layer PL1 and the second conductive layer PL2 are formed. Subsequently, hydrogen sintering is performed.

Incidentally, other manufacturing methods of the present embodiment are the same as those of Embodiment 1. Therefore, the same elements are given the same reference numerals and signs, and a description thereon will not be repeated.

Further, in the semiconductor device of the present embodiment, in a part underlying the gate electrode layer GE, in the main surface of the semiconductor substrate SB, a third recess RE3 may be formed.

Figure 49:
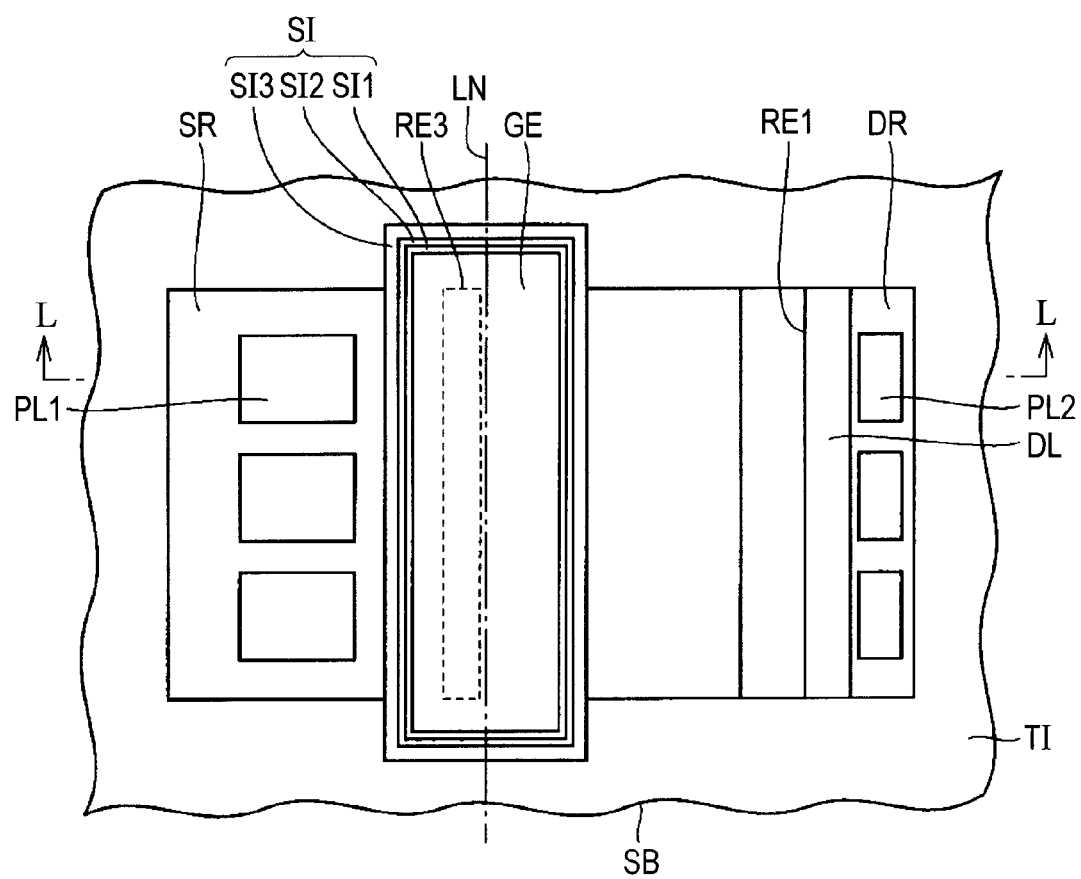
FIG. 49 is a schematic plan view of a semiconductor device of Modified Example 1 in Embodiment 2 of the present invention.
Figure 50:
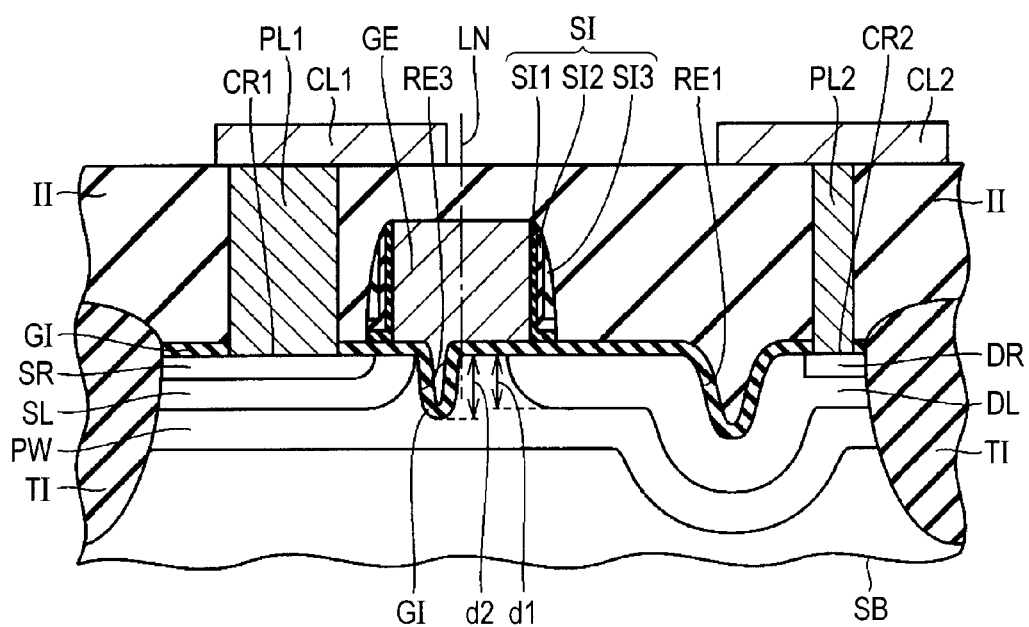
FIG. 50 is a schematic cross-sectional view along line L-L of FIG. 49.

Referring to FIGS. 49 and 50, in the semiconductor device of Modified Example 1 of the present embodiment, the first recess RE1 and the third recess RE3 are formed in the main surface of the semiconductor substrate SB. The third recess RE3 is formed in such a manner as to extend in the direction crossing the direction in which the source region SR and the drain region DR are opposed to each other. The third recess RE3 is formed in such a manner as to overlap the gate electrode layer GE in plan view.

The third recess RE3 may be formed closer to the source region SR than the center line LN of the gate electrode layer GE in the direction in which the source region SR and the drain region DR are opposed to each other. The third recess RE3 may be formed in such a manner as to have a depth d2 larger than the depth d1 of the drain region DR.

Figure 51:
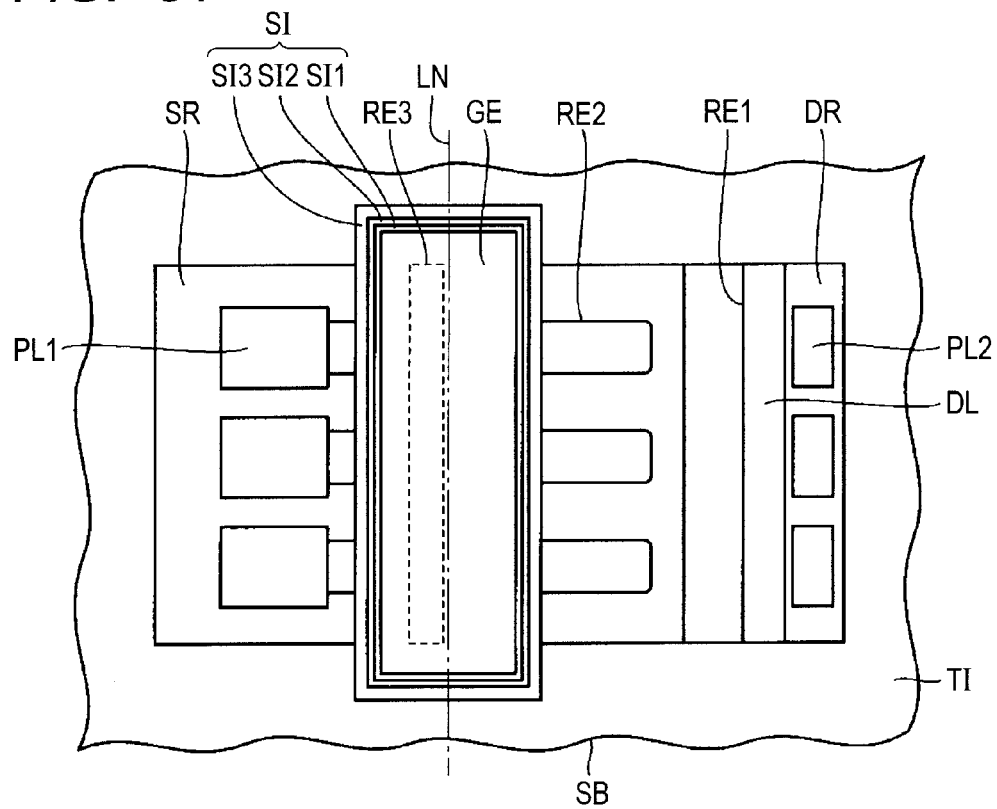
FIG. 51 is a schematic plan view of a semiconductor device of Modified Example 2 in Embodiment 2 of the present invention.

Referring to FIG. 51, in the semiconductor device of Modified Example 2 of the present embodiment, the first recess RE1, the second recess RE2, and the third recess RE3 are formed in the main surface of the semiconductor substrate SB. The third recess RE3 is formed in such a manner as to cross the second recess RE2 in the main surface of the semiconductor substrate SB.

Incidentally, other configurations and manufacturing methods of Modified Examples 1 and 2 of the present embodiment are the same as the configurations and manufacturing methods of the present embodiment. Therefore, the same elements are given the same reference numerals and signs, and a description thereon will not be repeated.

Then, a description will be given to the operational effects of the present embodiment. MOSFETs have been used for the purpose of controlling a high voltage of several tens to several hundreds of volts in, for example, a control component of a car, or an optical disk drive. The MOSFET, which is a switching element, is changed in bias voltage to be applied to the gate electrode layer GE. Thus, the MOSFET switches between the On state in which a current flows between the source region SR and the drain region DR, and the Off state in which a current does not flow therebetween. In the Off state, a punch-through current must be prevented from flowing from the drain region DR to be generally applied with a high voltage to the semiconductor substrate SB and the source region SR. To that end, the device is required to be designed so as to prevent the punch-through current from flowing in the following manner: when the bias voltage to be applied to the gate electrode layer GE is turned Off, the voltage to be applied to the drain region DR is gradually increased, so that a punch-through current starts to flow to the source region SR; the critical voltage (Off breakdown voltage) at this point is set higher than in the operating voltage region of the device.

Figure 52:
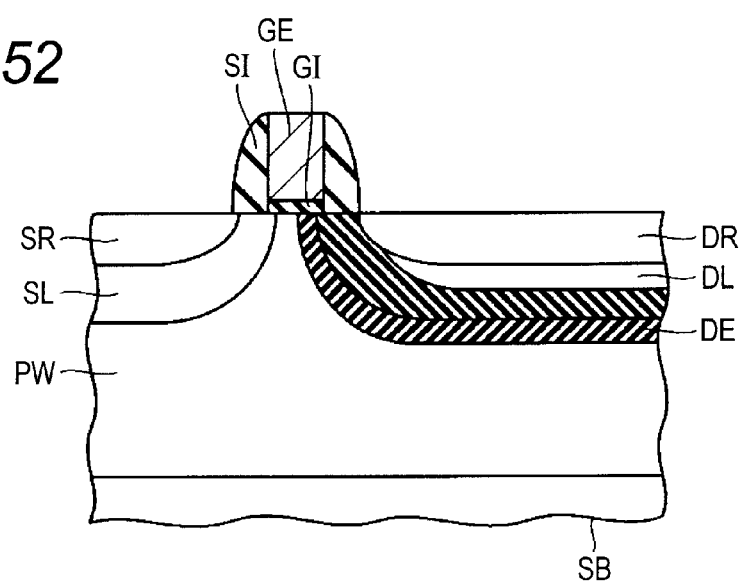
FIG. 52 is a schematic cross-sectional view of a MOSFET of Comparative Example 1 in Embodiment 2 of the present invention.

Referring to FIG. 52, in an n type MOSFET of Comparative Example 1 of the present embodiment, the source region SR and the drain region DR are formed symmetrically with respect to the gate electrode layer GE. When the drain region DR is positively biased, the depletion layer DE expands toward the p type well region PW side and the drain-side low-concentration region DL side. When the depletion layer DE end reaches the drain region DR, it becomes impossible to further increase the depletion layer DE width. In that case, when a higher voltage is applied thereto, the depletion layer DE expanded toward the p type well region PW side further expands, so that electric field relaxation is caused. The depletion layer DE also extends, in addition to the direction of inside from the main surface of the semiconductor substrate SB, in the direction of the source region SR. Therefore, the source-drain breakdown voltage is deteriorated. As a result, a punch-through current becomes more likely to occur.

In order to avoid the occurrence of the punch-through current due to the breakdown voltage deterioration, the drain region DR is formed offset from the gate electrode layer GE. Thus, as a structure capable of also sufficiently extending the depletion layer DE in the drain-side low-concentration region DL, the asymmetrical source-drain structure shown in FIG. 53 is used.

Figure 53:
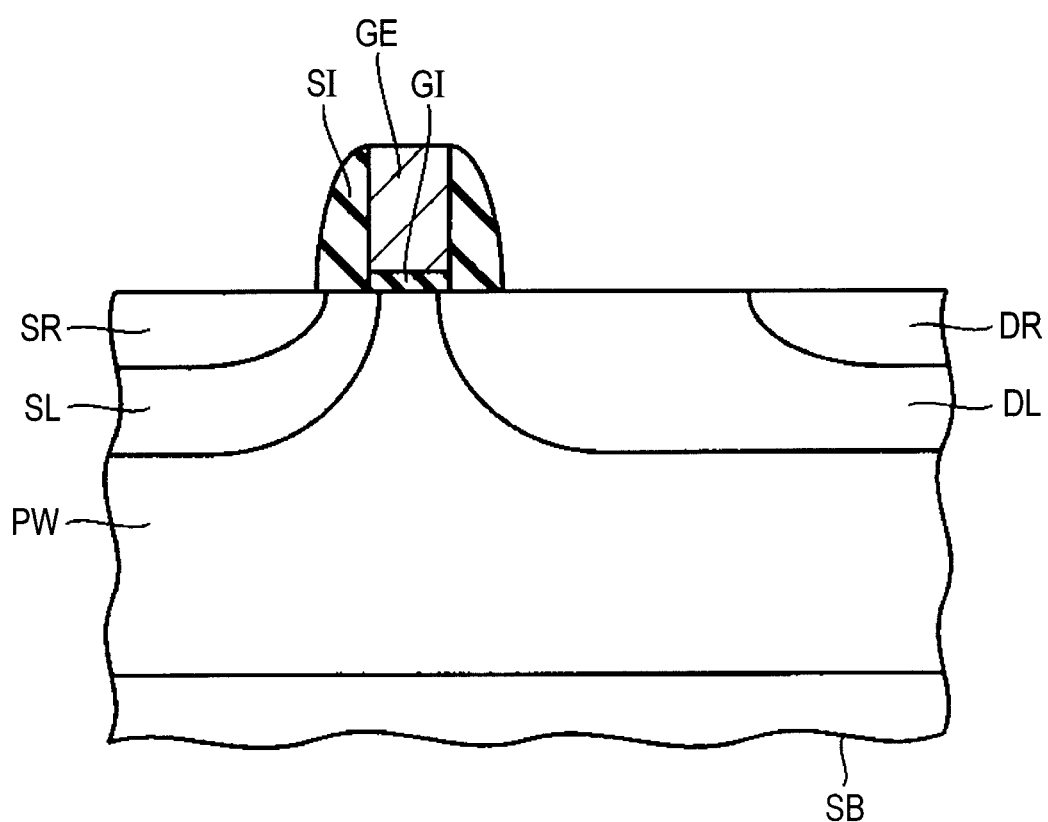
FIG. 53 is a schematic cross-sectional view of a MOSFET of Comparative Example 2 in Embodiment 2 of the present invention.

Referring to FIG. 53, in the n type MOSFET having an asymmetrical source-drain structure, the source region SR is formed adjacent to the sidewall insulation film SI of the gate electrode layer GE. In contrast, the drain region DR to be applied with a high voltage is formed offset from the sidewall insulation film SI. Expansion of the depletion layer DE width by the PN junction formed by the p type well region PW and the drain-side low-concentration region DL can relax the drain-source electric field. In that case, a larger depletion layer DE width can achieve more electric field relaxation. Therefore, in the asymmetrical source-drain structure, the drain region DR is formed sufficiently apart from the PN junction, which enables more electric field relaxation.

However, for the MOSFET of Comparative Example 2, miniaturization is difficult. For miniaturization of a MOSFET, reduction of the device size and reduction of the power source voltage are required to be performed simultaneously. This is for the following reason: when only the reduction of the device size is achieved, the cut-off characteristics are deteriorated due to the short channel effect or the like; therefore, in order to compensate for it, the gate or drain voltage is required to be reduced.

A device miniaturized according to a given rule (scaling law) can acquire the equivalent DC (direct current) characteristics, and the equivalent or more AC (alternating current) characteristics with a fraction of the footprint. For this reason, miniaturization provides a large merit in cost reduction and characteristic improvement.

However, with a MOSFET for controlling a high voltage, it is difficult to reduce the source voltage. The MOSFET for controlling a high voltage performs switching of an externally connected element operating at a high voltage. For this reason, the source voltage (corresponding to the voltage applied to the drain region DR) is determined by the demand from the external element. Therefore, when the voltage applied to the drain region remains high, in order to prevent the deterioration of the punch-through resistance, it becomes impossible to reduce the gate-drain offset length, channel length, and the like. Accordingly, the semiconductor device cannot be miniaturized.

In contrast, in accordance with the semiconductor device of the present embodiment, the first recess RE1 is formed in the main surface of the semiconductor substrate SB in such a manner as to cross the direction in which the source region SR and the drain region DR are opposed to each other. In addition, the first recess RE1 is, in plan view, disposed between the gate electrode layer GE and the drain region DR.

For this reason, in the Off state, the first recess RE1 increases the resistance, which can relax the electric field. As a result, it is possible to inhibit the reduction of the breakdown voltage. Accordingly, the occurrence of a punch-through current can be inhibited. Therefore, the MOSFET can be reduced in size in the channel length direction, and hence the semiconductor device can be miniaturized.

Whereas, in the On state, the first recess RE1 results in a longer current path for drain current. This can prevent the drain current from excessively flowing.

Further, in accordance with the semiconductor device of the present embodiment, the second recess RE2 may be formed in the main surface sandwiched between the source region SR and the drain region DR in such a manner as to extend in the direction in which the second source region SR and the drain region DR are opposed to each other. For this reason, the second recess RE2 can reduce the size of the MOSFET in the channel width direction. As a result, the semiconductor device can be miniaturized.

Alternatively, in accordance with each semiconductor device of Modified Example 1 and Modified Example 2 of the present embodiment, the third recess RE3 may be formed in the main surface in such a manner as to extend in the direction crossing the direction in which the source region SR and the drain region DR are opposed to each other, and in such a manner as to overlap the gate electrode layer GE in plan view.

For this reason, in the Off state, the third recess RE3 increases the resistance, which can relax the electric field. As a result, it is possible to inhibit the reduction of the breakdown voltage. Accordingly, the occurrence of a punch-through current can be inhibited. Therefore, the MOSFET can be reduced in size in the channel length direction, and hence the semiconductor device can be miniaturized. Further, the channel length of the MOSFET can be increased, and hence the threshold value can be increased. Further, the depletion layer DE extending from the drain-side low-concentration region DL can be prevented from extending toward the source-side low-concentration region SL side by the third recess RE3.

Whereas, in the On state, the third recess RE3 results in a longer current path for drain current. This can prevent the drain current from excessively flowing.

Embodiment 3

The semiconductor device of Embodiment 3 of the present invention is mainly different in configuration of the recess from the semiconductor device of Embodiment 2.

Figure 54:
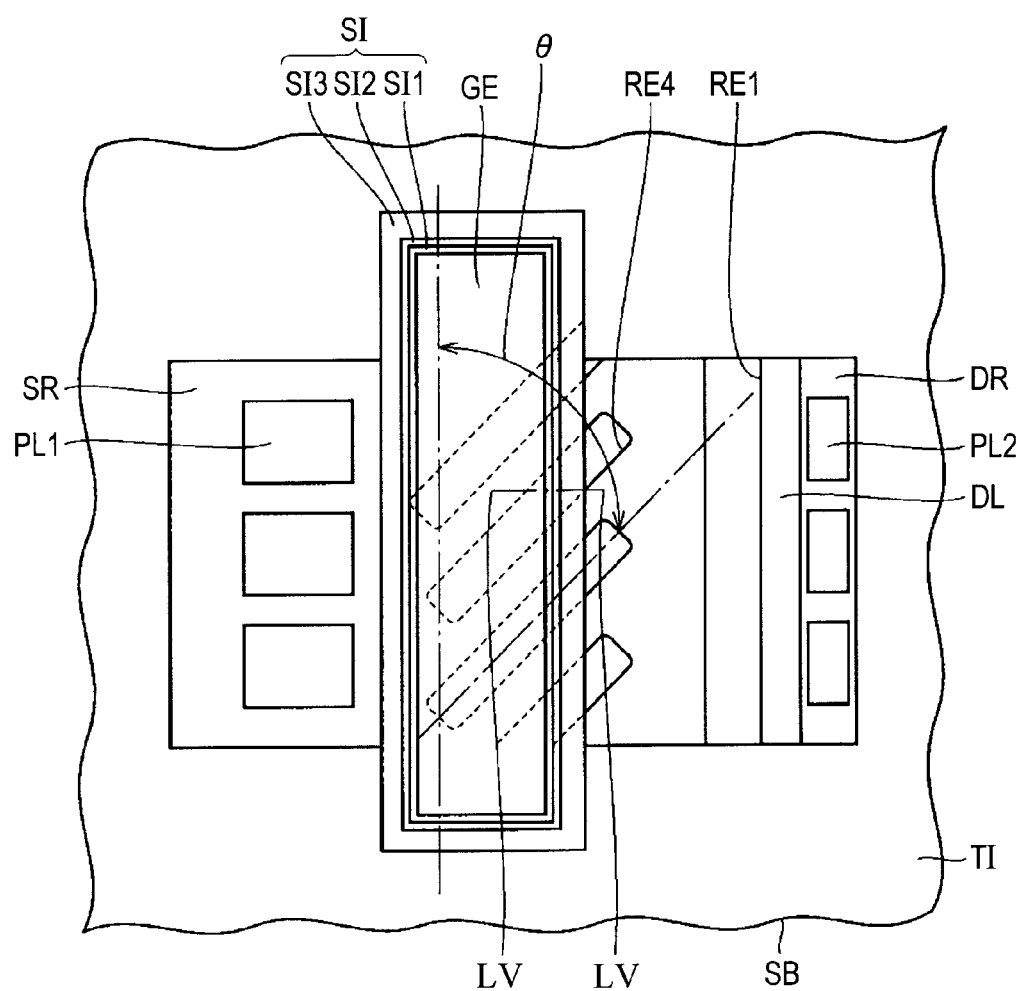
FIG. 54 is a schematic plan view of a semiconductor device in Embodiment 3 of the present invention.

Referring to FIG. 54, in the semiconductor device in the present embodiment, a fourth recess RE4 is formed in the main surface of the semiconductor substrate SB obliquely with respect to the direction crossing the direction in which the source region SR and the drain region DR are opposed to each other. Further, in the semiconductor device in the present embodiment, as compared with the semiconductor device of Embodiment 2, the second recess RE2 and the third recess RE3 are not formed.

Figure 55:
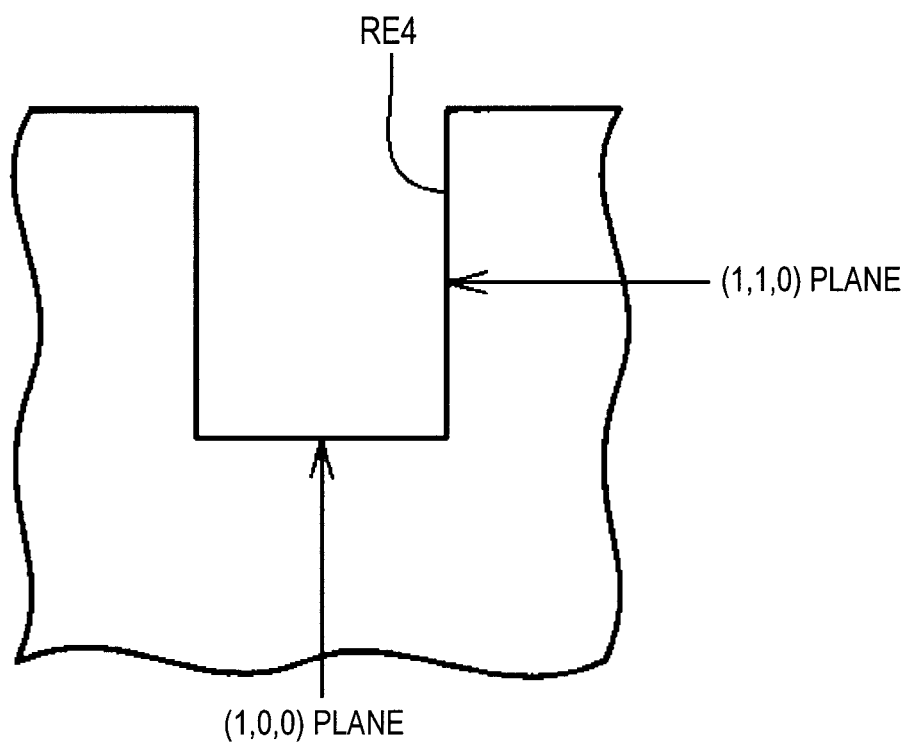
FIG. 55 is a schematic cross-sectional view along line LV-LV of FIG. 54, the schematic cross-sectional view showing the shape of the recess.

Referring to FIG. 55, when the fourth recess RE4 is formed at a tilt angle θ of 45° with respect to the direction crossing the direction in which the source region SR and the drain region DR are opposed to each other, the side surface of the fourth recess RE4 becomes a (1, 1, 0) plane. Incidentally, the bottom surface of the fourth recess RE 4 becomes a (1, 0, 0) plane.

Incidentally, other configurations and manufacturing methods of the present embodiment are the same as the configurations and manufacturing methods of Embodiment 2. Therefore, the same elements are given the same reference numerals and signs, and a description thereon will not be repeated.

Figure 56:
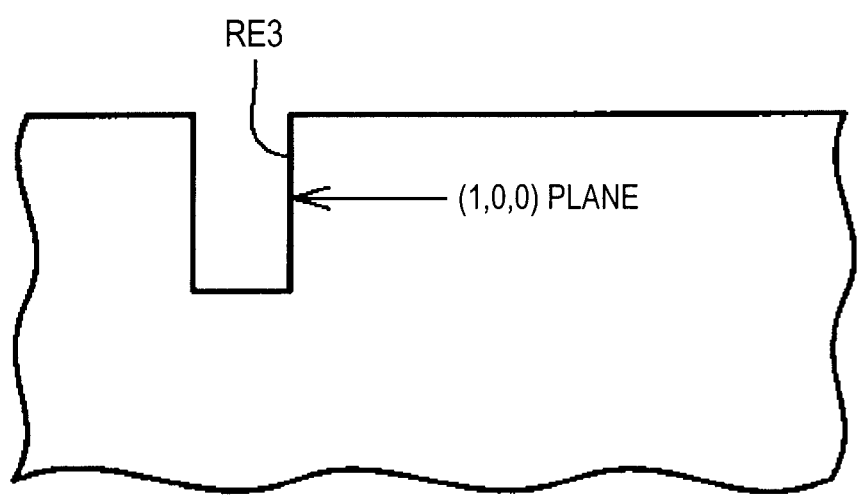
FIG. 56 is a schematic cross-sectional view of the semiconductor device of Embodiment 2 of the present invention to be compared with the semiconductor device in Embodiment 3 of the present invention, with the cross section corresponding to FIG. 55.

On the other hand, referring to FIG. 56, in the semiconductor device of Embodiment 2 for comparison with the semiconductor device of the present embodiment, the side surface of the third recess RE3 becomes a (1, 0, 0) plane. This plane is expressed as an equivalent plane.

In the semiconductor device of the present embodiment, the fourth recess RE4 is formed obliquely with respect to the direction crossing the direction in which the source region SR and the drain region DR are opposed to each other. For this reason, by forming the fourth recess corresponding to the second recess RE2 and the third recess RE3, it is possible to form both the structures of the second recess RE2 and the third recess RE3 in one step. This can simplify the process flow. Thus, the simplified process flow can miniaturize the semiconductor device without deteriorating the characteristics.

Further, in the semiconductor device of the present embodiment, by adjusting the tilt angle θ of the fourth recess RE4 with respect to the direction crossing the direction in which the source region SR and the drain region DR are opposed to each other, it is possible to adjust the effective channel length and channel length. In other words, when the tilt angle θ is between 0 to 45°, the effective channel length can be increased. Whereas, when the tilt angle θ is between 45° to 90°, the effective channel width can be increased. As a result, it is possible to adjust the direction of miniaturization of the semiconductor device.

Further, in the semiconductor device of the present embodiment, when the fourth recess RE4 is formed with a tilt angle θ of 45° with respect to the direction crossing the direction in which the source region SR and the drain region DR are opposed to each other, the side surface of the fourth recess RE4 becomes a (1, 1, 0) plane. In this case, as compared with the semiconductor device of Embodiment 2 in which the side surface of the third recess RE3 is a (1, 0, 0) plane, the semiconductor device of the present embodiment can implement the increase in channel width and the increase in channel length simultaneously. This can reduce the element area.

Embodiment 4

The semiconductor device of Embodiment 4 of the present invention is mainly different in configuration of the recess from the semiconductor device of Embodiment 2.

Figure 57:
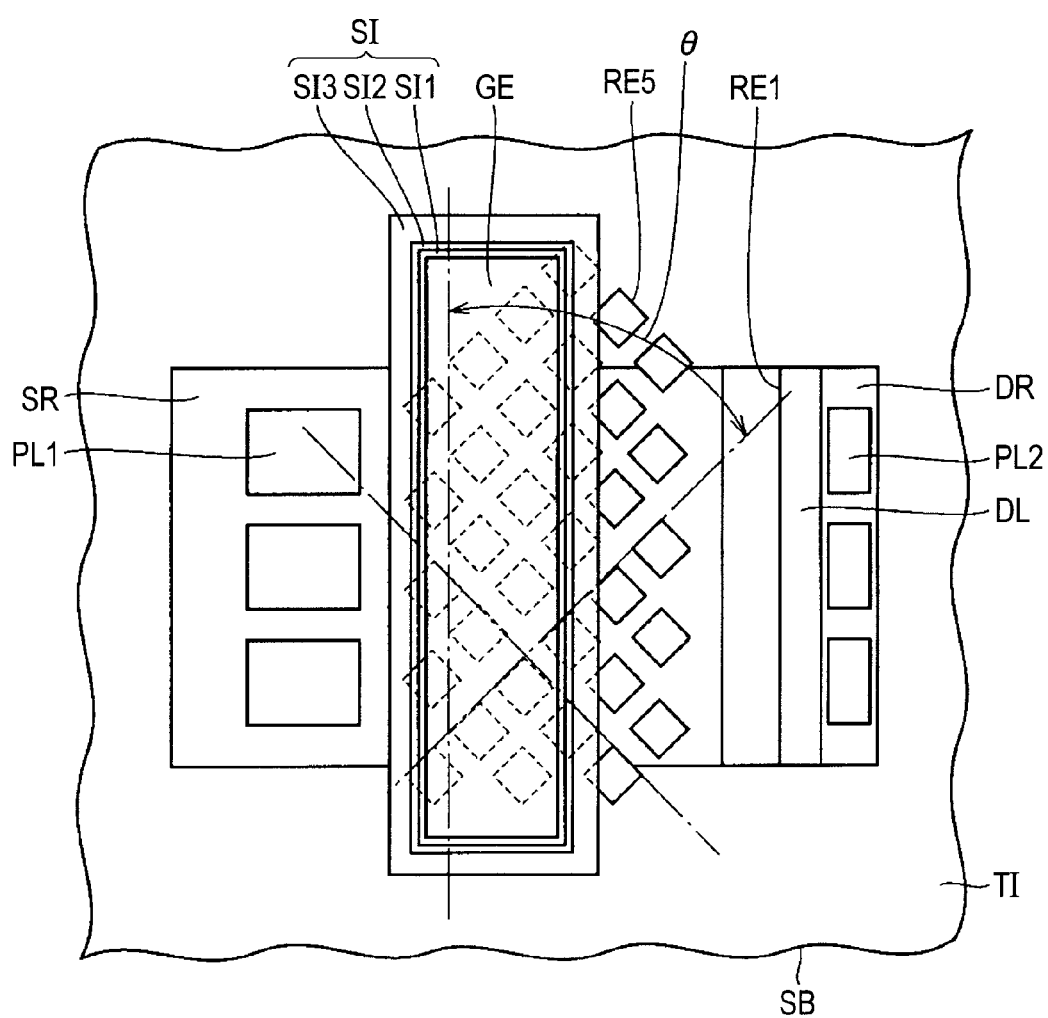
FIG. 57 is a schematic plan view of a semiconductor device in Embodiment 4 of the present invention.

Referring to FIG. 57, in the semiconductor device of the present embodiment, a plurality of fifth recesses RE5 are formed in the main surface of the semiconductor substrate SB. Each fifth recess RE has a square shape in plan view. A plurality of fifth recesses RE5 are formed densely.

In order to gain the effective length of the channel length or the channel width, the recess RE preferably has a deep shape, a shape with a large aspect ratio (depth/width).

In the semiconductor device of the present embodiment, when formation of large-aspect-ratio recess pattern is difficult, the square-shaped fifth recesses RE5 are densified, which can gain the effective length of the channel length or the channel width. Therefore, even when the aspect ratio of each recess RE is small, the semiconductor device can be miniaturized.

In the semiconductor device of the present embodiment, by forming the fifth recesses corresponding to the second recess RE2 and the third recess RE3 in Embodiment 2, it is possible to form both the structures of the second recess RE2 and the third recess RE3 in one step. This can simplify the process flow. Thus, the simplified process flow can miniaturize the semiconductor device without deteriorating the characteristics.

Figure 58:
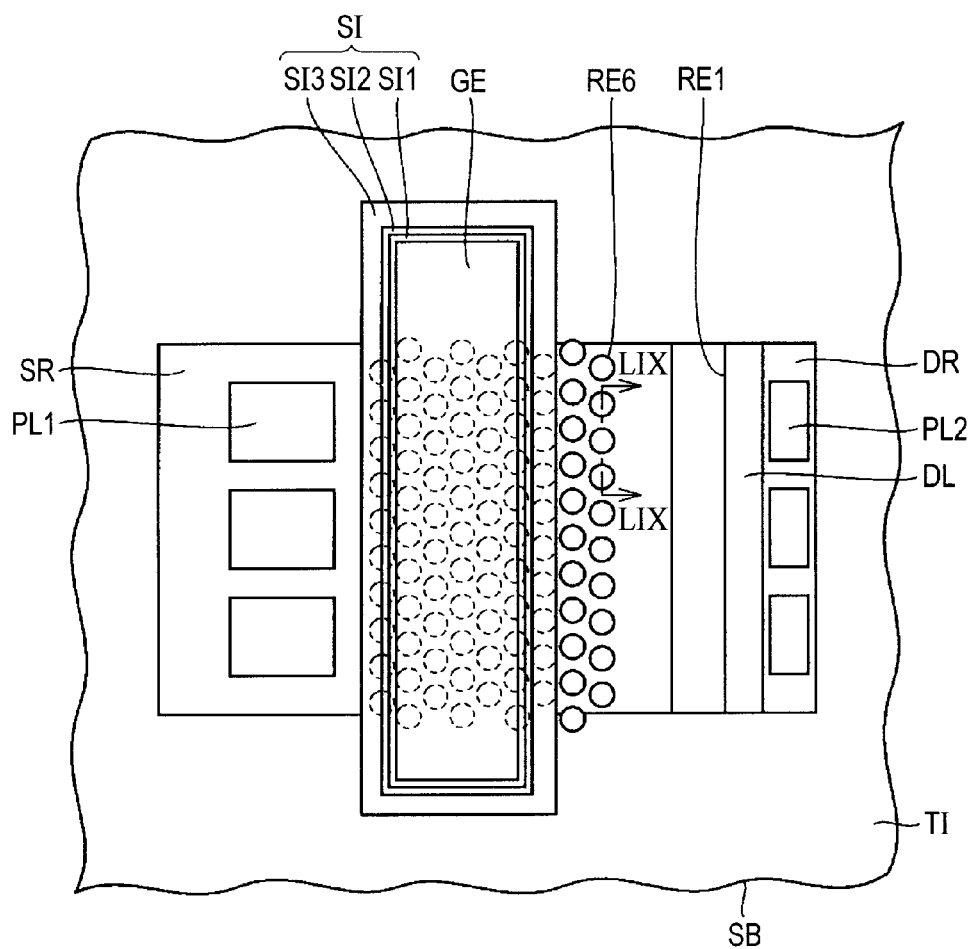
FIG. 58 is a schematic plan view of a semiconductor device of a modified example in Embodiment 4 of the present invention.

Alternatively, referring to FIG. 58, in the semiconductor device of the present embodiment, sixth recesses RE6 may be formed in the main surface of the semiconductor substrate SB in such a manner as to each have a circular shape in plan view. A plurality of the sixth recesses RE6 are formed densely.

Figure 59A:
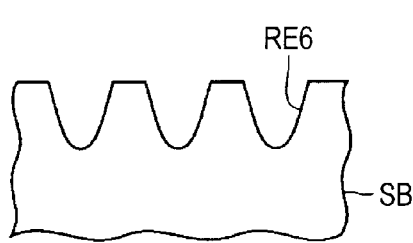
FIG. 59 is a schematic cross-sectional view along line LIX-LIX of FIG. 58, the schematic cross-sectional view showing the shape of the recess.
Figure 59B:
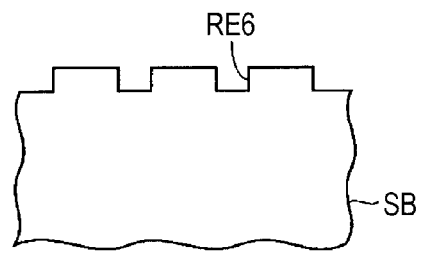
Figure 60:
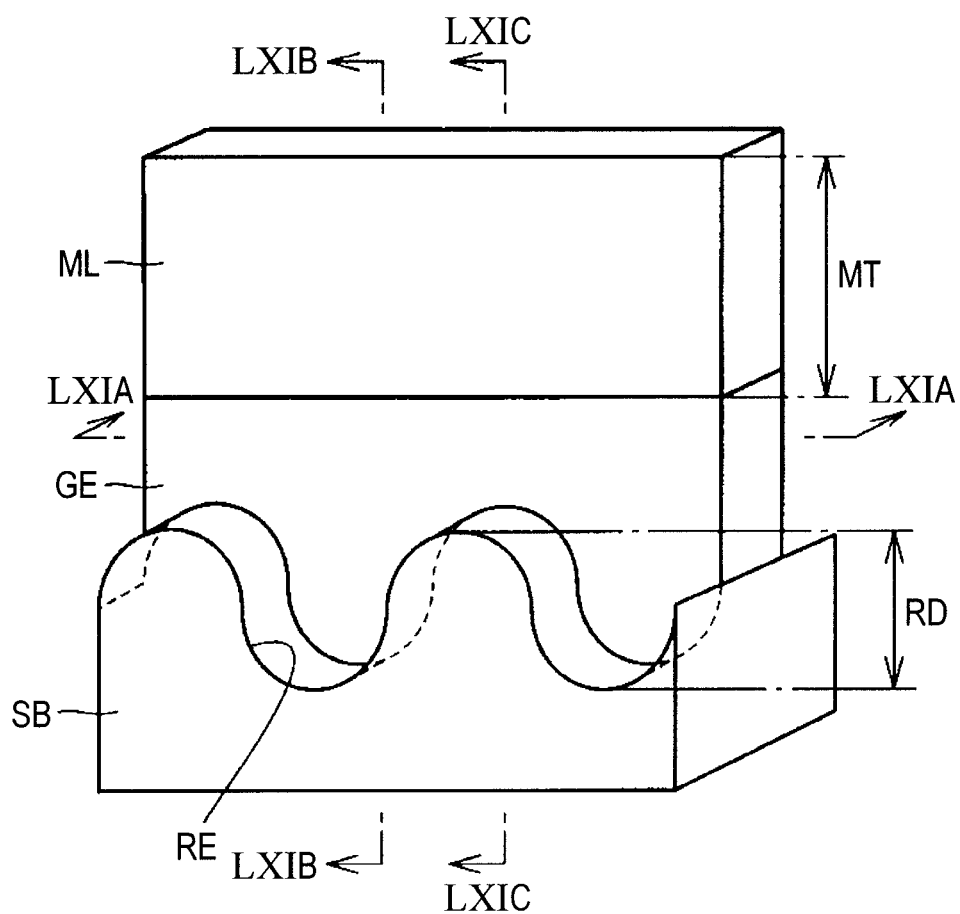
FIG. 60 is a schematic perspective view showing a method for manufacturing a semiconductor device in Embodiment 5 of the present invention, the schematic perspective view showing the vicinity of a gate electrode layer before formation of a sidewall insulation film.

Referring to FIG. 59A, in the semiconductor device of Modified Example in the present embodiment, a plurality of the sixth recesses RE6 may be formed by a space pattern (hole type). Alternatively, referring to FIG. 59B, a plurality of the sixth recesses RE may be formed by a line pattern (cylinder type).

In the semiconductor device of Modified Example of the present embodiment, the sixth recess RE6 has a circular shape in which the corner parts of the recess are rounded in plan view of the recess. Therefore, further miniaturization can be achieved. Further, the electric field concentration can be inhibited.

Further, in the semiconductor device of the present embodiment, when the sixth recesses RE6 are each formed at a tilt angle θ of 45° with respect to the direction crossing the direction in which the source region SR and the drain region DR are opposed to each other, the side surfaces of the sixth recesses RE6 are formed of a plurality of surfaces such as (1, 1, 1) plane (FIG. 59A). In this case, as compared with the semiconductor device of Embodiment 2 in which the side surface of the third recess RE3 is a (1, 0, 0) plane, for the semiconductor device of the present embodiment, the increase in channel width and the increase in channel length can be implemented simultaneously, which can reduce the element areas.

Embodiment 5

The method for manufacturing a semiconductor device of Embodiment 5 of the present invention is mainly different from that of Embodiment 1 in that the residue of the insulation film upon formation of the sidewall insulation film is not left.

Although no mention was made in Embodiment 1, for forming the sidewall insulation film SI, the insulation film to be the sidewall insulation film SI is left behind in the recess as a residue. In the present embodiment, a description will be given to the method for manufacturing a semiconductor device whereby no residue is left behind in the recesses upon formation of the sidewall insulation film SI.

Referring to FIGS. 60, and 61A to 61C, in the main surface of the semiconductor substrate SB, the recesses RE are formed. Over the recess RE, a lamination structure of a gate electrode layer GE and a mask layer ML is formed. The thickness MT of the mask layer ML for forming the mask layer ML is set so as to be larger than the depth RD of the recess RE. The mask layer ML includes, for example, a hard mask.

Figure 62C:
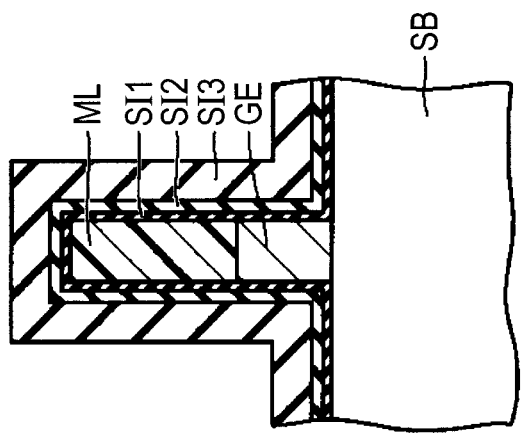
FIGS. 62A to 62C are schematic views showing a first step of the method for manufacturing a semiconductor device in Embodiment 5 of the present invention with the cross-sectional positions corresponding to FIGS. 61A to 61C, respectively.
Figure 62B:
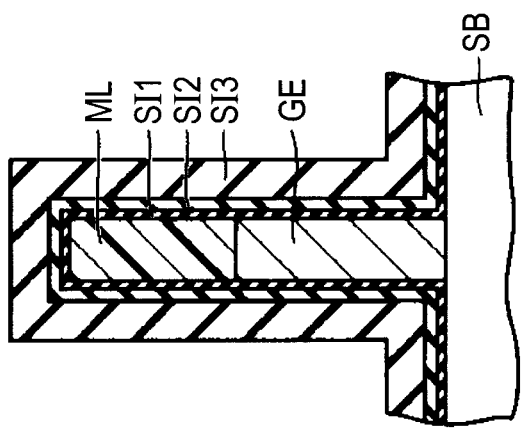
Figure 62A:
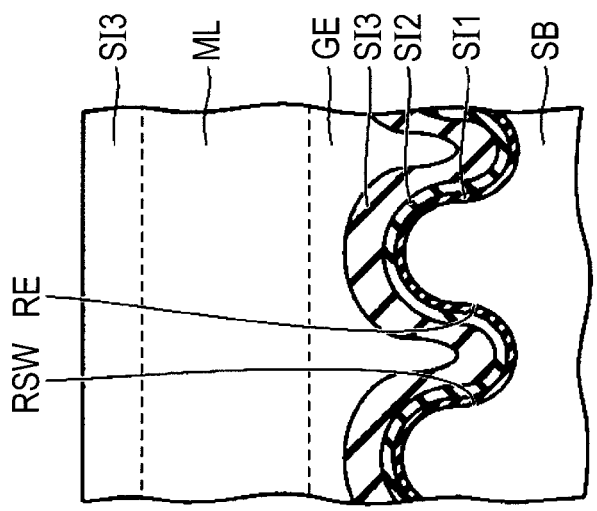

Referring to FIGS. 62A to 62C, an insulation film STI is formed in such a manner as to cover the recess RE formed in the main surface of the semiconductor substrate SB, and the lamination structure of the gate electrode layer GE and the mask layer ML thereover. The insulation film SI1 includes, for example, a silicon oxide film ($SiO_2$). Over the insulation film SI1, an insulation film SI2 is formed. The insulation film SI2 is formed with an initial film thickness such that the residual film can be ensured even when overetching equal to or more than the depth of the recess RE for etching of the insulation film SI1 is performed. The insulation film SI2 includes, for example, a silicon nitride film (SiN). Over the insulation film SI2, an insulation film SI3 is formed. The insulation film SI3 is formed with an initial film thickness such that the residual film can be ensured upon etching of the insulation film SI2. The insulation film SI3 includes, for example, a silicon oxide film ($SiO_2$).

Figure 63C:
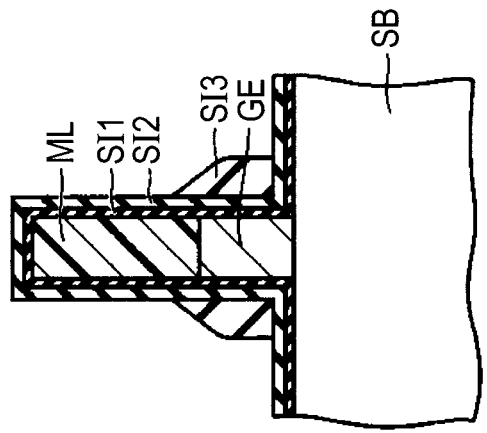
FIGS. 63A to 63C are schematic views showing a second step of the method for manufacturing a semiconductor device in Embodiment 5 of the present invention with the cross-sectional positions corresponding to FIGS. 61A to 61C, respectively.
Figure 63B:
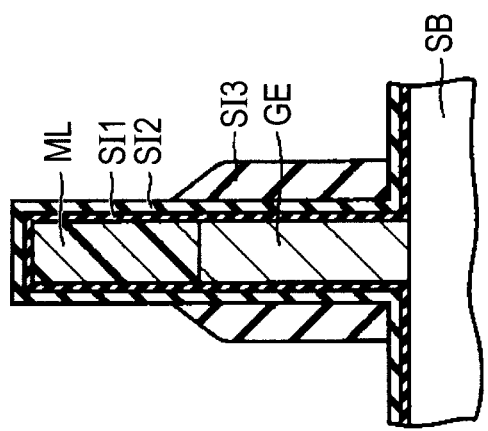
Figure 63A:
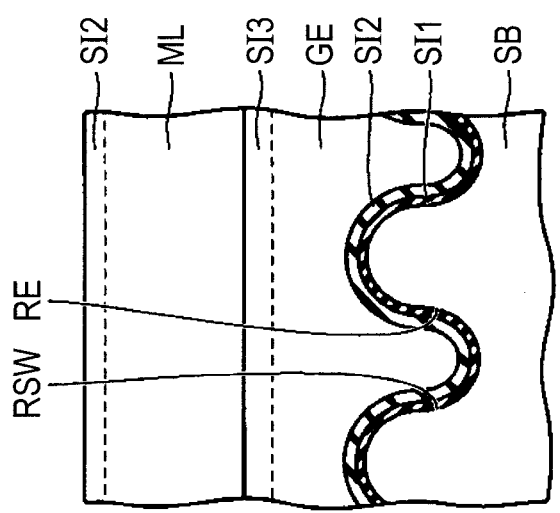
Figure 64A:
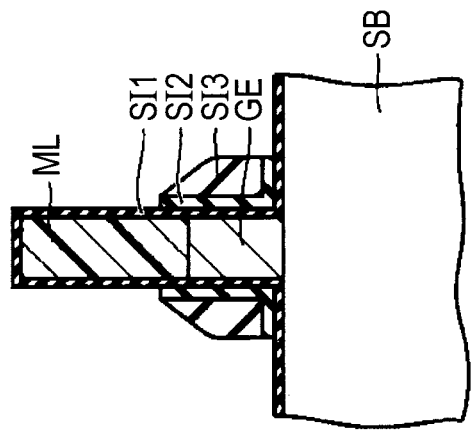
FIGS. 64A to 64C are schematic views showing a third step of the method for manufacturing a semiconductor device in Embodiment 5 of the present invention with the cross-sectional positions corresponding to FIGS. 61A to 61C, respectively.
Figure 64B:
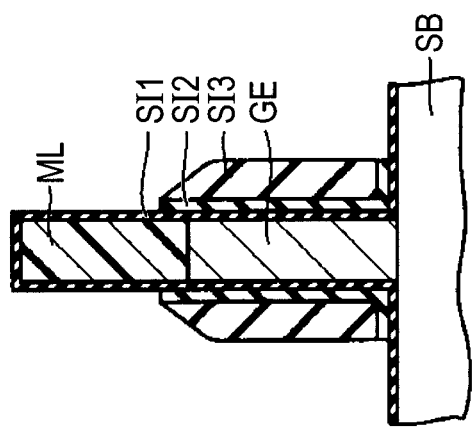
Figure 64C:
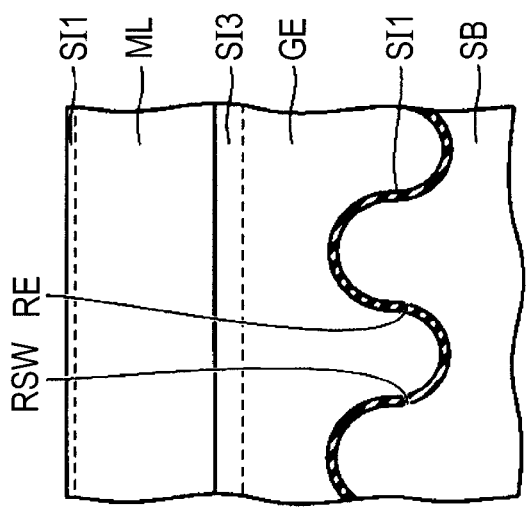
Figure 65A:
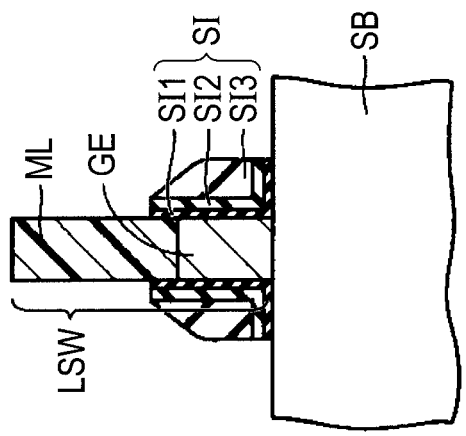
FIGS. 65A to 65C are schematic views showing a fourth step of the method for manufacturing a semiconductor device in Embodiment 5 of the present invention with the cross-sectional positions corresponding to FIGS. 61A to 61C, respectively.
Figure 65B:
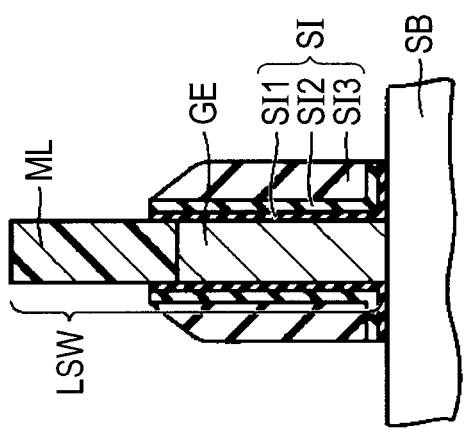
Figure 65C:
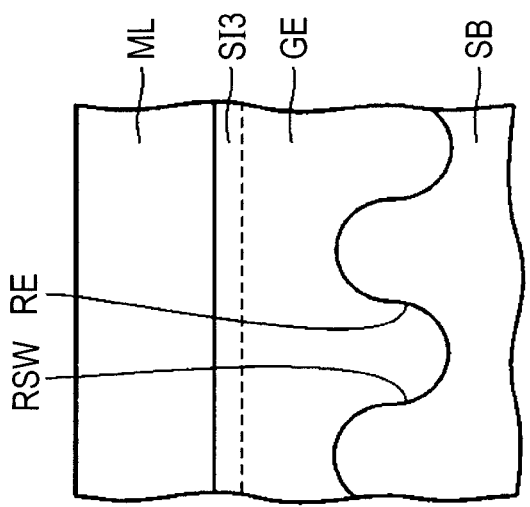
Figure 66:
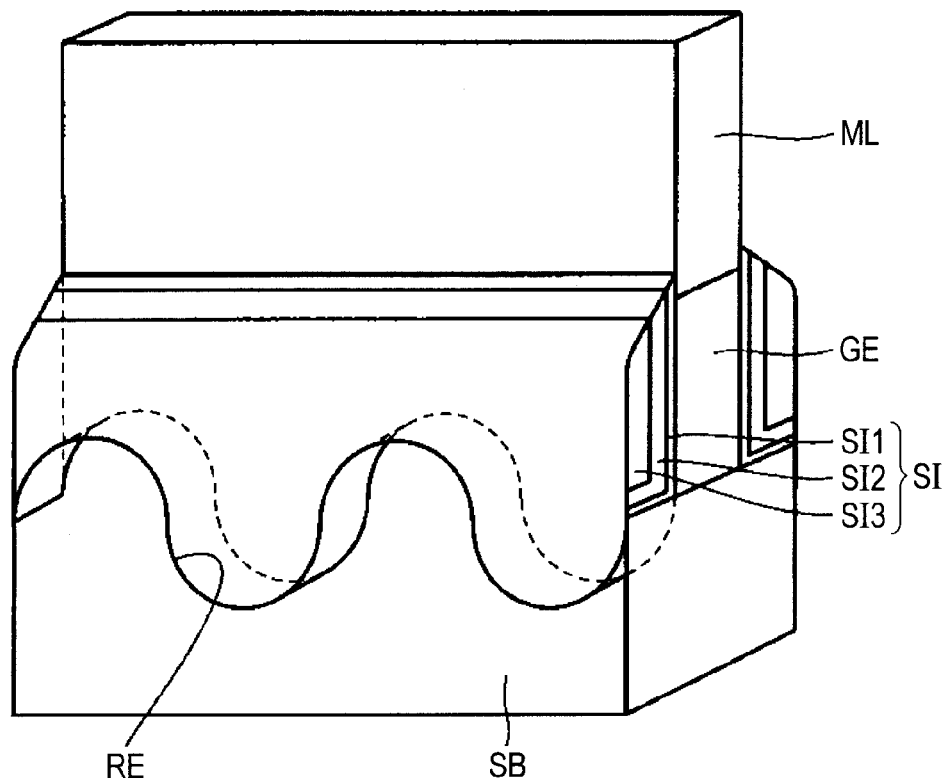
FIG. 66 is a schematic perspective view showing the method for manufacturing a semiconductor device in Embodiment 5 of the present invention, the schematic perspective view showing the vicinity of a gate electrode layer over which a sidewall insulation film is formed.

Referring to FIGS. 63A to 63C, the insulation film SI3 is anisotropically etched. Subsequently, referring to FIGS. 64A to 64C, the insulation film SI2 is isotropically etched by dry or wet etching. Subsequently, referring to FIGS. 65A to 65C, the insulation film SI1 is isotropically etched by dry or wet etching. Referring to FIGS. 64A to 64C, and 66, over the sidewall LSW of the lamination structure of the gate electrode layer GE and the mask layer ML, a sidewall insulation film SI including the insulation film SI1, the insulation film SI2, and the insulation film SI3 is formed. Over at least the sidewall of the gate electrode layer GE of the lamination structure of the gate electrode layer GE and the mask layer ML, the sidewall insulation film SI is formed.

Figure 67:
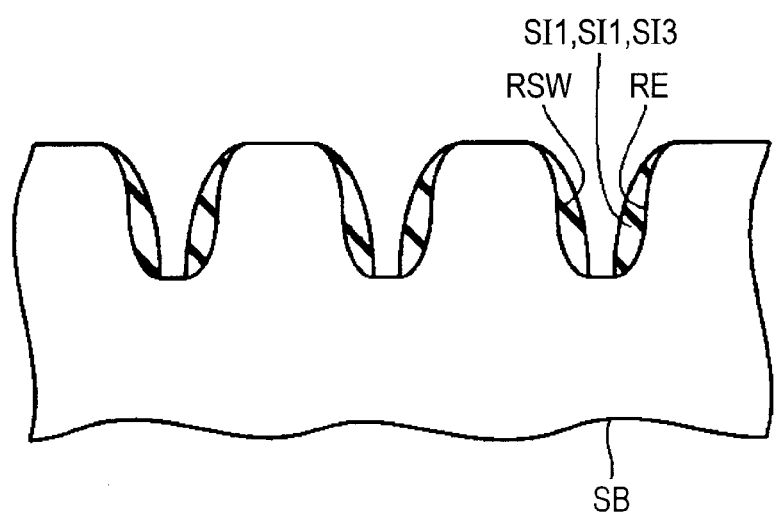
FIG. 67 is a schematic cross-sectional view showing a state in which the residue of the insulation film upon formation of the sidewall insulation film is left in the recess with the cross-sectional position corresponding to FIG. 2D.

Referring to FIG. 67, when the thickness MT of the mask layer ML upon formation of the mask layer ML is not set so as to be larger than the depth RD of the recess RE, there remain residues of the insulation film SI1, the insulation film SI2, and the insulation film SI3 upon forming the sidewall insulation film SI over the sidewall RWS of the recess RE. In contrast, with the method for manufacturing a semiconductor device of the present embodiment, the sidewall RSW of the recess RE is subjected to etching so as not to leave the insulation film SI1, the insulation film SI2, and the insulation film SI3 thereover.

In accordance with the method for manufacturing a semiconductor device of the present embodiment, the thickness MT of the mask layer ML upon formation of the mask layer ML is set so as to be larger than the depth RD of the recess RE. Accordingly, even when overetching equal to or larger than the depth RD of the recess RE is performed for forming the sidewall insulation film SI, the side surface of the gate electrode layer GE is not exposed. Therefore, the residue upon forming the sidewall insulation film SI can be prevented from being left behind in the recess RE without exposing the sidewall of the gate electrode layer GE. For this reason, impurities can be sufficiently ion-implanted into the recess RE. As a result, it is possible to implement the desirable transistor characteristics while miniaturizing the semiconductor device by the recesses RE.

Further, in accordance with the semiconductor device of the present embodiment, over the sidewall LSW of the lamination structure, the sidewall insulation film SI is formed. In addition, the insulation films SI1, SI2, and SI3 are etched so as not to leave the insulation films SI1, SI2, and SI3 over the sidewall of the recess RE. As a result, impurities can be sufficiently ion-implanted into the recesses RE.

Embodiment 6

The method for manufacturing a semiconductor device of Embodiment 5 of the present invention is mainly different from Embodiment 1 in that the residue of the insulation film upon formation of the sidewall insulation film is not left in the recess.

Figure 68:
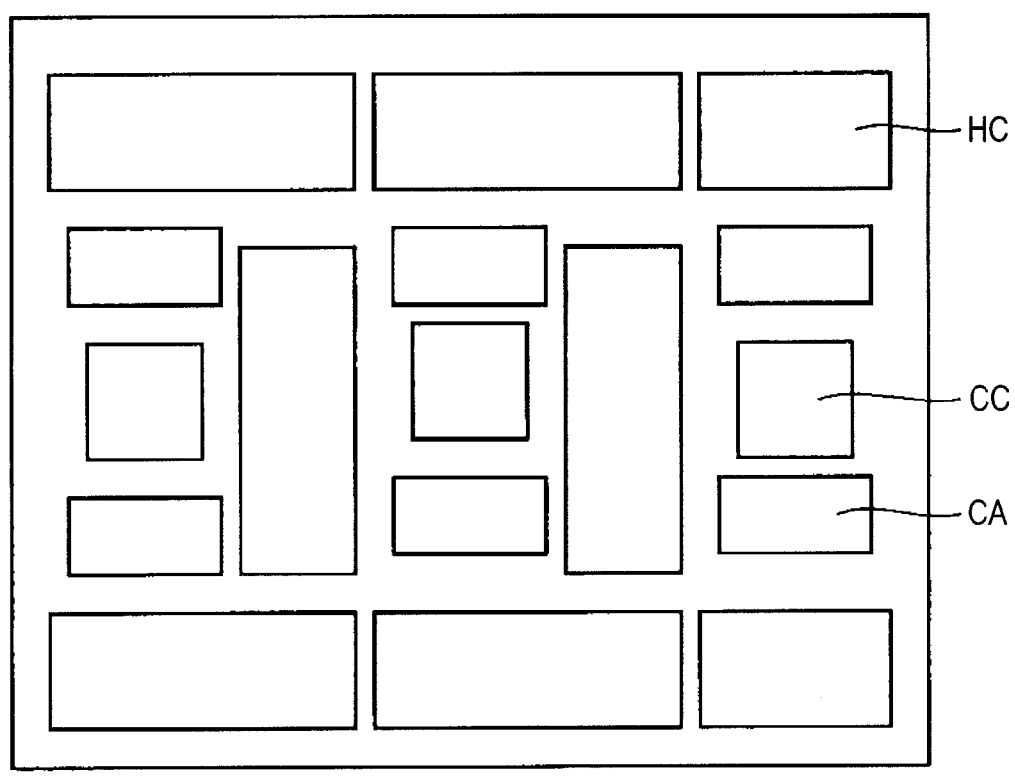
FIG. 68 is a schematic plan view of a chip including a semiconductor device in Embodiment 6 of the present invention mounted thereover.

Referring to FIG. 68, in a chip, a high-breakdown-voltage transistor (HV-/CMOS part) HC, a capacitor part CA, and a core-transistor (core-/CMOS) CC are merged. In the chip, an element including the recess RE formed therein is different in configuration of the sidewall insulation film SI from an element including no recess RE formed therein. For example, the high-breakdown-voltage transistor HC having the recess RE is different in configuration of the sidewall insulation film SI from the core-transistor CC having no recess RE.

Figure 69A:
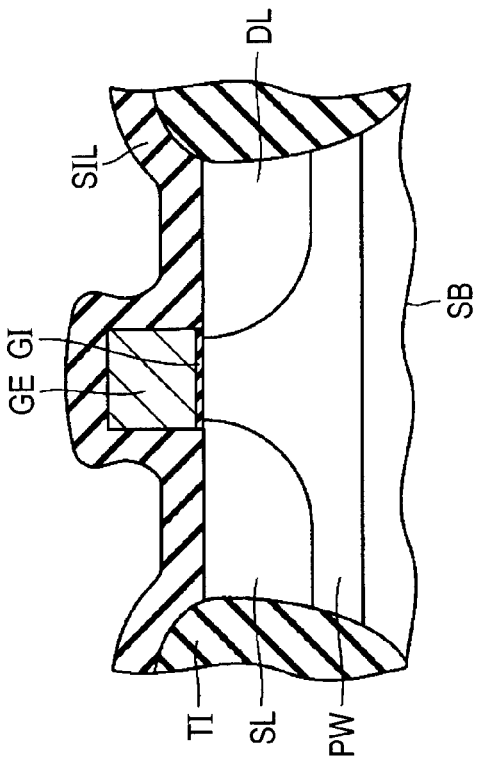
Figure 70:
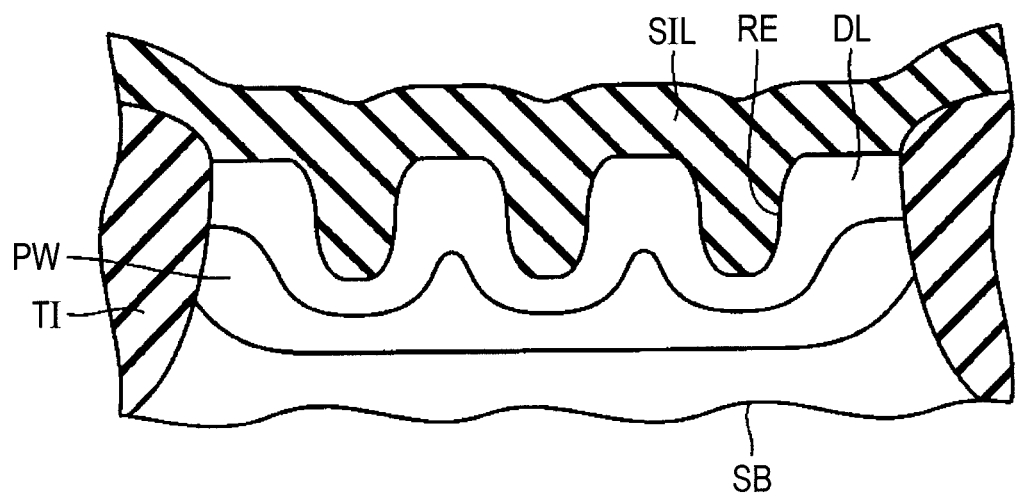
FIG. 70 is a schematic cross-sectional view of the semiconductor device including a recess formed therein in Embodiment 6 of the present invention with the cross-sectional position corresponding to FIG. 2D.

Referring to FIGS. 69A and 70, in the main surface of the semiconductor substrate SB of the high-breakdown-voltage transistor HC, the recesses RE are formed. Over the partial region of the recess RE, the gate electrode layer GE is formed.

Figure 69B:
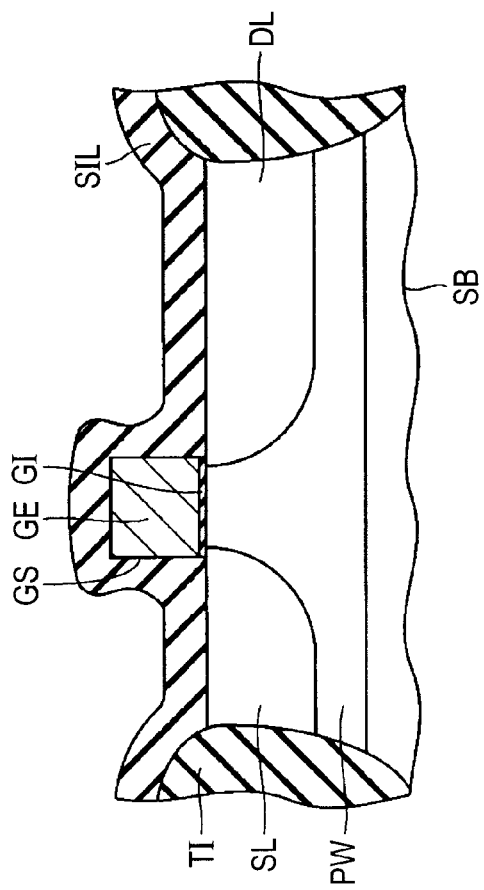

Referring to FIGS. 69A and 69B, and 70, over the main surface of the semiconductor substrate SB of the high-breakdown-voltage transistor HC including the recess RE formed therein and the core-transistor CC including no recess RE formed therein, an insulation film SIL to be the sidewall insulation film SI is formed in such a manner as to cover the gate electrode layer GE. The insulation film SIL covering the gate electrode layer GE and the recess RE of the high-breakdown-voltage transistor HC including the recess RE formed therein.

Figure 72:
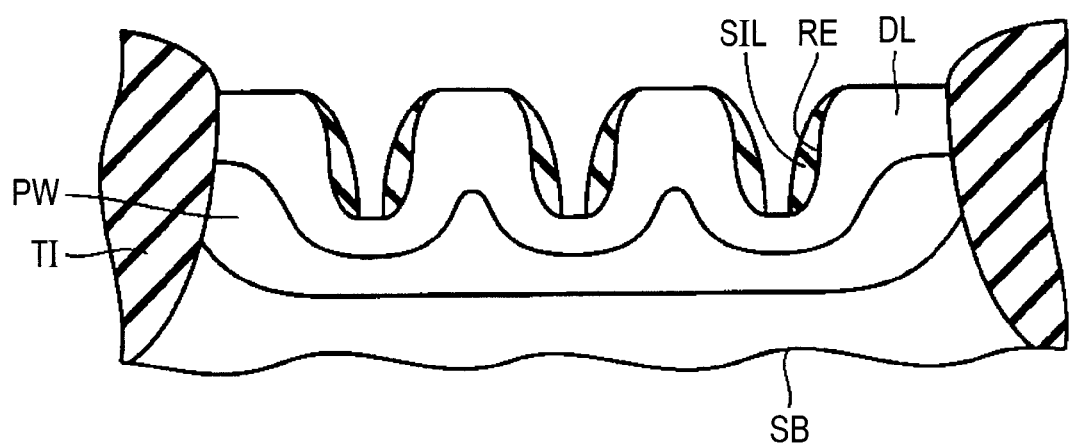
FIG. 72 is a schematic cross-sectional view showing the second step of the method for manufacturing a semiconductor device in Embodiment 6 of the present invention, the schematic cross-sectional view being of the semiconductor device including a recess formed therein, with the cross-sectional position corresponding to FIG. 70.

Referring to FIGS. 71A and 71B, the insulation film SIL to be the sidewall insulation film SI is etched. This results in formation of the sidewall insulation films SI respectively over the high-breakdown-voltage transistor HC including the recess RE formed therein and the core-transistor CC including no recess RE formed therein. Referring to FIG. 72, in the high-breakdown-voltage transistor HC including the recess RE formed therein, the residue of the insulation film SIL to be the sidewall insulation film SI is left behind over the sidewall of the recess RE.

Referring to FIG. 73A, in the high-breakdown-voltage transistor HC including the recess RE formed therein, a resist mask RM1 is formed in such a manner as to expose the sidewall insulation film SI. Referring to FIG. 73B, in the core-transistor CC including no recess RE formed therein, a resist mask RM2 is formed in such a manner as to cover the sidewall insulation film SI.

Figure 74A:
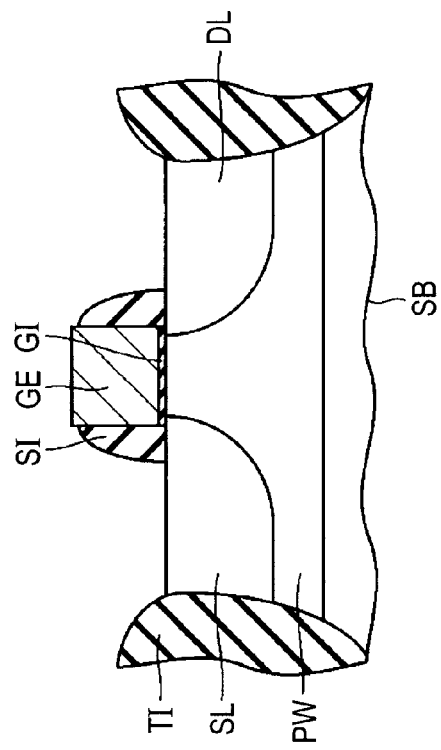
Figure 74B:
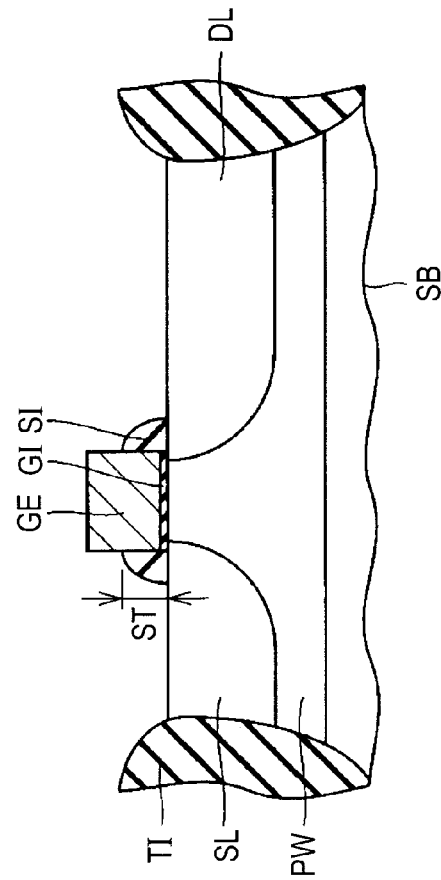
Figure 75:
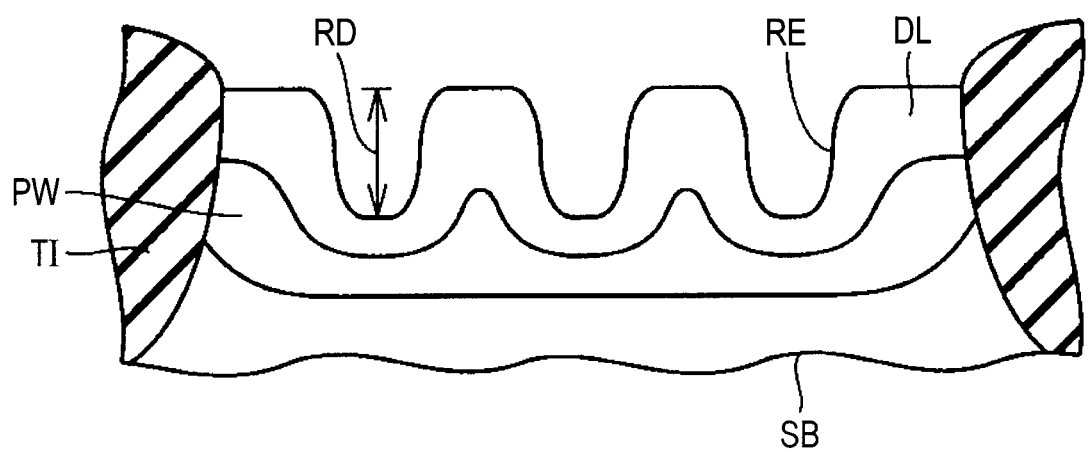
FIG. 75 is a schematic cross-sectional view showing the fourth step of the method for manufacturing a semiconductor device in Embodiment 6 of the present invention, the schematic cross-sectional view being of the semiconductor device including a recess formed therein, with the cross-sectional position corresponding to FIG. 70.

Referring to FIG. 74A, in the high-breakdown-voltage transistor HC including the recess RE formed therein, with the resist mask RM1 as a mask, the sidewall insulation film SI is further etched. Then, the resist mask RM1 is removed. Referring to FIG. 75, by the additional etching, the residue of the insulation film SIL to be the sidewall insulation film SI left in the recess RE is etched. Accordingly, in the recess RE, the residue of the insulation film SIL to be the sidewall insulation film SI is not left behind. Thus, over the sidewall of the gate electrode layer GE, the sidewall insulation film SI including the insulation film SIL is formed. Then, over the sidewall of the recess RE, the insulation film SIL is etched so as not to leave the insulation film SIL.

Referring to FIGS. 74A and 75, in the high-breakdown-voltage transistor HC including the recess RE formed therein, the sidewall insulation film SI is formed with a height ST equal to or smaller than the size half the depth RD of the recess RE.

Referring to FIG. 75B, in the core-transistor CC including no recess RE formed therein, the sidewall insulation film SI is prevented from being etched by the resist mask RM1. For this reason, the sidewall insulation film SI of the high-breakdown-voltage transistor HC having the recess RE is lower in height than the sidewall insulation film SI of the core-transistor CC having no recess RE. For example, the height of the sidewall insulation film SI of the high-breakdown-voltage transistor HC having the recess RE is equal to or smaller than the half of the height of the sidewall insulation film SI of the core-transistor CC having no recess RE. Further, the gate electrode layer GE of the high-breakdown-voltage transistor HC having the recess RE is lower in height than the gate electrode layer GE of the core-transistor CC having no recess RE. For example, the height of the gate electrode layer GE of the high-breakdown-voltage transistor HC having the recesses RE is a height about $3/4$ to $7/8$ the height of the gate electrode layer GE of the core-transistor CC having no recess RE. Further, the element isolation film TI of the high-breakdown-voltage transistor HC having the recess RE is lower in height than the element isolation film TI of the core-transistor CC having no recess RE. For example, the element isolation film TI of the high-breakdown-voltage transistor HC having the recess RE is reduced in height as compared with the gate electrode layer GE by a height about $1/4$ to $1/2$ the height thereof.

Referring to FIG. 76A, the resist mask RM2 is formed in such a manner as to cover the gate electrode layer GE and the sidewall insulation film SI of the high-breakdown-voltage transistor HC having the recess RE. With the resist mask RM2 as a mask, impurities are ion-implanted, thereby to form the source-side low-concentration region SL and the drain-side low-concentration region DL.

Referring to FIG. 76B, the gate electrode layer GE and the sidewall insulation film SI of the core-transistor CC having no recess RE are not covered with the resist mask RM2. Accordingly, with the gate electrode layer GE and the sidewall insulation film SI as a mask, impurities are ion-implanted, thereby to form the source-side low-concentration region SL and the drain-side low-concentration region DL.

Figure 77A:
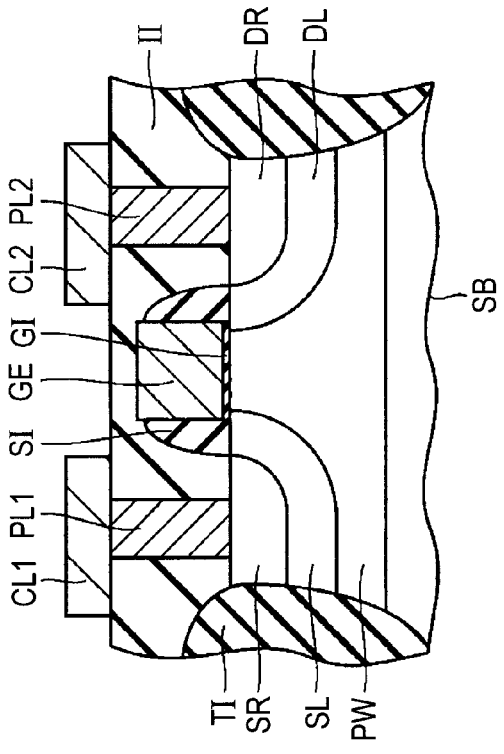
Figure 77B:
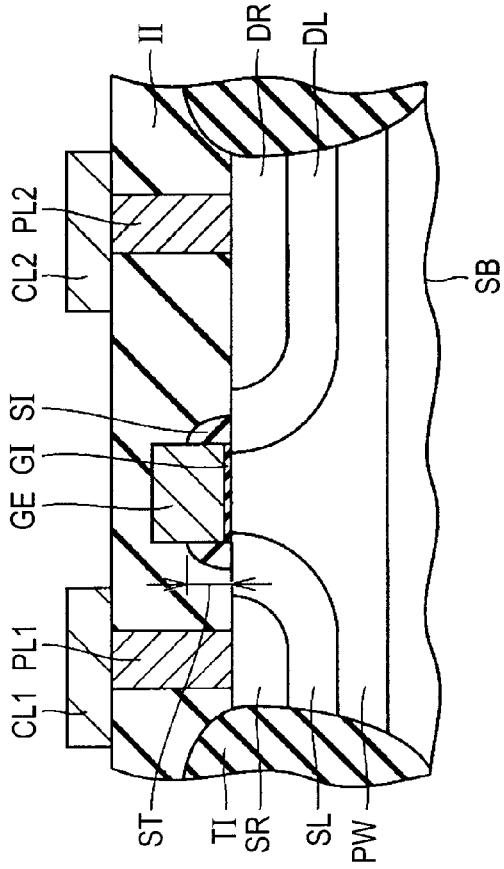

Referring to FIGS. 77A and 77B, thereafter, there are formed the interlayer insulation film II, the source-side conductive layer CL1, the drain-side conductive layer CL2, the first conductive layer PL1, and the second conductive layer PL2. As a result, the high-breakdown-voltage transistor HC having the recess RE and the core-transistor CC having no recess RE are formed.

Further, over the gate electrode layer GE, the source region SR, and the drain region DR, silicides SC may be formed.

Referring to FIG. 78A, a silicide protection mask SPM is formed in such a manner as to expose portions of the gate electrode layer GE, the source region SR and the drain region DR of the high-breakdown-voltage transistor HC having the recess RE. Referring to FIG. 78B, in the core-transistor CC having no recess RE, the silicide protection mask SPM is not formed.

Referring to FIG. 79A, with the silicide protection mask SPM as a mask, silicides SC are formed over portions of the gate electrode layer GE, the source region SR, and the drain region DR. Then, the silicide protection mask SPM is removed. Subsequently, there are formed the interlayer insulation film II, the source-side conductive layer CL1, the drain-side conductive layer CL2, the first conductive layer PL1, and the second conductive layer PL2.

Referring to FIG. 79B, in the tops of the gate electrode layer GE, the source region SR, and the drain region DR, a silicides are formed. Then, there are formed the interlayer insulation film II, the source-side conductive layer CL1, the drain-side conductive layer CL2, the first conductive layer PL1, and the second conductive layer PL2.

When a silicide is formed in the high-breakdown-voltage transistor HC having the recess RE, the silicide SC may be formed in such a manner as to expose a portion of the top surface of the gate electrode layer GE. This can avoid the following: the silicide over the gate electrode layer GE and the silicides SC over the source region SR and the drain region DR are short-circuited, resulting in reduction of the yield. Accordingly, by forming the silicides SC over the gate electrode layer GE, the source region SR, and the drain region DR of the element having the recess RE, it is possible to implement favorable transistor characteristics.

In accordance with the method for manufacturing a semiconductor device of the present embodiment, the sidewall insulation film SI is formed with a height equal to or smaller in dimension than the depth RD of the recess RE. For this reason, the residue of the insulation film SIL to be the sidewall insulation film SI can be prevented from being left in the recess RE. Accordingly, impurities can be sufficiently ion-implanted in the recess RE. As a result, it is possible to implement desirable transistor characteristics while miniaturizing the semiconductor device by the recess RE.

Further, in accordance with the method for manufacturing a semiconductor device of the present embodiment, the insulation film SIL is etched so as to form the sidewall insulation film SI over the sidewall of the gate electrode layer GE, and so as not to leave the insulation film SIL over the sidewall of the recess RE. Accordingly, impurities can be sufficiently ion-implanted in the recess RE.

Embodiment 7

The method for manufacturing a semiconductor device of Embodiment 7 of the present invention is mainly different from that of Embodiment 1 in that there is not formed the sidewall insulation film of the semiconductor device including recesses formed therein.

Referring to FIGS. 80A and 80B, in the main surface of the semiconductor substrate SB, there are formed a first transistor formation region TR1 and a second transistor formation region TR2. In the first transistor formation region TR1, there is formed, for example, the core-transistor CC including no recess RE formed therein. In the second transistor formation region TR2, there is formed, for example, the high-breakdown-voltage transistor HC including the recess RE formed therein.

Figure 82:
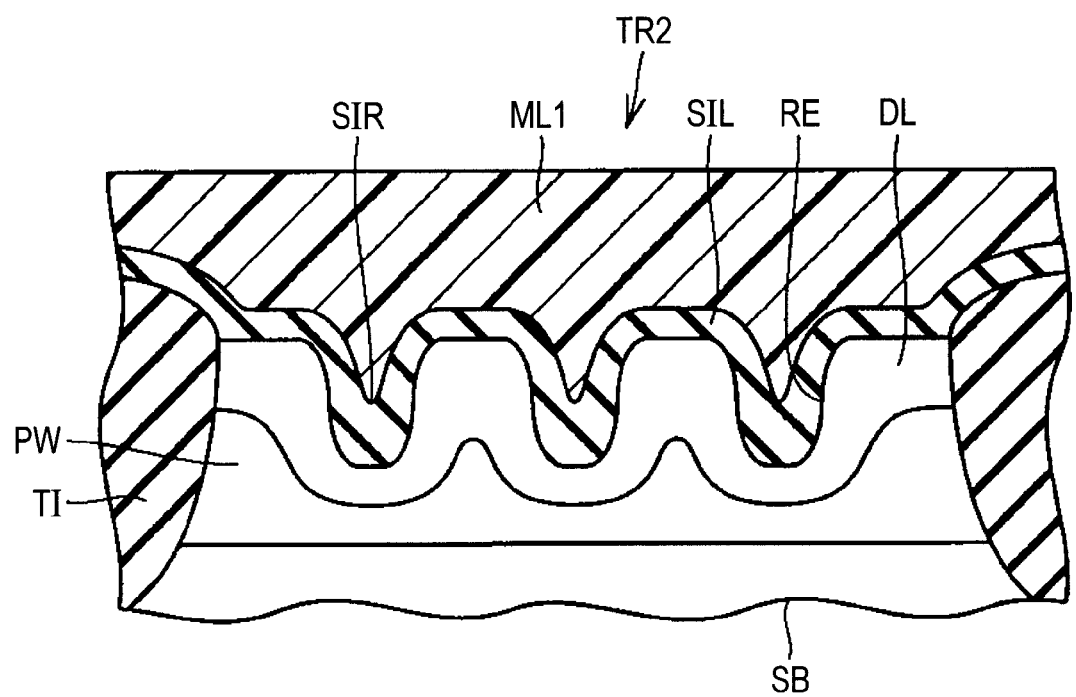
FIG. 82 is a schematic cross-sectional view of the semiconductor device including a recess formed therein in Embodiment 7 of the present invention, with the cross-sectional position corresponding to FIG. 2D.

Referring to FIGS. 80A and 82, in the main surface of the semiconductor substrate SB, the recess RE is formed. Over the main surface of the semiconductor substrate SB, there is formed a second gate electrode layer GES in the second transistor formation region TR2. The insulation film SIL is formed in such a manner as to cover the top of the recesses RE and the top of the second gate electrode layer GES. As shown in FIG. 82, the insulation film SIL is formed over the recess RE in such a manner as to have a concave part SIR reaching the inside of the recess RE. Over the second gate electrode layer GES and over the insulation film SIL over the recess RE, a first mask layer ML1 is formed.

Referring to FIG. 80B, over the main surface of the semiconductor substrate SB, there is formed a first gate electrode layer GEF in the first transistor formation region TR1. The insulation film SIL is formed in such a manner as to cover the top of the first gate electrode layer GEF. In the first transistor formation region TR1, the first mask layer ML1 is not formed. Accordingly, there is exposed the insulation film SIL in the first transistor formation region TR1.

Figure 81A:
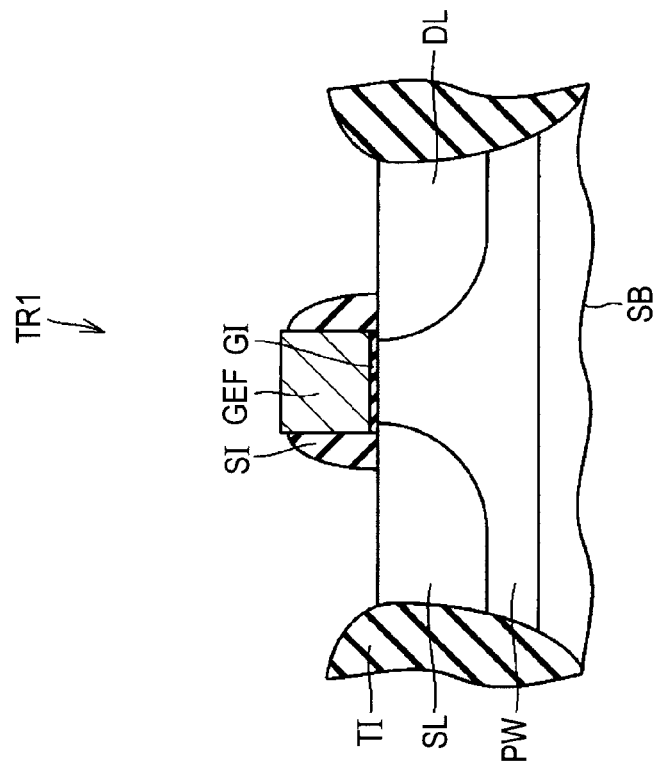
Figure 81B:
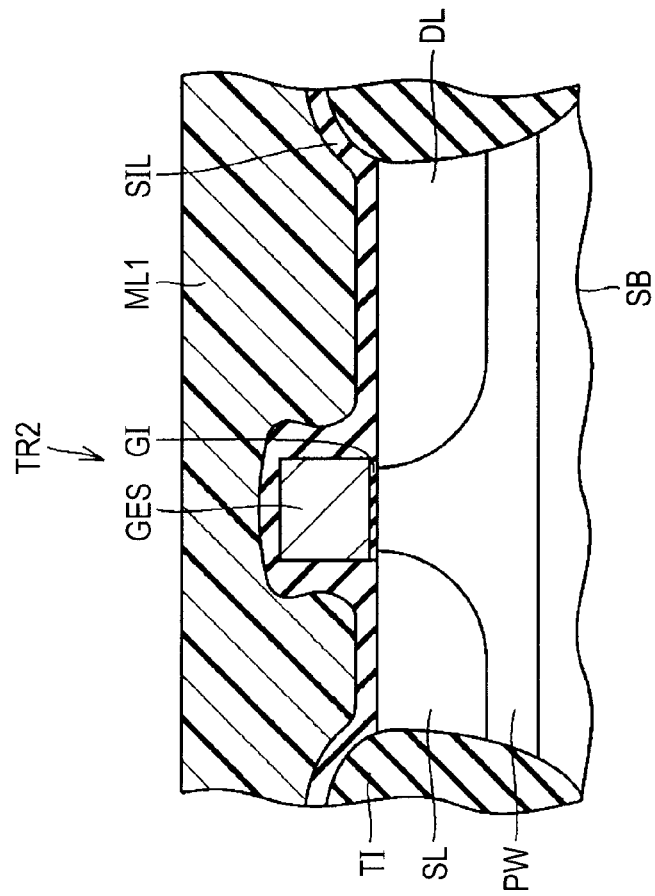

Referring to FIG. 81A, in the second transistor formation region TR2, the insulation film SIL is masked by the first mask layer ML, and hence is not etched. Referring to FIG. 81B, in the first transistor formation region TR1, with the first mask layer ML as a mask, the insulation film SIL in the first transistor formation region TR1 is etched. As a result, over the sidewall of the first gate electrode layer GEF, there is formed the sidewall insulation film SI including the insulation film SIL.

Referring to FIG. 83A, a second mask layer ML2 is formed in such a manner as to cover a portion of the insulation film SIL over the second gate electrode layer GES, and in such a manner as to expose portions of the insulation film SIL over the source formation region SFR and the drain formation region DFR in the second transistor formation region TR2. By introducing impurities into the source formation region SFR and the drain formation region DFR in the main surface of the semiconductor substrate SB through the insulation film SIL, the source region SR and the drain region DR are formed.

Referring to FIG. 83B, in the first transistor formation region TR1, the second mask layer ML2 is not formed. Accordingly, by introducing impurities into the main surface of the semiconductor substrate SB with the gate electrode layer GE and the sidewall insulation film SI as a mask, there are formed the source region SR and the drain region DR.

Referring to FIGS. 83A and 83B, the impurities to be introduced into the main surface of the semiconductor substrate SB in order to form the source region SR and the drain region DR are introduced at an oblique angle with respect to the main surface.

Referring to FIGS. 84A and 84B, thereafter, there are formed the interlayer insulation film II, the source-side conductive layer CL1, the drain-side conductive layer CL2, the first conductive layer PL1, and the second conductive layer PL2. As a result, there are formed the high-breakdown-voltage transistor HC and the core-transistor CC. Further, in the tops of the gate electrode layer GE, the source region SR, and the drain region DR of the core-transistor CC, the silicides SC may be formed.

In accordance with the method for manufacturing a semiconductor device of the present embodiment, the first mask layer ML1 is formed in such a manner as to cover portions of the insulation film SIL over the second gate electrode layer GES and over the recess RE, and in such a manner as to expose a portion of the insulation film SIL in the first transistor formation region TR1. Then, with the first mask layer ML1 as a mask, portions of the insulation film SIL in the first transistor formation region TR1 are etched. This results in formation of the sidewall insulation film including the insulation film SIL over the sidewall of the first gate electrode layer GEF. For this reason, for the semiconductor device including the recess RE formed therein, etching for forming the sidewall insulation film SI is not performed, but impurities for forming the source region SR and the drain region DR are introduced. Accordingly, it is possible to form the gate insulation film GI free from plasma damage, and having high reliability. Therefore, it is possible to manufacture a semiconductor device having high reliability. As a result, it is possible to implement desirable transistor characteristics while miniaturizing the semiconductor device by the recess RE.

Further, in accordance with the method for manufacturing a semiconductor device of the present embodiment, the insulation film SIL is formed along the wall surface of the recess RE in such a manner as to have the concave part SIR reaching the inside of the recess RE over the recess RE. Accordingly, when impurities are ion-implanted into the main surface of the semiconductor substrate SB, impurities can be uniformly introduced. For this reason, in the recess RE, the impurity concentration can be made uniform. The impurity concentration can be made uniform. Therefore, ion implantation can be carried out with a high concentration uniformly throughout the bottom surface, corner parts, and side surface of the recess RE.

Further, in accordance with the method for manufacturing a semiconductor device of the present embodiment, the second mask layer ML2 is formed in such a manner as to cover a portion of the insulation film SIL over the second gate electrode layer GES, and in such a manner as to expose portions of the insulation film SIL over the source formation region SFR and the drain formation region DFR in the second transistor formation region TR2. Then, impurities are introduced into the source formation region SFR and the drain formation region DFR in the main surface of the semiconductor substrate SB through the insulation film SIL. This results in formation of the source region SR and the drain region DR. Accordingly, it is possible to form the gate insulation film GI free from plasma damage, and having high reliability. Therefore, it is possible to manufacture a semiconductor device having high reliability.

Further, in accordance with the method for manufacturing a semiconductor device of the present embodiment, the impurities to be introduced into the main surface of the semiconductor substrate SB in order to form the source region SR and the drain region DR are introduced at an oblique angle with respect to the main surface of the semiconductor substrate SB. Accordingly, impurities can be uniformly introduced into the main surface of the semiconductor substrate SB. For this reason, in the recess RE, the impurity concentration can be made uniform. The impurity concentration can be made uniform. Therefore, ion implantation can be carried out with a high concentration uniformly throughout the bottom surface, corner parts, and side surface of the recesses RE.

Respective Embodiments described above can be appropriately combined. It should be considered that the embodiments herein disclosed are illustrative and are not restrictive in all respects. The scope of the present invention is not defined by the foregoing description but is defined by the appended claims. All changes within the meaning and range of equivalency of the claims are intended to be embraced therein.

The present invention is advantageously applicable particularly to a semiconductor device in which a recess is formed in the main surface of the semiconductor substrate, and a method for manufacturing the semiconductor device.

What is claimed is:

1. A semiconductor device, comprising:
a semiconductor substrate having a main surface;
a source region and a drain region formed apart from each other in the main surface;
a gate electrode layer formed over the main surface sandwiched between the source region and the drain region;
a gate insulation film formed between the gate electrode layer and the semiconductor substrate;
a first conductive layer formed in such a manner as to be in contact with a surface of the source region;
a second conductive layer formed in such a manner as to be in contact with a surface of the drain region; and
an element isolation film formed in the main surface of the semiconductor substrate,
wherein a recess is formed in the main surface in such a manner as to extend from the contact region between the first conductive layer and the source region through a part underlying the gate electrode layer to the contact region between the second conductive layer and the drain region,
the first conductive layer is in contact with a sidewall of the recess and a flat area of the source region above the recess and the second conductive layer is in contact with a sidewall of the recess and a flat area of the drain region above the recess, and
the gate electrode layer extends into the semiconductor substrate below a top surface of the element isolation film, and the gate insulation film is located below the top surface of the element isolation film.

2. The semiconductor device according to claim 1, further comprising:
a drain-side low-concentration region formed in such a manner as to cover a periphery of the drain region, having a lower impurity concentration than that of the drain region, and being of the same conductivity type as that of the drain region; and
a source-side low-concentration region formed in such a manner as to cover a periphery of the source region, having a lower impurity concentration than that of the source region, and being of the same conductivity type as that of the source region,
wherein the recess is formed in such a manner so that a portion of the recess is surrounded by the drain-side low-concentration region and another portion of the recess is surrounded by the source-side low-concentration region.

3. The semiconductor device according to claim 1,
wherein the recess comprises a plurality of recess parts, and
wherein a plurality of the recess parts are formed in such a manner as to run in parallel to one another.

4. The semiconductor device according to claim 2,
wherein the recess comprises a plurality of recess parts, and
wherein a plurality of the recess parts are formed in such a manner as to run in parallel to one another.

5. The semiconductor device according to claim 1,
wherein a portion of the gate electrode layer extends into the recess.

6. The semiconductor device according to claim 1,
wherein a portion of the contact regions are formed in the recess.

* * * * *